(12) United States Patent
Ishigaki

(10) Patent No.: US 6,198,149 B1
(45) Date of Patent: *Mar. 6, 2001

(54) SEMICONDUCTOR DEVICE HAVING NOVEL INSULATING FILM STRUCTURE

(75) Inventor: Yoshiyuki Ishigaki, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/850,839

(22) Filed: May 2, 1997

(30) Foreign Application Priority Data

Nov. 1, 1996 (JP) .................................................. 8-291902

(51) Int. Cl.$^7$ ................................................... H01L 23/54
(52) U.S. Cl. ....................... 257/506; 257/206; 257/207; 257/208; 257/213; 257/347; 257/524; 257/527; 257/505; 257/797
(58) Field of Search ..................................... 257/758, 774, 257/797, 796, 213, 202, 206, 207, 208, 66, 67, 71, 381, 378, 379, 380, 347, 524, 527, 505, 506

(56) References Cited

U.S. PATENT DOCUMENTS

| | | | |
|---|---|---|---|
| 5,223,737 | * 6/1993 | Canclini | 257/546 |
| 5,276,582 | * 1/1994 | Merrill et al. | 361/111 |
| 5,296,731 | * 3/1994 | Morikawa | 257/546 |
| 5,341,005 | * 8/1994 | Canclini | 257/173 |
| 5,623,387 | * 4/1997 | Li et al. | 361/56 |
| 5,723,896 | * 3/1998 | Yee et al. | 257/499 |

FOREIGN PATENT DOCUMENTS 6-53484 * 2/1994 (JP).

OTHER PUBLICATIONS

Yamanaka et al., "Advanced TFT SRAM Cell Technology Using a Phase–Shift Lithography", IEEE Transactions on Electron Devices vol. 42, No. 7, Jul. 1995.

* cited by examiner

*Primary Examiner*—Wael Fahmy
*Assistant Examiner*—Matthew E. Warren
(74) *Attorney, Agent, or Firm*—McDermott, Will & Emery

(57) ABSTRACT

A semiconductor device is comprised of: an element isolating film formed on one major surface of a semiconductor substrate; an element forming region formed on the major surface and surrounded by the element isolating film; a gate electrode formed via a gate insulating film on the element forming region and extended over the element isolating film; first and second impurity regions formed in the element forming region, whose portions exposed from a surface of the semiconductor substrate are made in contact with the element isolating film and are located opposite to each other under the gate electrode; a first insulating film formed near the gate electrode on the first impurity region, and extended over the gate electrode and near an extended portion of the gate electrode within the element isolating film; and a second insulating film formed near the gate electrode on the second impurity region. In this semiconductor device, a distance defined from an outer edge of the gate electrode on the side of the first impurity region to another outer edge of the first insulating film on the side apart from the gate electrode is longer than a distance defined from an outer edge of the gate electrode on the side of the second impurity region to another outer edge of the second insulating film on the side apart from the gate electrode.

5 Claims, 40 Drawing Sheets

I/O CHARACTERISTIC OF PAIR OF CROSS-COUPLED INVERTER

TRANSFER CHARACTERISTIC OF MEMORY CELL
IN STANDBY STATE (TRANSFER CURVE)

TRANSFER CHARACTERISTIC OF MEMORY CELL IN READING
(TRANSFER CURVE) : CELL RATIO SMALL

TRANSFER CHARACTERISTIC OF MEMORY CELL IN READING
(TRANSFER CURVE) : CELL RATIO LARGE

SEMICONDUCTOR DEVICE HAVING NOVEL INSULATING FILM STRUCTURE

BACKGROUND OF THE INVENTION

1. Field of the Invention

The present invention generally relates to a semiconductor device such as a large-scale integration (LSI) circuit. More specifically, the present invention is directed to a technique capable of stabilizing operation characteristics of such a semiconductor device having an element isolating film on a major surface of a semiconductor substrate.

2. Description of the Conventional Art

SRAMs (static random access memories) are volatile semiconductor devices in which memory cells are arranged at cross points between complementary type data lines (bit lines) and word lines. These data and word lines are arranged in a matrix form.

A memory cell is arranged by a flip-flop circuit and two sets of access transistors. This flip-flop circuit constitutes two storage nodes which are cross-coupled to each other. The storage nodes own bi-stable states of either (High, Low) or (Low, High), and continuously hold the bi-stable states as long as a preselected power source voltage is applied.

In this case, as to the access transistors, one semiconductor region is connected to the storage nodes (input/output terminals of the flip-flop circuit), and the other semiconductor region is connected to the complementary type data line (bit line). The gate electrodes of the access transistors are connected to the word line, and then conductive/non-conductive states of the access transistors are controlled by way of this word line.

When data is written, the word line is selected so as to cause the access transistors to become conductive, and voltage are forcibly applied to a pair of bit lines in response to a desirable logic value, so that the bi-stable state of the flip-flop circuit is set to either (High, Low) or (Low, High).

When data is read, the access transistors are brought into conductive states, and a potential at the storage node is transferred to the bit line. Now, the above-described flip-flop circuit is arranged by two driver transistors and two load elements. As to this driver transistor, a drain region thereof is connected to the semiconductor region of one access transistor, and a source region thereof is connected to a ground line (VEE line). A gate electrode of the driver transistor is connected to the semiconductor region of the other access transistor. Furthermore, one of these load elements is connected to the semiconductor regions of the access transistors, and the other of the load elements is connected to a power source line (VCC line).

Very recently, the following problems are apparently brought up in SRAMS.

First, in order to reduce manufacturing cost by increasing integration degrees of SRAMs, sizes of transistors, in particular, sizes of MOS transistors are necessarily required to be reduced. However, when a gate width of an access transistor is made excessively narrow, a Vth (threshold voltage value) of the access transistor would be increased due to the narrow channel effect, so that reading operation of a memory cell is brought into an unstable condition. Therefore, it is practically difficult that the gate width of the access transistor is shortened up to the region where the Vth increase caused by the narrow channel effect happens to occur. As a consequence, as the gate width of the access transistor, such a narrowest gate width has been employed by which the Vth (threshold voltage value) increase caused by the narrow channel effect can be suppressed, so that the layout area could be reduced.

On the other hand, in order to achieve stable conditions of SRAMs, a cell ratio must be maintained higher than a preselected value (for instance, approximately 3). The cell ratio is defined by a ratio of a current value (driveability) of a driver transistor to a current value (driveability) of an access transistor. However, as previously described, if the current of the access transistor, the gate width of which has been determined, is slightly increased, then this cell ratio would be lowered, resulting in an occurrence of faulty operation.

Now, a first description will be made of the above-described failure operation due to the decrease of the cell ratio.

In general, as is known in the art, the cell operation can be stabilized by increasing a conductance ratio (current ratio) of a driver transistor to an access transistor, so-called as a "cell ratio", to thereby increase a gain of an inverter, namely to make a sharp inclination of a transition portion of an inverter output. This known idea will now be described based upon an input/output transfer characteristic of one pair of inverters cross-coupled to each other, as indicated in FIG. 31.

FIG. 32 represents the input/output transfer characteristic of one pair of cross-coupled inverters. In this transfer characteristic, in order to function as a flip-flop, the inverters must own two stable points such as S1 and S2, as represented in FIG. 32. In order that a memory cell can be practically utilized, it is so designed that regions surrounded by curves shown in FIG. 32 must be made sufficiently large. As an index, a diameter of a circle indicated in this drawing is sometimes used, which is referred to as an SNM (static noise margin).

Now, a further detailed description will be made of a transfer characteristic of a memory cell of an SRAM as indicated in an equivalent circuit of FIG. 33.

Normally, since access transistors are under non-conductive states during standby, inverters of the memory cell are constituted by driver transistors and load elements. In this case, since the load elements own high impedances, an inclination of a transition portion of an inverter output becomes sharp as shown in a memory cell transfer characteristic diagram of standby in FIG. 34. An SNM becomes large. As a result, data can be held under stable condition.

On the other hand, when data is read from the memory cell, the access transistors become conductive, so that a column current flows into a storage node on a Low side. In other words, this is equivalent to such a connection that a load made of the access transistor having the low impedance is connected in parallel to the load element. The inverters of the memory cell must be handled as NMOS type enhancement node inverters constituted by driver transistors and this access transistor as the load. When the cell ratio is low, as indicated in FIG. 35, i.e., a memory cell transfer characteristic diagram during data read operation, the gain of the inverter is considerably lowered, as compared with that during standby. Namely, the inclination of the transition portion of the inverter output becomes loose.

Also, a potential at a storage node on a High side is lowered from the power source voltage level during standby up to such a potential value defined by subtracting Vth of the access transistor from the power source voltage, and the SNM is considerably lowered for the time being. At this time, if a sufficiently large SNM is not established, then the bi-stable states will be lost. There is a risk that data may be electrically destroyed.

Under such a reason, normally, the cell ratio is made large in order to avoid the above-explained data destroy. As a result, as illustrated in FIG. 36, namely a memory cell transfer characteristic when-data is read in case of a large cell ratio, the gain of the inverter becomes large. In other words, the inclination of the transition portion of the inverter output becomes sharp, and the SNM is enlarged.

However, in connection with higher integration of recent semiconductor elements, since layout areas should be reduced, it is practically difficult to widen sizes (gate widths) of driver transistors. As a consequence, in order to stabilize operations of SRAMs, currents of access transistors are required to be reduced.

Referring now to FIG. 37A to FIG. 43, a description will be made of one modification similar to the conventional semiconductor device manufacturing method as described in IEEE TRANSACTIONS ON ELECTRON DEVICES VOL. 42, No. 7, July 1995, on pages 1303 to 1312.

In this case, FIG. 37A to FIG. 42B are plan views and sectional views taken along lines B—B in the plan views, for schematically showing a major portion of a single SRAM cell manufactured in accordance with the conventional semiconductor device manufacturing method in a manufacturing step order. FIG. 43 is a sectional view taken along a line A1–A2 of the SRAM cell shown in FIG. 42A.

First, as indicated in FIG. 37A and FIG. 37B, a field insulating film 2 functioning as an element isolating film made of $SiO_2$ having a thickness of approximately 3000 Å is formed on an N⁻type silicon substrate 1 corresponding to a semiconductor substrate by employing the selective thermal oxidation method (for instance, local oxidation of silicon: LOCOS). In this selective thermal oxidation method, for example, while a silicon oxide ($SiO_2$) film is used as a pad film, a silicon nitride ($Si_3N_4$) film deposited on this pad film is used as an anti-oxidation mask.

Thereafter, both the pad $SiO_2$ film and the $Si_3N_4$ film are removed which are employed as the above-described selective thermal oxidation, so that an element forming region 3 is exposed from a surface of the N⁻type silicon substrate 1.

Then, for example, a P type impurity such as boron (B) is implanted into the entire major surface of the N⁻type silicon substrate 1 under such a condition that the implanting voltages are selected from 200 KeV to 700 KeV, and the dose amount is selected to be on the order of $1.0 \times 10^{12}$ cm⁻² to $1.0 \times 10^{13}$ cm⁻². Furthermore, the P type impurity such as boron (B) is implanted into the resultant major surface of the silicon substrate 1 under conditions of, for instance, 30 to 70 KeV and approximately $1.0 \times 10^{12}$ to $2.0 \times 10^{13}$ cm⁻², to thereby set the threshold voltages "Vth" of access transistors T1, T2 and driver transistors T3, T4. A P⁻type well region 4 (see FIG. 43) formed in this manner contains impurity concentration of on the order of approximately $10^{16}$ to $10^{18}$ cm⁻³.

Then, a gate insulating film 5 (see FIG. 43) made of $SiO_2$ having a thickness of, for example, 70 Å is formed on the entire surface by way of, for example, the thermal oxidation. With employment of the LPCVD (low pressure chemical vapor deposition) method, gas such as phosphine (PHs) is mixed, so that a phosphorus doped polycrystal silicon film having a thickness of approximately 1000 Å is deposited with phosphorus density of approximately 1.0 to $8.0 \times 10^{20}$ cm⁻³.

Then, the photoresist is patterned into a predetermined shape by employing the photolithography, and while using this patterned photoresist as a mask, for instance, the reactive ion etching (RIE) method is applied so as to pattern the above-described phosphorus doped polycrystal silicon film, so that word lines 6a, 6d corresponding to gate electrodes of access transistors T1, T2, and gate electrodes 6b, 6c of driver transistors T3, T4 are formed.

It should be noted that although the word lines 6a, 6d and the gate electrodes 6b, 6c of the driver transistors are formed only by the phosphorus doped polycrystal silicon film in this example, these components may be made by employing, for instance, a so-called polysilicide wiring pattern made of a metal silicide such as a tungsten silicide ($WSi_2$) film, and the phosphorus doped polycrystal silicon film.

Thereafter, for instance, arsenic (As) is implanted into the entire surface over the gate insulating film 5 while rotating a wafer under such a condition that the dosing energy is selected to be approximately 30 to 70 KeV, the implanting angle is 45 degrees, and the dose amount is selected from approximately 1.0 to $5.0 \times 10^{13}$ cm⁻², and thus N⁻type source to drain regions 71 to 75 are formed in a region other than such regions shielded by the word lines 6a, 6d of the element forming region 3 and the gate electrodes 6b, 6c of the driver transistors. In this case, the N⁻type source/drain regions 71 to 75 contain impurity density of on the order of $10^{17}$ to $10^{19}$ cm⁻³.

Next, as indicated in FIG. 38A and FIG. 38B, an $SiO_2$ film 9 having a thickness of approximately 500 to 1500 Å is deposited on the entire surface by employing the LPCVD method, and side wall oxide films 91 to 96 having a thickness of approximately 500 to 1500 Å are formed on side walls of the word lines 6a, 6b and also of gate electrodes 6b, 6c of the driver transistors by using the RIE method.

At the same time, in this case, the field insulating film 2 is also planed by the RIE method, so that the area of the element forming region 3 exposed from the surface of the semiconductor substrate 1 is increased. It should be noted that a dot and dash line of FIG. 38A indicates the element forming region 3 which has not yet been planed by the RIE method, and a solid line thereof indicates the element forming region 3 which has been planed.

Next, while using these side wall oxide films 91 to 96 as a mask, for instance, arsenic (As) is implanted at 50 KeV with the dose amount of approximately 1.0 to $5.0 \times 10^{15}$ cm⁻² to form N⁺type source/drain regions 111 to 115. At this case, for example, either arsenic (As) or phosphorus (P) may be additionally implanted at approximately 30 to 70 KeV at an implanting angle of 45 degrees into the overall surface with the dose amount of approximately 1.0 to $5.0 \times 10^{13}$ cm⁻², while rotating the wafer.

In this case, the N⁺type source/drain regions 111 to 115 contain impurity concentration of on the order of $10^{20}$ to $10^{21}$ cm⁻³, and forms a so-called "LDD (lightly doped drain)" structure for relaxing an electric field near the drain by the N⁻type source/drain regions 71 to 75 and the N⁺type source/drain regions 111 to 115.

In FIG. 38A, in order to clearly indicate the positional relationship among the N⁻type source/drain regions 71 to 75, the N⁺type source/drain regions 111 to 115, and the side wall oxide films 91 to 96, outer edges of the side wall oxide films 91 to 96 are indicated by a dotted line and also underlayers thereof are indicated.

Next, as shown in FIG. 39A and FIG. 39B, after an $SiO_2$ film 14 having a thickness of approximately 1500 Å has been deposited on the entire surface by using the LPCVD method, the photoresist is patterned to have a preselected form by using the photolithography technique. While using this patterned photoresist as a mask, for instance, the RIE method is applied to selectively remove the $SiO_2$ film 14, so that such a contact hole 12 is formed in such a manner that a portion of the N⁺type source/drain region 113 is exposed.

Then, after a phosphorus doped polycrystal silicon film having a thickness of approximately 1000 Å and phosphorus concentration of on the order of 1.0 to $8.0 \times 10^{20}$ cm$^{-3}$ has been deposited by using the LPCVD method, a metal silicide film such as a tungsten silicide (WSi$_2$) film having a thickness of 1000 Å is further and continuously deposited.

Then, the photoresist is patterned to have a predetermined shape by employing the photolithography technique, and while using this patterned photoresist as a mask, for example, the RIE method is applied so as to continuously pattern the above-described tungsten silicide (WSi$_2$) film and phosphorus doped polycrystal silicon film, so that a ground wiring line 13 is formed. In FIG. 39A, in order to clearly indicate a positional relationship between the ground wiring line 13 and the gate electrodes 6b, 6c of the driver transistors, the indication of the SiO$_2$ film 14 is omitted. Instead, an under layer of this film is indicated.

Thereafter, as shown in FIG. 40A and FIG. 40B, after SiO$_2$ films 15 having thicknesses of approximately 1500 Å are deposited on the overall surface by using the LPCVD method, the photoresist is patterned to have a predetermined shape by using the photolithography technique. While using this patterned photoresist as a mask, for example, the RIE method is applied to selectively remove the SiO$_2$ film 15, so that contact holes 141 to 144 are formed in such a manner that the contact holes are opened in an impurity region 112 between the access transistor T1 and the driver transistor T3, and another impurity region 114 between the gate electrodes 6c, 6b of the driver transistors, the access transistor T2, and the driver transistor T4.

Then, a phosphorus doped polycrystal silicon film having a thickness of approximately 1000 Å and phosphorus concentration of on the order of 1.0 to $8.0 \times 10^{20}$ cm$^{-3}$ is deposited by using the LPCVD method. Thereafter, the photoresist is patterned to have a predetermined shape by using the photolithography technique, and while using this patterned photoresist as a mask, for example, the etching process is carried out by way of the RIE method. Accordingly, the above-described phosphorus doped polycrystal silicon film is patterned to thereby form connections 151 and 152.

It should be noted that in FIG. 40A, in order to clearly indicate a positional relationship between the connection lines 151, 152 and the gate electrodes 6b, 6c of the driver transistors and also the impurity regions 112, 114, the indications of the SiO$_2$ films 14, 15 are omitted. Instead, under layers of these films are indicated.

Thereafter, as shown in FIG. 41A and FIG. 41B, after "SiO$_2$ film 16 having a thickness of approximately 100 to 1500 Å is deposited on the overall surface by using the LPCVD method, the photoresist is patterned to have a predetermined shape by using the photolithography technique. While using this patterned photoresist as a mask, for example, the RIE method is applied to selectively remove the SiO$_2$ film 16 so that contact holes 161 and 162 are formed in such a manner that portions of the phosphorus doped polycrystal silicon films 151 and 152 are exposed.

Then, a polycrystal silicon film having a thickness of approximately 200 to 1000 Å is deposited by using the LPCVD method. Subsequently, phosphorus (p) is implanted with the dose amount of $1.0 \times 10^{12}$ to $1.0 \times 10^{14}$ cm$^{-2}$ at 30 KeV. Then, the photoresist is patterned to have a predetermined shape by using the photolithography technique, and while using this patterned photoresist as a mask, for example, the RIE method is applied. Accordingly, the above-described polycrystal silicon film is patterned to thereby form an electrode 17.

Thereafter, furthermore, the photoresist for shielding desirable positions 172 and 175 on the electrode 17 is patterned by using the photolithography technique. While using this patterned photoresist as a mask, for example, BF$_2$ is implanted at 20 KeV in the dose amount of approximately $1.0 \times 10^{14}$ to $1.0 \times 10^{15}$ cm$^{-2}$, and the above-described photoresist is removed. Then, the resultant substrate is annealed for 30 minutes at the temperature of, e.g., 750° C. to 850° C. so as to activate the impurities, so that source regions 173, 176, drain regions 171, 174, and channel regions 172, 175 of P channel type TFTs (thin-film transistors) are fabricated, respectively.

It should also be noted that in FIG. 41A, in order to clearly indicate a positional relationship between the electrode 17 and the connection lines 151, 152, the indications of the SiO$_2$ films 14, 15, 16 are omitted. Instead, under layers of these films are indicated.

Next, thereafter, as illustrated in FIG. 42a, FIG. 42B, and FIG. 13, after an interlayer insulating film 18 is formed on the electrode 17 and the SiO$_2$ film 16, bit-line contact holes 181 and 182 opened in the impurity regions 111 and 115 are formed. Bit lines 191 and 192 made of aluminum wiring lines and being electrically connected via the bit-line contact holes 181 and 182 to the impurity regions 111 and 115 are formed, so that the semiconductor device is obtained.

It should also be noted that in FIG. 42A, in order to clarify a positional relationship between the bit lines 191, 192 and the electric elements (gate electrodes 6a, 6d of access transistors etc.) located under layers thereof, the indications of the SiO$_2$ films 14, 15, 16, 18 are omitted. Instead, indications of under layers thereof are made.

In the above-described conventional semiconductor device, there is no problem in such a case that the bird's beak of the element isolation oxide film is considerably small, as compared with the gate widths of the access transistors. When the minimum designed dimension of the electric elements for constituting this semiconductor device becomes smaller than, or equal to 0.5 µm, the retreat of bird's beak caused by the over etching process while the side walls are formed so as to form the LDD structure of the MOS transistor may give not negligible adverse influences to the stable operations of this semiconductor device.

As indicated in FIG. 38A, concretely speaking, the retreat of bird's beak located near the gate electrodes 6a to 6d, which is caused by the etching process while forming the side walls 91 to 96 may cause the following problems. That is, the widths of the diffusion regions of the access transistors T1 and T4 are increased near the gate electrodes 6a and 6d, so that the stray resistance is lowered, and increasing of the currents of the access transistors T1 and T4 is induced, and eventually, the cell ratio is lowered, which may impede improvements in the reading characteristic of the memory cell.

In addition, for example, as shown in FIG. 43, in the conventional semiconductor device, there is another problem that flatness under the wiring layer such as the bit line 191 is not under good condition, and therefore this wiring layer cannot be easily patterned.

The unnecessary remove of the element isolating film such as retreating of the bird's beak occurred during the manufacture of the conventional semiconductor device will impede improvements in the stable operations of this semiconductor device.

SUMMARY OF THE INVENTION

The present invention has been made to solve the above-described problems, and therefore, has an object to provide a semiconductor device having a better stable operation performance by preventing an element isolating film from being unnecessarily etched away, and by avoiding a failure operation of this semiconductor device caused by unnecessarily removing the element isolating film.

A semiconductor device, according to an aspect of the present invention, comprises: an element isolating film formed on one major surface of a semiconductor substrate; an element forming region formed on the major surface and surrounded by the element isolating film; a gate electrode formed via a gate insulating film on said element forming region and extended over said element isolating film; first and second impurity regions formed in the element forming region, whose portions exposed from a surface of the semiconductor substrate are made in contact with the element isolating film and are located opposite to each other under said gate electrode; a first insulating film formed near the gate electrode on the first impurity region, and extended over the gate electrode and near an extended portion of the gate electrode within the element isolating film; and a second insulating film formed near said gate electrode on said second impurity region; wherein a distance defined from an outer edge of the gate electrode on the side of the first impurity region to another outer edge of said first insulating film on the side apart from said gate electrode is longer than a distance defined from an outer edge of said gate electrode on the side of said second impurity region to another outer edge of said second insulating film on the side apart from said gate electrode.

In this semiconductor device, it is featured that said first and second insulating films are formed from a single insulating film formed on said element forming region and the gate electrode.

Also, said semiconductor device further comprises: an alignment mark, or an overlapping checking mark formed on a desired region of said element isolating film; and an insulating film for covering one of said alignment mark and said overlapping checking mark; wherein both said first insulating film, and said insulating film for covering one of said alignment mark and said overlapping checking mark are formed from a single insulating film formed on one of said alignment mark and said overlapping checking mark, said element forming region, and said gate electrode.

Then, said semiconductor device further comprises: a fuse formed on said element isolating film; and an insulating film formed under said fuse; wherein both said first insulating film and said insulating film formed under said fuse are formed from a single insulating film formed on said element forming region, said gate electrode, and said element isolating film.

Also, a semiconductor device, according to another aspect of the present invention, is featured by comprising: first and second element forming regions formed on one major surface of a semiconductor substrate; an element isolating film formed on said major surface, for electrically isolating said first element forming region from said second element forming region; a first gate electrode formed via a gate insulating film on said first element forming region; a side wall formed on side surfaces of said first gate electrode and said gate insulating film; two sets of first conductivity type of impurity regions having low concentration, formed in said first element forming region and located opposite to each other under said first gate electrode; two sets of first conductivity type impurity regions having high concentration, formed in said first element forming region, whose portions exposed from a surface of said semiconductor substrate are formed outside said two sets of first conductivity type impurity regions having the low-concentration with respect to said gate electrode; a second gate electrode formed via a gate insulating film on said second element forming region; two sets of second conductivity type impurity regions formed in said second element forming region and located opposite to each other under said second gate electrode; and an insulating film formed on said second element forming region and said second gate electrode, and extended over said element isolating film.

A semiconductor device manufacturing method, according to another aspect of the present invention, is featured by comprising the steps of: forming a gate electrode on a plurality of element forming regions formed on one major surface of a semiconductor substrate; forming a first resist mask opened in a desirable element forming region among said plurality of element forming regions; forming a first conductivity type impurity region having low concentration in said desirable element forming region by way of an ion implantation with employment of said gate electrode and said first resist mask; removing said first resist mask to thereby form a second resist mask opened in another desirable element forming region among said plurality of element forming regions; forming a second conductivity type impurity region having high concentration in said another element forming region by way of an ion implantation with employment of said gate electrode and said second resist mask; removing said resist mask to thereby form an insulating film on a plurality of formed element forming regions of said impurity regions; forming a third resist mask opened in said insulating film on the element forming region into which said first conductivity type impurity region having the low concentration is formed; forming a side wall in a side surface of said gate electrode by way of an anisotropic etching process with employment of said third resist mask; and forming a first conductivity type impurity region having high concentration in the element forming region where said first conductivity type impurity region having the low concentration is formed by way of an ion implantation with using said gate electrode, said side wall, and said resist mask.

Also, a semiconductor device manufacturing method, according to another aspect of the present invention, is featured by comprising the steps of: forming gate electrodes on an element forming region formed in one major surface of a semiconductor substrate in such a manner that said gate electrodes are extended over an element isolating film for surrounding said element forming region; forming a pair of impurity regions in said element forming region by way of an ion implantation by using said gate electrodes as a mask; forming an insulating film on said element forming region; forming a resist pattern on said insulating film in such a manner that the resist pattern covers a portion near one of said gate electrodes within said paired impurity regions, said gate electrodes, and a portion near an extended portion of said gate electrode within said element isolating film; and using said resist pattern as a mask to execute an anisotropic etching process of said insulating film.

Also, in the semiconductor device manufacturing method, it is featured by that: in the step for forming the gate electrodes, an alignment mark, or an overlapping checking mark is formed on a desirable region of the element isolating film; in the step for forming the insulating film, an insulating film is formed on one of said alignment mark and said overlapping checking mark; and in the step for forming the resist pattern, another resist pattern is formed which covers one of said alignment mark and said overlapping checking mark.

Further, in the semiconductor device manufacturing method, it is featured by further comprising the step of: forming a fuse on an element isolating film; wherein in the step for forming the insulating film, another insulating film is formed on such a region where said fuse is formed on an upper layer; and in the step for forming the resist pattern, another resist pattern is formed which covers such a region where said fuse is formed on an upper layer.

DETAILED DESCRIPTION OF THE PREFERRED EMBODIMENTS

First Embodiment

A description will now be made of an embodiment mode 1 according to the present invention.

The present invention is directed to a useful technique made effective when the inventive idea is applied to, for example, a semiconductor device having an SRAM cell. Referring now to FIG. 1A to FIG. 8B, the embodiment 1 of the present invention applied to the SRAM cell will be explained.

Figure 1A:
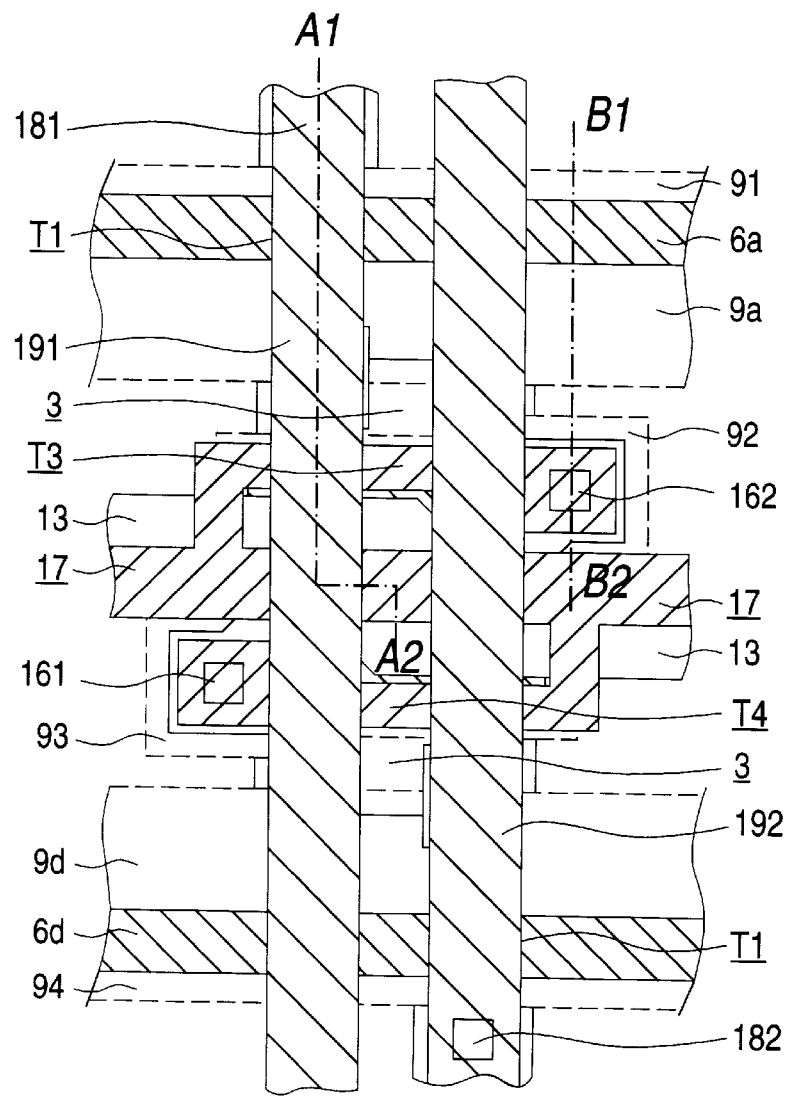
FIGS. 1A and 1B are a plan view for representing an embodiment 1 of the present invention in a manufacturing sequence and a sectional view thereof taken along a line B1–B2.
Figure 1B:
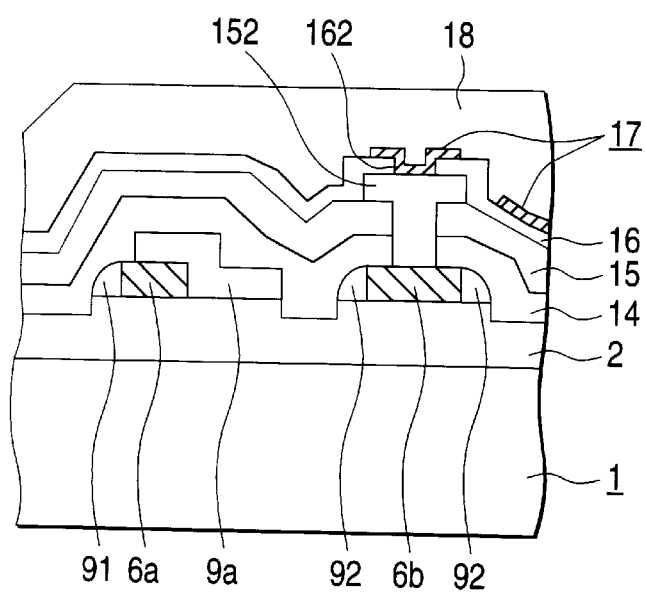
Figure 2:
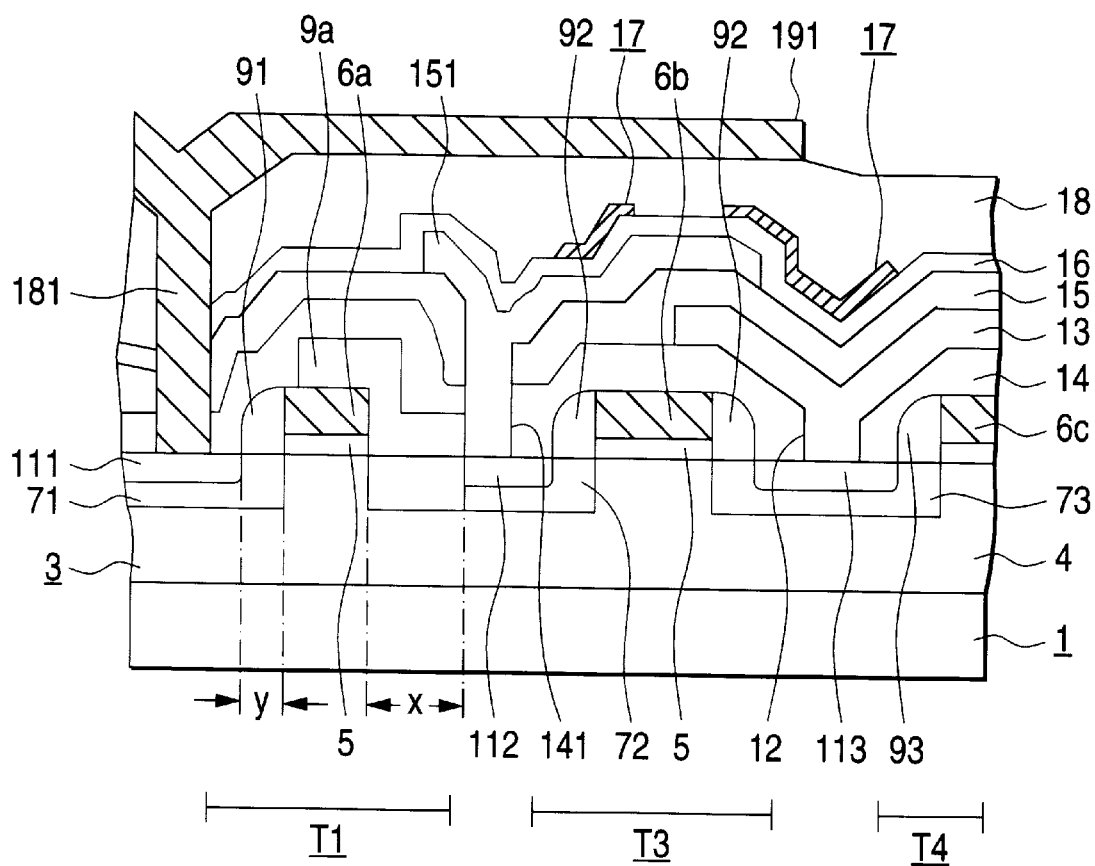
FIG. 2 is a sectional view taken along a line A1–A2 of FIG. 1A.

FIG. 1A is a plan view for showing a major portion of a semiconductor device which indicates an embodiment 1 of the present invention. FIG. 1B is a sectional view of the semiconductor device shown in FIG. 1A, taken along a line B1–B2 thereof. FIG. 2 is another sectional view of the semiconductor device indicated in FIG. 1A, taken along a line A1–A2 thereof. In FIGS. 1A to FIG. 2, reference numeral 1 denotes a semiconductor substrate made of an N⁻type silicon substrate, and reference numeral 2 indicates an element isolating film corresponding to a field insulating film formed on a surface of the semiconductor substrate 1 and a made of, for instance, $SiO_2$ having a thickness of approximately 3000 Å. Reference numeral 3 is an element forming region formed on the N⁻type silicon substrate 1 and surrounded by the field insulating film 2 for isolating the elements.

Also, reference numeral 4 indicates a P⁻type well region having impurity concentration of on the order of $10^{16}$ to $10^{18}$ cm⁻³, and this P⁻type well region 4 is formed in the element forming region 3, a portion of which is exposed to the surface of the semiconductor substrate 1 and is in contact with, for example, a gate insulating film 5 having a thickness of approximately 70 Å and made of $SiO_2$.

Reference numerals 6a and 6d are word lines corresponding to gate electrodes of access transistors T1 and T2, respectively, and also reference numerals 6b and 6c are gate electrodes of driver transistors T3 and T4, respectively. The above-described gate insulating films 5 are formed just under these gate electrodes.

Further, reference numerals 71 to 75 show N⁻type source-to-drain regions having impurity concentration of on the order of $10^{17}$ to $10^{19}$ cm⁻³. These N⁻type source/drain regions 71 to 75 are formed the element forming region 3, portions of which are exposed from the surface of the semiconductor substrate 1 and are formed in such a manner that the gate electrodes 6a to 6d are sandwiched by these portions under these gate electrodes 6a to 6d (also indicated in FIG. 3A).

Also, reference numerals 111 to 115 show N⁻type source-to-drain regions having impurity concentration of on the order of $10^{20}$ to $10^{21}$ cm⁻³. These N⁻type source/drain regions 111 to 115 are formed the element forming region 3, portions of which are exposed from the surface of the semiconductor substrate 1 and are formed in such a manner that the gate electrodes 6a to 6d are sandwiched by these portions under these gate electrodes 6a to 6d (also indicated in FIG. 5A), at a position further outside the N⁻type source/drain regions 71 to 75.

Reference numerals 9a and 9d indicate first insulating films formed on the gate electrodes 6a, 6d of the access transistors T1, T2, and formed along the gate electrodes 6a, 6b in such a manner that the first insulating films have widths of distances "x" from side walls of the gate electrodes 6a, 6d on the side of the first impurity regions 72 and 74. Reference numerals 91 and 94 show second insulating films corresponding to side wall oxide films formed along the gate electrodes 6a, 6d in such a manner that the second insulating films 9a and 94 have widths of distances "y" (concretely speaking, on the order of 500 to 1500 Å) narrower than the above-described distance "x" from the side walls of the word lines 6a and 6d on the side of the second impurity regions 71 and 75. Also, reference numerals 92 and 93 are side wall oxide films having widths on the order of 500 to 1500 Å and formed on the side walls of the gate electrodes 6b and 6c of the driver transistors T3 and T4, respectively.

Reference numeral 14 shows an interlayer insulating film made of an $SiO_2$ film having a thickness of approximately 1500 Å, and formed on the surface of the semiconductor substrate 1, the gate electrodes 6a to 6d, the side wall oxide films 91 to 94, and the first insulating films 9a, 9d. Reference numeral 12 represents a contact hole (also shown in FIG. 6A) formed in the interlayer insulating film 14 and opened in a portion of the N⁺type source/drain region 113. Reference numeral 13 shows a ground wiring line constructed of a laminated film made from a tungsten silicide ($WSi_2$) film and a phosphorus doped polycrystal silicon film, and electrically connected via the contact hole 12 to the N⁺type source/drain region 113.

Reference numeral 15 shows another interlayer insulating film made of an $SiO_2$ film having a thickness of approximately 1500 Å and formed on the ground wiring line 13 and the $SiO_2$ film 14. Reference numerals 141 to 144 indicate contact holes (also shown in FIG. 7A) formed in the interlayer insulating films 14 and 15. These contact holes 141 to 144 are opened in the gate electrodes 6b, 6c of the driver transistors T3, T4; in impurity regions 72, 112 between the access transistor T1 and the driver transistor T4; and in impurity regions 74, 114 between the access transistor T2 and the driver transistor T4.

Reference numeral 151 shows a connection line (also indicated in FIG. 7A) made of a phosphorus doped polycrystal silicon film having a thickness of approximately 1000 Å and phosphorus concentration of on the order of 1.0 to $8.0 \times 10^{20}$ cm⁻³. The connection line 151 is electrically connected via the contact hole 141 to the impurity regions 72, 112, and also via the contact hole 142 to the gate electrode 6c.

Reference numeral 152 shows another connection line (also indicated in FIG. 7A) made of a phosphorus doped polycrystal silicon film having a thickness of approximately 1000 Å and phosphorus concentration of on the order of 1.0 to $8.0 \times 10^2$ cm$^{-3}$. The connection line 152 is electrically connected via the contact hole 144 to the impurity regions 74, 114, and also via the contact hole 143 to the gate electrode 6b.

Reference numeral 16 is another interlayer insulating film made of an SiO$_2$ film having a thickness of approximately 100 to 500Å, and formed on the connection lines 151, 152 and on the SiO$_2$ film 15. Reference numerals 161 and 162 denote contact holes formed in the interlayer insulating film 16 and opened in a portion of each of the phosphorus doped polycrystal silicon films 151 and 152.

Reference numeral 17 indicates an electrode made of a polycrystal silicon film having a thickness of on the order of 200 to 1000 Å, and is electrically connected via the contact holes 161 and 162 to a portion of each of the phosphorus doped polycrystal silicon films 151 and 152. A P-channel type TFT (thin-film transistor) is fabricated which has channel regions 172, 175 into which phosphorus (P) is partially doped, and source regions 173, 176 and also drain regions 171, 174 (also shown in FIG. 8A) with sandwiching these channel regions 173, 176, into which boron (B) is doped.

Reference numeral 18 indicates an interlayer insulating film formed on the electrode 17 and the SiO$_2$ film 16. Reference numerals 181 and 182 show bit-line contact holes formed in the interlayer insulating films 14, 15, 16, 18, and opened in the impurity regions 111, 115. Also, reference numerals 191 and 192 shows bit lines made of aluminum wiring lines electrically connected via the contact holes 181, 182 to the impurity regions 111, 115, respectively.

In this embodiment, symbols T1 and T2 (also shown in FIG. 5A) denote access transistors constructed of the gate electrodes 6a, 6d; the source regions 72, 112 and 74, 114; and further the drain regions 71, 111 and 75, 115, which are located opposite to each other under these gate electrodes 6a, 6d. Symbols T3 and T4 represent driver transistors (also indicated in FIG. 5A) arranged by the gate electrodes 6b, 6c; the source regions 73, 113 (common to T3, T4); and the drain regions 72, 112 and 74, 114, which are located opposite to each other under these gate electrodes 6b, 6c.

It should be understood that in FIG. 1A, in order to clarify a positional relationship between the gate electrodes 6a, 6d and the first insulating films 9a, 9d, indications of outer edges of the first insulating films 9a, 9d on the gate electrodes 6a, 6d are omitted. Instead thereof, the gate electrodes 6a and 6d located under the first insulating films 9a and 9d are indicated. Also, in order to clearly indicate a positional relationship between the bit lines 191, 192 and the electric elements (for instance, gate electrodes 6a, 6d of access transistors) located under these bit lines 191, 192, indications of the SiO$_2$ films 14, 15, 16, 18 are omitted. Instead thereof, the under layers are indicated.

Referring now to FIG. 3A to FIG. 8B, a method for manufacturing the semiconductor device arranged in the above-described manner will be described in the manufacturing sequence.

Figure 3A:
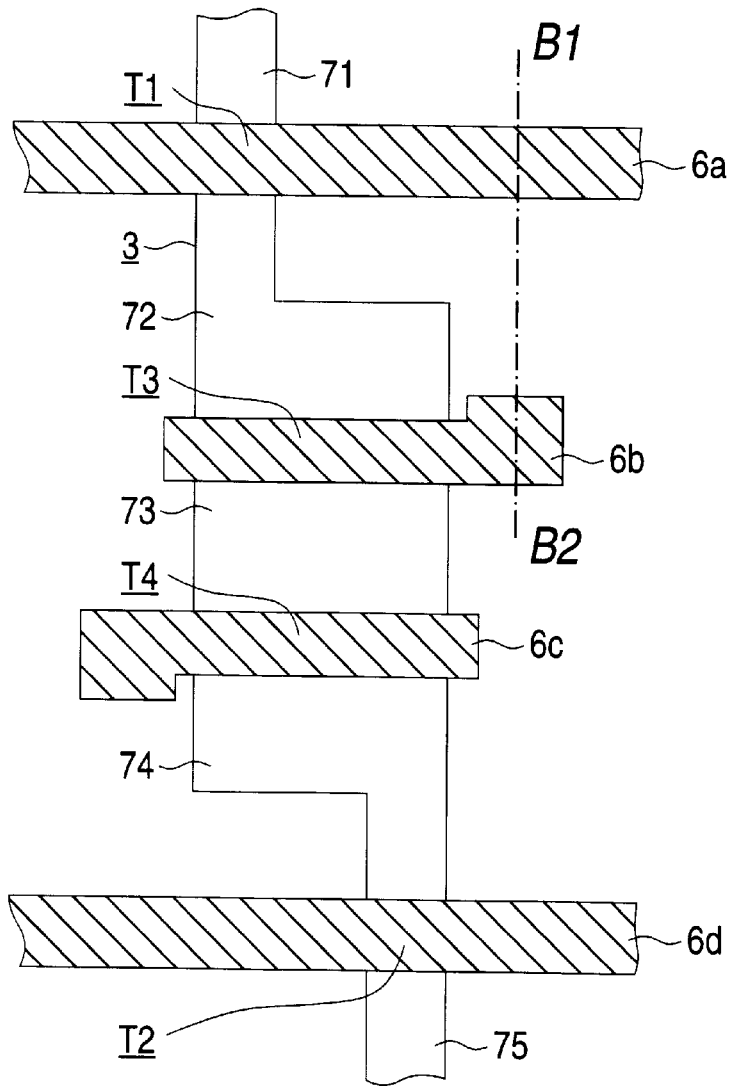
FIGS. 3A and 3B are a plan view for showing the embodiment 1 of the present invention in the manufacturing sequence, and a sectional view thereof taken along the line B1–B2.
Figure 3B:
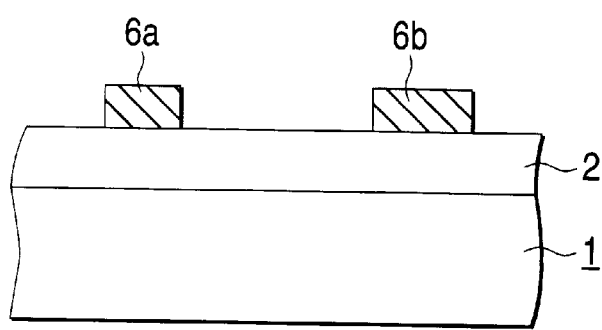

First, as indicated in FIG. 3A and FIG. 3B, a field insulating film 2 functioning as an element isolating film made of SiO$_2$ having a thickness of approximately 3000 Å is formed on an N$^-$type silicon substrate 1 corresponding to a semiconductor substrate by employing the selective thermal oxidation method (for instance, local oxidation of silicon: LOCOS). In this selective thermal oxidation method, for example, while a silicon oxide (SiO$_2$) film is used as a pad film, a silicon nitride (Si$_3$N$_4$) film deposited on this pad film is used as an anti-oxidation mask.

Thereafter, both the pad SiO$_2$ film and the Si$_3$N$_4$ film are removed which are employed as the above-described selective thermal oxidation, so that an element forming region 3 is exposed from a surface of the N$^-$type silicon substrate 1.

Then, for example, a P type impurity such as boron (B) is implanted into the entire major surface of the N$^-$type silicon substrate 1 under such a condition that the implanting voltages are selected from 200 KeV to 700 KeV, and the dose amount is selected to be on the order of $1.0 \times 10^{12}$ cm$^{-2}$ to $1.0 \times 10^{13}$ cm$^{-2}$. Furthermore, the P type impurity such as boron (B) is implanted into the resultant major surface of the silicon substrate 1 under conditions of, for instance, 30 to 70 KeV and approximately $1.0 \times 10^{12}$ to $2.0 \times 10^{13}$ cm$^{-2}$, to thereby set the threshold voltages "Vth" of access transistors T1, T2 and driver transistors T3, T4. A P$^-$type well region 4 formed in this manner contains impurity concentration of on the order of approximately $10^{16}$ to $10^{18}$ cm$^{-3}$.

Then, a gate insulating film 5 made of SiO$_2$ having a thickness of, for example, 70 Å is formed on the entire surface by way of, for example, the thermal oxidation. With employment of the LPCVD (low pressure chemical vapor deposition) method, gas such as phosphine (PH$_3$) is mixed thereon, so that a phosphorus doped polycrystal silicon film having a thickness of approximately 1000 Å is deposited with phosphorus density of approximately 1.0 to $8.0 \times 10^{20}$ cm$^{-3}$.

Then, the photoresist is patterned into a predetermined shape by employing the photolithography, and while using this patterned photoresist as a mask, for instance, the reactive ion etching (RIE) method is applied so as to pattern the above-described phosphorus doped polycrystal silicon film, so that word lines 6a, 6d corresponding to the gate electrodes of the access transistors T1, T2, and the gate electrodes 6b, 6a of the driver transistors T3, T4 are formed.

It should be noted that although the word lines 6a, 6d and the gate electrodes 6b, 6c of the driver transistors are formed only by the phosphorus doped polycrystal silicon film in this embodiment, these components may be made by employing, for instance, a so-called polysilicide wiring pattern made of a metal silicide such as a tungsten silicide (WSi$_2$) film, and the phosphorus doped polycrystal silicon film.

Thereafter, for instance, arsenic (As) is implanted into the entire surface over the gate insulating film 5 while rotating a wafer under such a condition that the dosing energy is selected to be approximately 30 to 70 KeV, the implanting angle is 45 degrees, and the dose amount is selected from approximately 1.0 to $5.0 \times 10^{13}$ cm$^{-2}$, and thus N$^-$type source to drain regions 71 to 75 are formed in a region other than such regions shielded by the word lines 6a, 6d of the element forming region 3 and the gate electrodes 6b, 6c of the driver transistors. In this case, the N$^-$type source/drain regions 71 to 75 contain impurity density of on the order of $10^{17}$ to $10^{19}$ cm$^{-3}$.

Figure 4A:
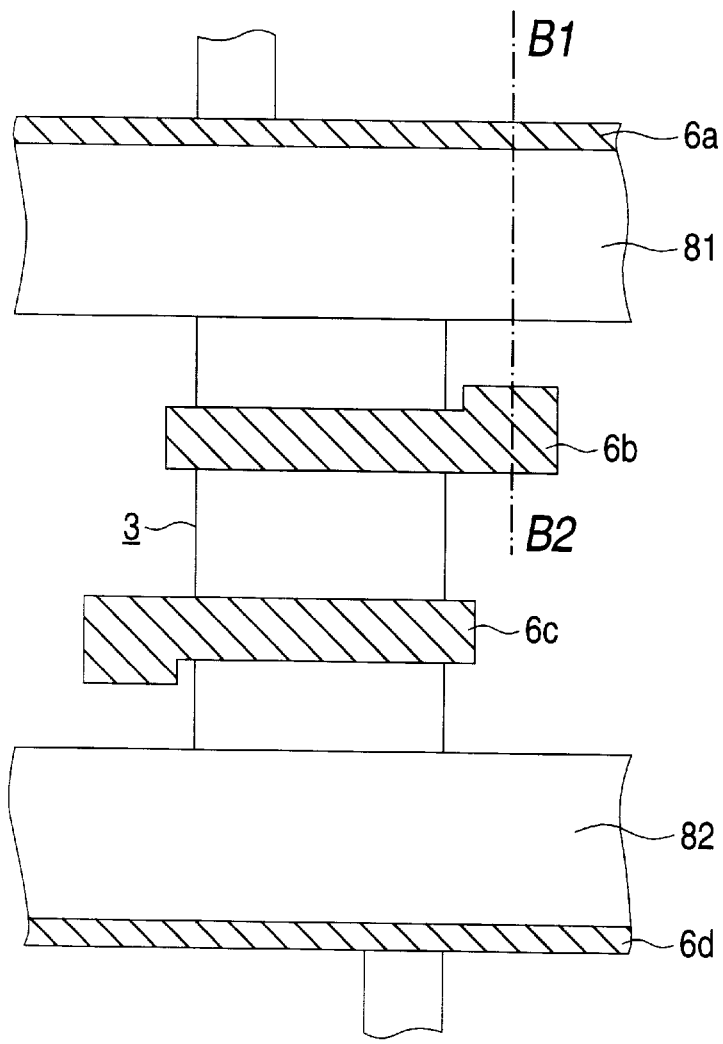
FIGS. 4A and 4B are a plan view for showing the embodiment 1 of the present invention in the manufacturing sequence, and a sectional view thereof taken along the line B1–B2.
Figure 4B:
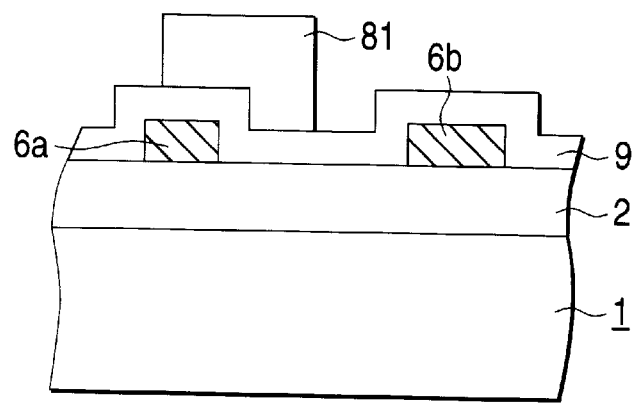

Next, as indicated in FIG. 4A and FIG. 4B, an SiO$_2$ film 9 having a thickness of approximately 500 to 1500 Å is deposited on the entire surface by employing the LPCVD method. Thereafter, the photoresists 81 and 82 are patterned in such a manner that these photoresists are located on the SiO$_2$ film 9 along the gate electrodes 6a and 6d and moreover may cover portions of these gate electrodes 6a and 6d. It should be understood that in FIG. 4A, in order to clearly indicate a positional relationship the photoresists 81, 82 and the word lines 6a, 6d corresponding to the gate electrodes of the access transistors, the indication of the SiO$_2$ film 9 is omitted. Instead of this SiO$_2$ film 9, an under layer thereof is indicated.

Figure 5A:
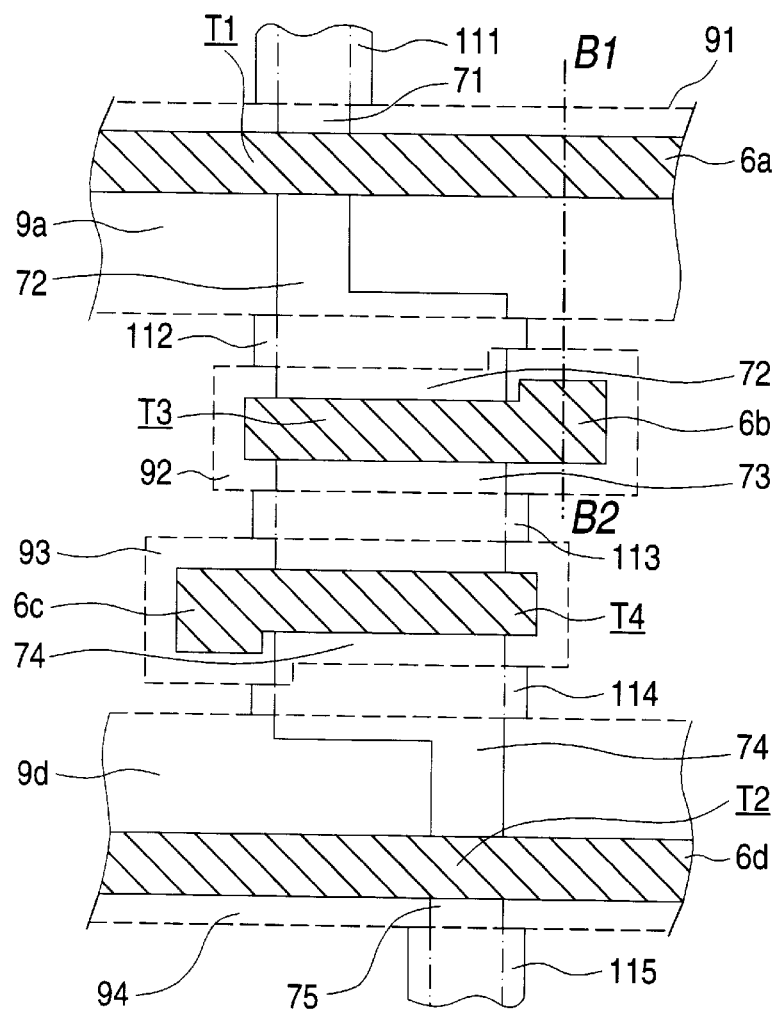
FIGS. 5A and 5B are a plan view for showing the embodiment 1 of the present invention in the manufacturing sequence, and a sectional view thereof taken along the line B1–B2.
Figure 5B:
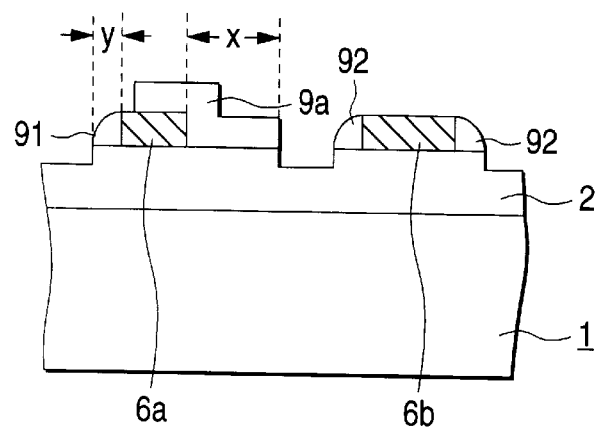

Then, as shown in FIG. 5A and FIG. 5B, side wall oxide films 91 to 96 having a thickness of approximately 500 to 1500 Å are formed on side walls of the word lines 6a, 6b and also of gate electrodes 6b, 6c of the driver transistors by using the RIE method. At this time, the SiO$_2$ films 9a and 9d are simultaneously formed in such a manner that the distance "x" is longer than the widths "y" (approximately 500 to 1500 Å) of the side wall oxide films 91 and 94, and this distance "x" is defined from the side walls of the gate electrodes 6a and 6d which are shielded by the photoresists 81 and 82 to be left to the outer edges separated from these gate electrodes 6a and 6d.

At the same time, in this case, the field insulating film 2 is also planed by the RIE method, so that the area of the element forming region 3 exposed from the surface of the semiconductor substrate 1 is increased. It should be noted that a dot and dash line of FIG. 5A indicates the element forming region 3 which has not yet been planed by the RIE method, and a solid line thereof indicates the element forming region 3 which has been planed.

Thereafter, while using these side wall oxide films 91 to 94 and the SiO$_2$ films 9a and 9d left by being shielded by the photoresists 81 and 82 as a mask, for instance, arsenic (As) is implanted at 50 KeV with the dose amount of approximately 1.0 to 5.0×10$^{15}$ cm$^{-2}$ to form N$^+$type source/drain regions 111 to 115. At this case, for example, either arsenic (As) or phosphorus (P) may be additionally implanted at approximately 30 to 70 KeV at an implanting angle of 45 degrees into the overall surface with the dose amount of approximately 1.0 to 5.0×10$^3$ cm$^{-2}$, while rotating the wafer.

In this case, the N$^+$type source/drain regions 111 to 115 contain impurity concentration of on the order of 10$^{20}$ to 10$^{21}$ cm$^{-3}$, and forms a so-called "LDD (lightly doped drain)" structure for relaxing an electric field near the drain by the N$^-$type source/drain regions 71 to 75 and the N$^+$type source/drain regions 111 to 115.

In FIG. 5A, in order to clearly indicate the positional relationship among the N$^+$type source/drain regions 111 to 115, the side wall oxide films 91 to 96 and the SiO$_2$ films 9a, 9d, outer edges of the side wall oxide films 91 to 96, and the gate electrodes 6a, 6d of the SiO$_2$ films 9a, 9d are indicated by a dotted line and also underlayers thereof are indicated.

Figure 6A:
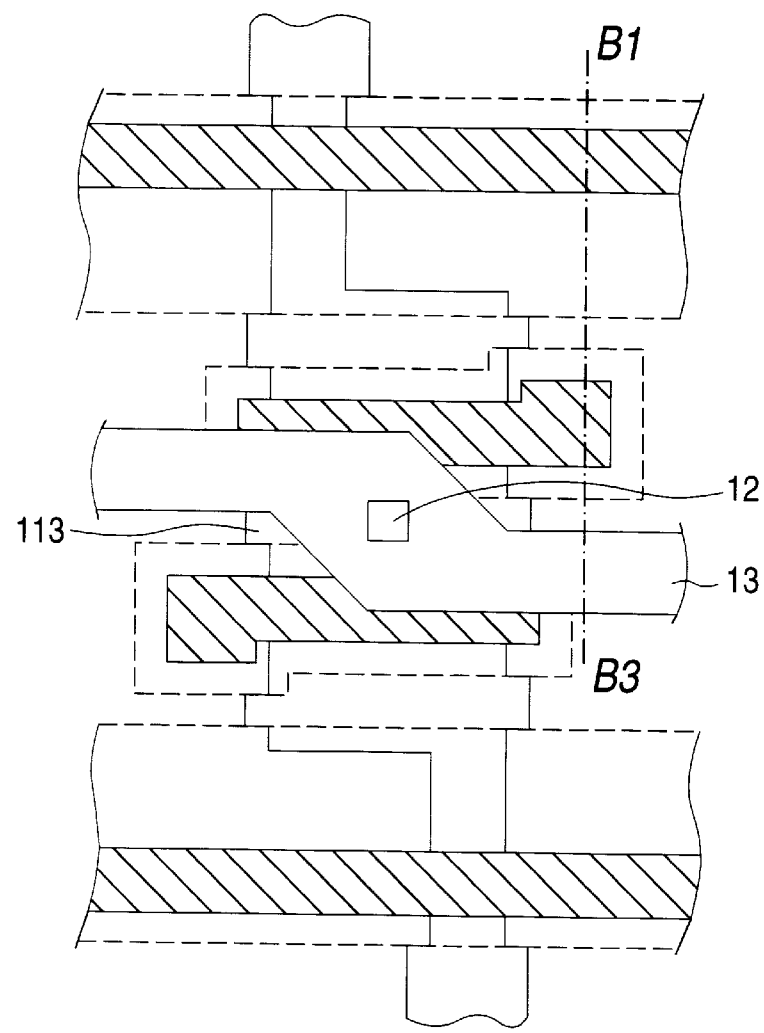
FIGS. 6A and 6B are a plan view for showing the embodiment 1 of the present invention in the manufacturing sequence, and a sectional view thereof taken along the line B1–B2.
Figure 6B:
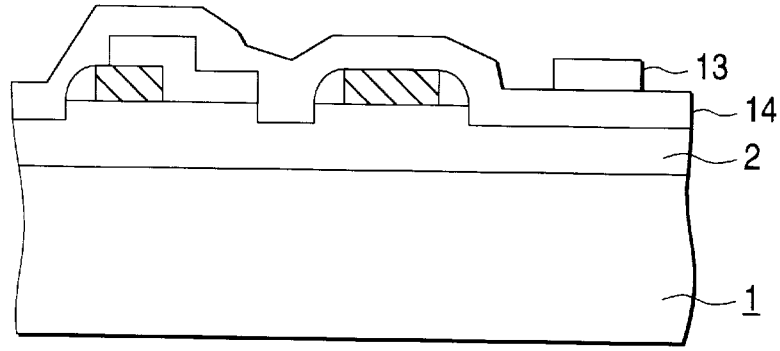

Next, as shown in FIG. 6A and FIG. 6B, after an SiO$_2$ film 14 having a thickness of approximately 1500 Å has been deposited on the entire surface by using the LPCVD method, the photoresist is patterned to have a preselected form by using the photolithography technique. While using this patterned photoresist as a mask, for instance, the RIE method is applied to selectively remove the SiO$_2$ film 14, so that such a contact hole 12 is formed in this SiO$_2$ film 14 in such a manner that a portion of the N$^+$type source/drain region 113 is exposed.

Then, after a phosphorus doped polycrystal silicon film having a thickness of approximately 1000 Å and phosphorus concentration of on the order of 1.0 to 8.0×10$^{20}$ cm$^{-3}$ has been deposited by using the LPCVD method, a metal silicide film such as a tungsten silicide (WSi$_2$) film having a thickness of 1000 Å is further and continuously deposited.

Then, the photoresist is patterned to have a predetermined shape by employing the photolithography technique, and while using this patterned photoresist as a mask, for example, the RIE method is applied so as to continuously pattern the above-described tungsten silicide (WSi$_2$) film and phosphorus doped polycrystal silicon film, so that a ground wiring line 13 is formed.

In FIG. 6A, in order to clearly indicate a positional relationship between the ground wiring line 13 and the gate electrodes 6b, 6c of the driver transistors, the indication of the SiO$_2$ film 14 is omitted. Instead, an under layer of this film is indicated.

Figure 7A:
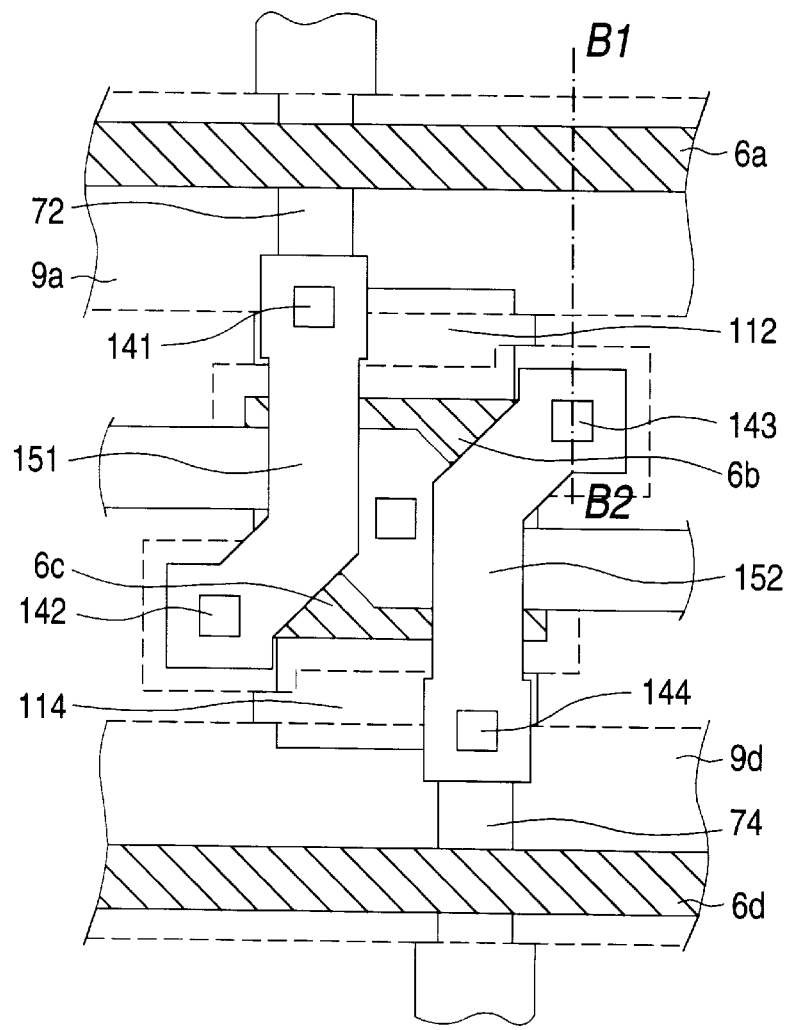
FIGS. 7A and 7B are a plan view for showing the embodiment 1 of the present invention in the manufacturing sequence, and a sectional view thereof taken along the line B1–B2.
Figure 7B:
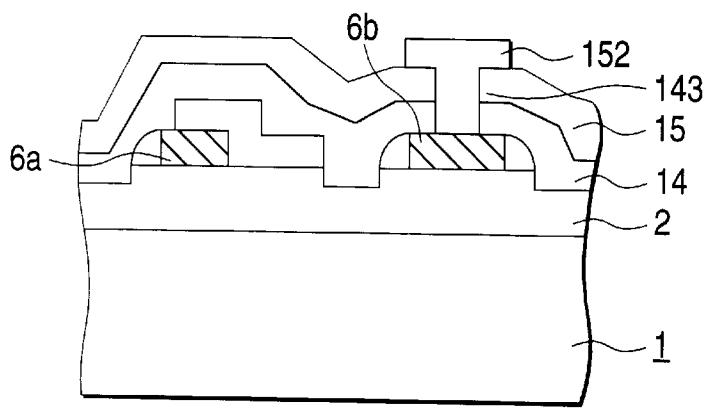

Thereafter, as shown in FIG. 7A and FIG. 7B, after an SiO$_2$ film 15 having a thickness of approximately 1500 Å is deposited on the overall surface by using the LPCVD method, the photoresist is patterned to have a predetermined shape by using the photolithography technique. While using this patterned photoresist as a mask, for example, the RIE method is applied to selectively remove the SiO$_2$ films 14 and 15 (may involving SiO$_2$ films 9a and 9d), so that contact holes 141 to 144 are formed in such a manner that the contact holes are opened in an impurity region 72 or 112 between the access transistor T1 and the driver transistor T3, and another impurity region 74 or 114 between the gate electrodes 6c, 6b of the driver transistors, the access transistor T2, and the driver transistor T4.

Then, a phosphorus doped polycrystal silicon film having a thickness of approximately 1000 Å and phosphorus concentration of on the order of 1.0 to 8.0×10$^{20}$ cm$^{-3}$ is deposited by using the LPCVD method. Thereafter, the photoresist is patterned to have a predetermined shape by using the photolithography technique, and while using this patterned photoresist as a mask, for example, the etching process is carried out by way of the RIE method. Accordingly, the above-described phosphorus doped polycrystal silicon film is patterned to thereby form connections 151 and 152.

It should be noted that in FIG. 7A, in order to clearly indicate a positional relationship between the connection lines 151, 152 and the gate electrodes 6b, 6c of the driver transistors and also the impurity regions 72, 112, and 74, 114, the indications of the SiO$_2$ films 14, 15 are omitted. Instead, under layers of these films are indicated.

Figure 8A:
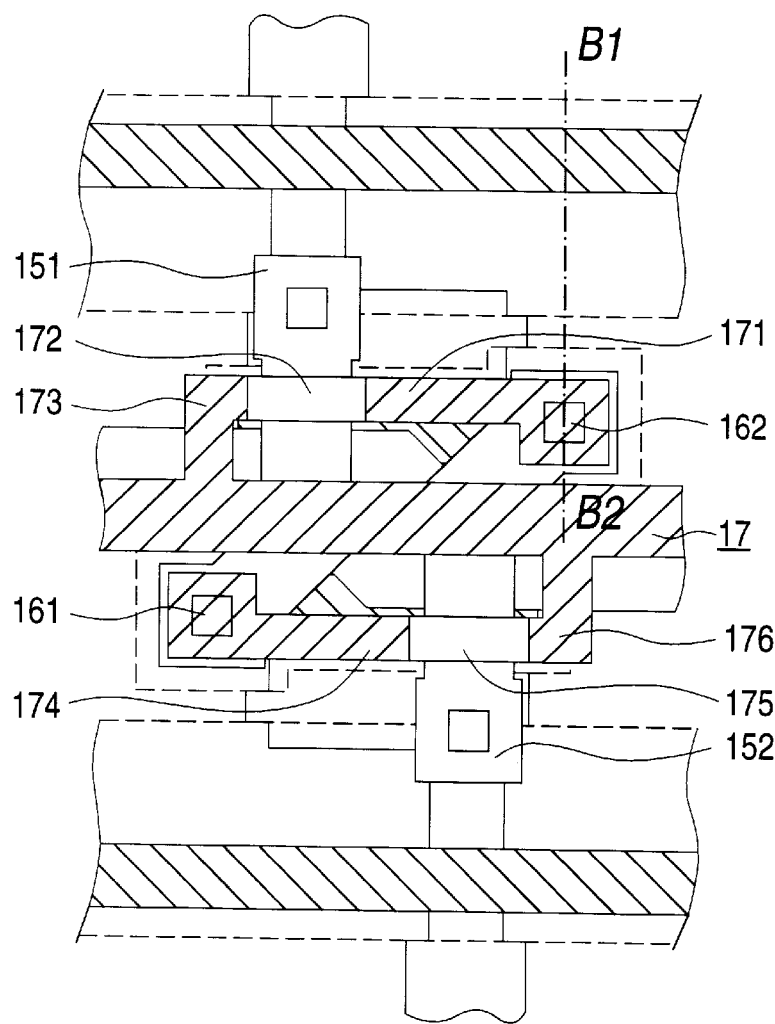
FIGS. 8A and 8B are a plan view for showing the embodiment 1 of the present invention in the manufacturing sequence, and a sectional view thereof taken along the line B1–B2.
Figure 8B:
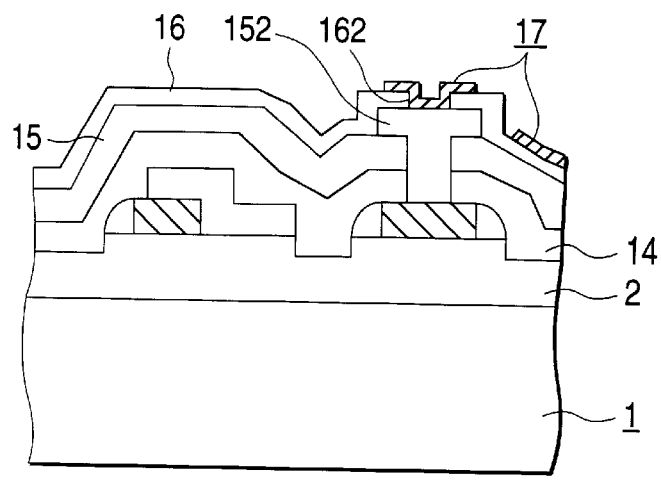

Thereafter, as shown in FIG. 8A and FIG. 8B, after "SiO$_2$ film 16 having a thickness of approximately 100 to 1500 Å is deposited on the overall surface by using the LPCVD method, the photoresist is patterned to have a predetermined shape by using the photolithography technique. While using this patterned photoresist as a mask, for example, the RIE method is applied to selectively remove the SiO$_2$ film 16 so that contact holes 161 and 162 are formed in such a manner that portions of the phosphorus doped polycrystal silicon films 151 and 152 are exposed.

Then, a polycrystal silicon film having a thickness of approximately 200 to 1000 Å is deposited by using the LPCVD method. Subsequently, phosphorus (p) is implanted with the dose amount of 1.0×10$^{12}$ to 1.0×10$^{14}$ cm$^{-2}$ at 30 KeV. Then, the photoresist is patterned to have a predetermined shape by using the photolithography technique, and while using this patterned photoresist as a mask, for example, the RIE method is applied. Accordingly, the above-described polycrystal silicon film is patterned to thereby form an electrode 17.

Thereafter, furthermore, the photoresist for shielding desirable positions 172 and 175 on the electrode 17 is patterned by using the photolithography technique. While using this patterned photoresist as a mask, for example, BF$_2$ is implanted at 20 KeV in the dose amount of approximately 1.0×10$^{14}$ to 1.0×10$^{15}$ cm$^{-2}$ and the above-described photoresist is removed. Then, the resultant substrate is annealed for 30 minutes at the temperature of, e.g., 750° C. to 850° C.

so as to activate the impurities, so that source regions 173, 176, drain regions 171, 174, and channel regions 172, 175 of P channel type TFTs (thin-film transistors) are fabricated, respectively.

It should also be noted that in FIG. 8A, in order to clearly indicate a positional relationship between the electrode 17 and the connection lines 151, 152, the indications of the $SiO_2$ films 14, 15, 16 are omitted. Instead, under layers of these films are indicated.

Next, similar to the ordinary LSI, after an interlayer insulating film 18 is formed on the electrode 17 and the $SiO_2$ film 16, bit-line contact holes 181 and 182 opened in the impurity regions 111 and 115 are formed. Bit lines 191 and 192 made of aluminum wiring lines and being electrically connected via the bit-line contact holes 181 and 182 to the impurity regions 111 and 115 are formed, so that the semiconductor device as indicated in FIG. 1A and FIG. 1B and further FIG. 2 is obtained.

In accordance with the embodiment 1 of the present invention, even when the integration degree of the semiconductor device is increased, the employment of the resist masks 81 and 82 can prevent the above-described bird's beak located near the gate electrodes 6a and 6d from being retreated. As a consequence, it is possible to avoid lowering of the cell ratio caused by the increase of the driveability of the access transistors T1 and T4. Therefore, the cell ratio can be selected to be better values (for instance, more than 3), and the stable operation of the memory cell can be realized.

Also, as illustrated in FIG. 2, the $SiO_2$ films 9a and 9d are shield by the resist masks 81 and 82 to be intentionally left on the word lines 6a and 6d, so that the flatness characteristics under the bit lines 191 and 192 can be improved, and thus ups/downs of these bi lines 191 and 192 can be decreased. As a consequence, the upper layer wiring lines containing the bit lines 191 and 192 can be readily patterned. Therefore, the semiconductor device according to this embodiment 1 can be manufacture in low cost, and can have the electrically stable characteristic.

Moreover, in the conventional manufacturing stages of the semiconductor device as represented in FIG. 37 to FIG. 43, the etching damages caused by the over etching treatment when the side wall oxidation films 91 to 96 are formed are conducted into the element forming region 3. However, according to the embodiment 1 of the present invention, the $SiO_2$ film 2 is shield by the resist masks 81 and 82, so that the area within the element forming region 3 into which the etching damages are conducted can become small. Therefore, such a problem can be mitigated that the storage data would be electrically damaged due to leak currents caused by the above-explained etching damages.

It should also be noted that in the embodiment 1 of the present invention, the $SiO_2$ film 9 having the thickness of approximately 500 to 1500 Å is deposited by employing the LPCVD method over the entire surface, and immediately after, the photoresists 81 and 82 are formed. Alternatively, in order to avoid the above-explained introductions of the etching damages into the element forming region 3, after the $SiO_2$ film 9 is deposited, the entire surface of this $SiO_2$ film 9 may be etched away with the thickness of approximately 400 to 1000 Å in such a manner that the substrate 1 is not over-etched. Thereafter, similar to the embodiment 1, the photoresists 81 and 82 may be formed so as to be additionally etched away. As a result, the etching damages conducted into the element forming region 3 may be further mitigated.

Second Embodiment

Now, a description will be made of forming of an alignment mark in the semiconductor device according to the above-described embodiment 1 when this semiconductor device is manufactured by utilizing the conventional method.

In such a case that the conventional method is employed, in the same manufacturing step as that of the gate electrodes 6a to 6d shown in FIG. 3 of the embodiment 1, an alignment mark 7 is first formed in a desired region 7a on the element isolating film 2 by patterning the phosphorus doped polycrystal silicon film in a similar manner to the above-described gate electrodes 6a to 6d. Next, in the same manufacturing step as that of the $SiO_2$ film 9 shown in FIG. 17 of the embodiment 1, the $SiO_2$ film 9 is formed on the entire surface of the semiconductor substrate 1.

Figure 9A:
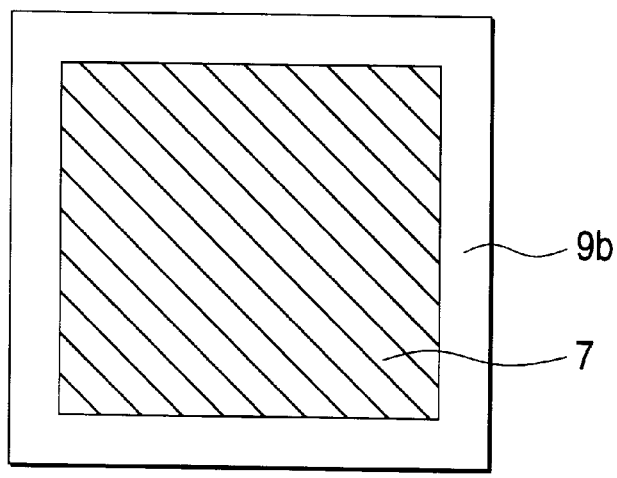
FIGS. 9A and 9B are a plan view for representing the conventional alignment mark forming step and a sectional view thereof.
Figure 9B:
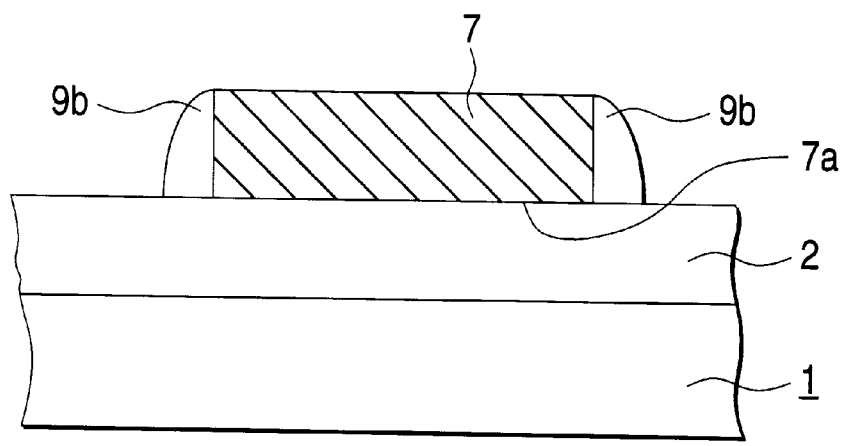

Next, in a manufacturing step shown in FIG. 9A and FIG. 9B same as the RIE stage represented in FIGS. 5A and 5B of the embodiment 1, the $SiO_2$ film 9 formed on the alignment mark 7 is also etched away by way of the RIE method, and a side wall 9b is formed on a side wall of the alignment mark 7.

As a result, in the case that thus the formed alignment mark 7 is employed, the edge of the alignment mark 7 cannot be sharply detected during the alignment, so that the alignment precision would be deteriorated.

Under such a circumstance, an embodiment 2 of the present invention capable of solving the above-described problem caused by the alignment mark formed by way of the conventional method will now be explained with reference to FIG. 10.

Figure 10A:
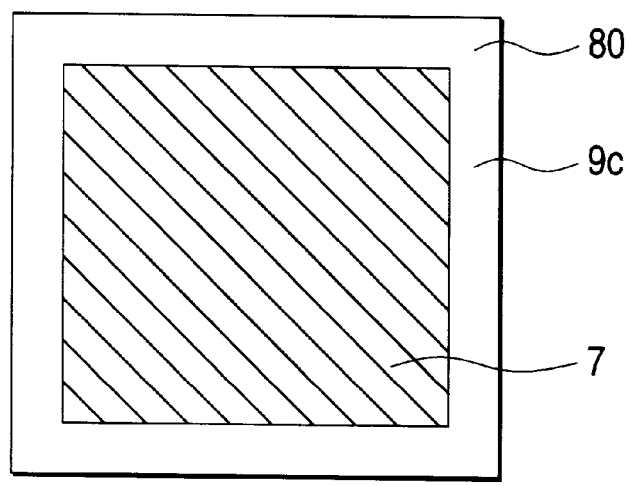
FIGS. 10A and 10B are a plan view for showing an alignment mark forming step according to an embodiment 2 of the present invention, and a sectional view thereof.
Figure 10B:
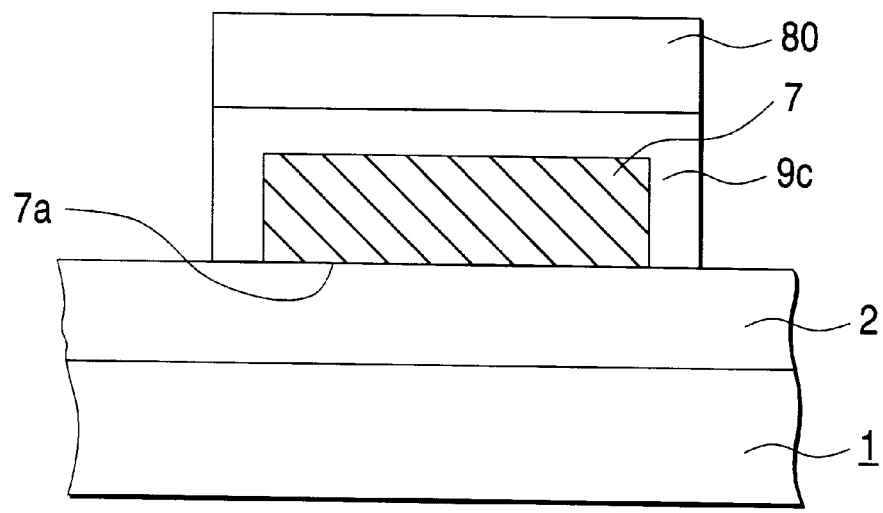

In this case, FIG. 10A is a plan view for representing an alignment mark and an adjoining region thereof, according to the embodiment 2 of the present invention. FIG. 10B is a sectional view for showing a major portion corresponding to the alignment mark and the adjoining region of FIG. 10A.

According to the embodiment 2 of the present invention, in the same manufacturing step as that of the gate electrodes 6a to 6d shown in FIGS. 3A and 3B of the embodiment 1, an alignment mark 7 is first formed in a desired region 7a on the element isolating film 2 by patterning the phosphorus doped polycrystal silicon film in a similar manner to the above-described gate electrodes 6a to 6d. Next, in the same manufacturing step as that of the $SiO_2$ film 9 shown in FIGS. 4A and 4B of the embodiment 1, the $SiO_2$ film 9 is formed on the entire surface of the semiconductor substrate 1. At the same time, in the same manufacturing step as that of the photoresists 81 and 82, a photoresist 80 is also formed on the alignment mark 7.

Subsequently, in a manufacturing step shown in FIG. 10A and FIG. 10B, which is the same as the RIE step of the embodiment 1 shown in FIGS. 5A and 5B, this photoresist 80 can prevent the alignment mark 7 from being exposed to the RIE method, and also may form the $SiO_2$ film 9c for covering the alignment mark 7.

As a result, the embodiment 2 can avoid such a conventional problem that the side wall 9b is formed on the side wall of the alignment mark 7. Also, the edge of the alignment mark 7 can be sharply detected, so that the alignment precision can be improved.

The above-described inventive idea is not limited to the alignment mark, but may be applied to an overlapping checking mark. In the latter mark, the overlapping check precision can be improved with having a similar effect to the above-described mark.

Third Embodiment

A description will now be made of forming a fuse in the semiconductor device shown in the embodiment 1, and of laser-blowing this fuse when this semiconductor device is manufactured by employing the conventional method.

Figure 11A:
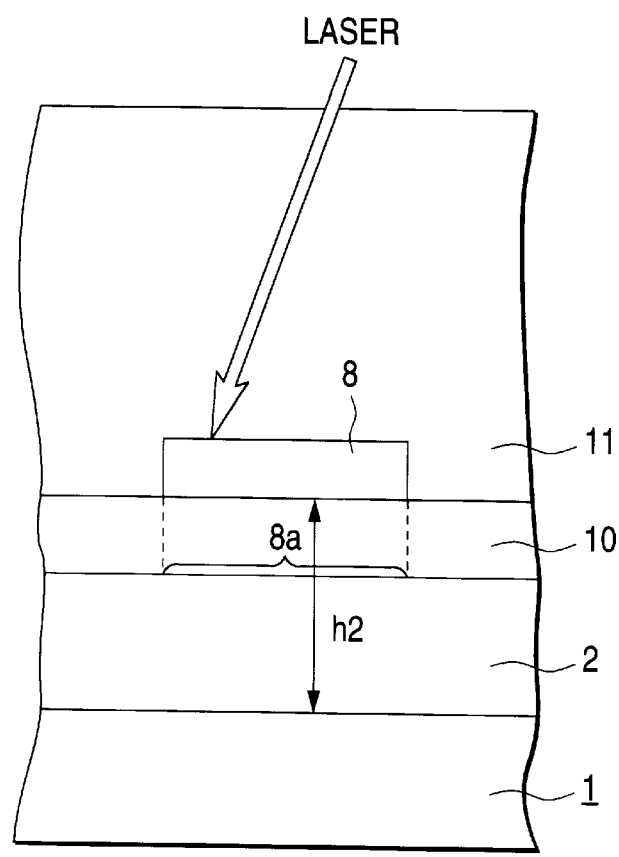
FIGS. 11A and 11B are sectional views for indicating the conventional fuse laser blowing step.
Figure 11B:
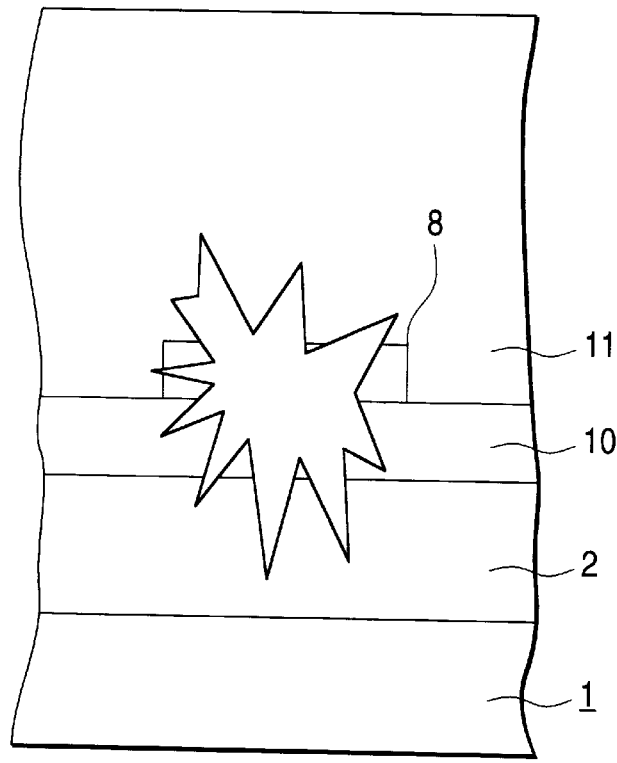

In this case, FIG. 11A is a sectional view for representing the fuse manufactured by the conventional method and an adjoining region of this fuse in the laser blow step. FIG. 11B is a sectional view for showing a step after the above-explained fuse is broken out by the laser blow.

When the above-described conventional method is employed, for instance, in the same manufacturing step as that of the $SiO_2$ film 14 of the embodiment 1 shown in FIGS. 6A and 6B, an $SiO_2$ film 10 similar to the above-explained $SiO_2$ film 14 is first formed on a region 8a where a fuse 8 is formed on the upper layer of the element isolating film 2, and is formed on an adjoining region thereof. Next, in the same forming step as that of the ground wiring line 13 indicated in FIGS. 6A and 6B, the fuse 8 is also formed on the region 8a and the adjoining region thereof by continuously depositing a metal silicide film such as a phosphorus doped polycrystal silicon film and a tungsten silicide ($WSi_2$) film, which constitute the ground wiring line 13, and then by etching away the deposited metal silicide film.

Subsequently, in a step shown in FIG. 11A after the fuse 8 has been fabricated, laser is externally irradiated through a protection film 11 such as an $SiO_2$ film (for example, $SiO_2$ films 15, 16, 18 etc.) formed on this fuse 8, so that the fuse 8 is blown out by irradiating the laser.

Figure 14A:
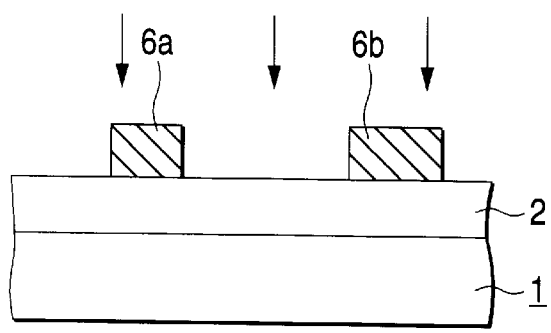
FIGS. 14A to 14D show sectional views, taken along a line B—B, a line C—C, a line D—D, and a line E—E of the CMOS semiconductor device shown in FIGS. 13A and 13B.
Figure 14B:
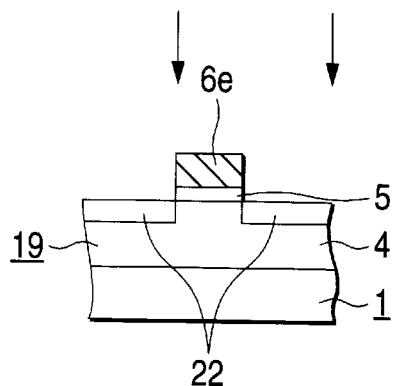
Figure 14C:
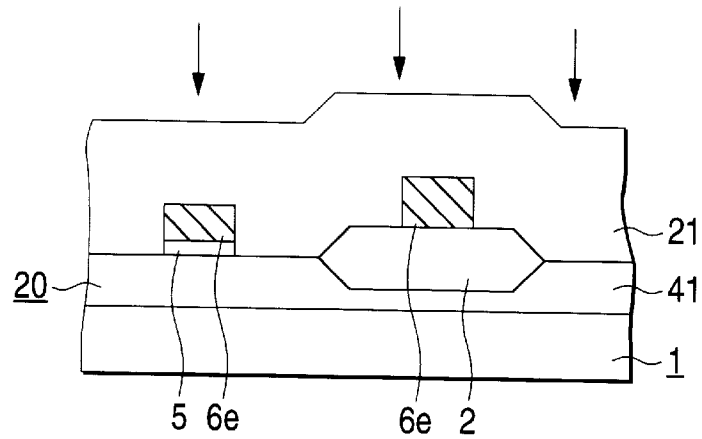
Figure 14D:
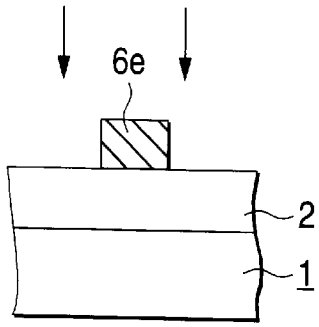
Figure 15A:
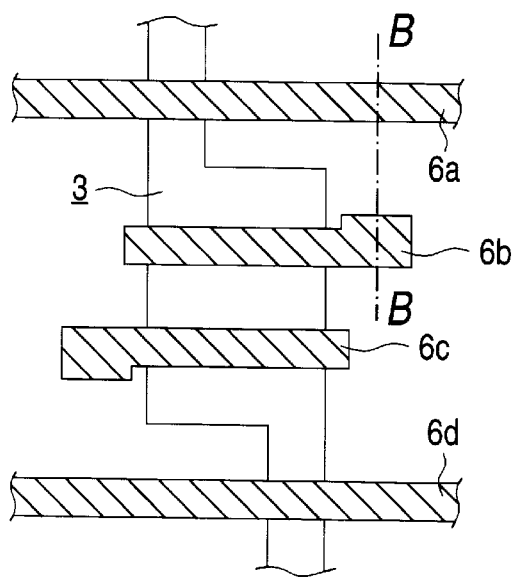
FIGS. 15A and 15B are plan views for representing a concrete example when the embodiment 1 is applied to a method for manufacturing a CMOS semiconductor device in a manufacturing step.
Figure 15B:
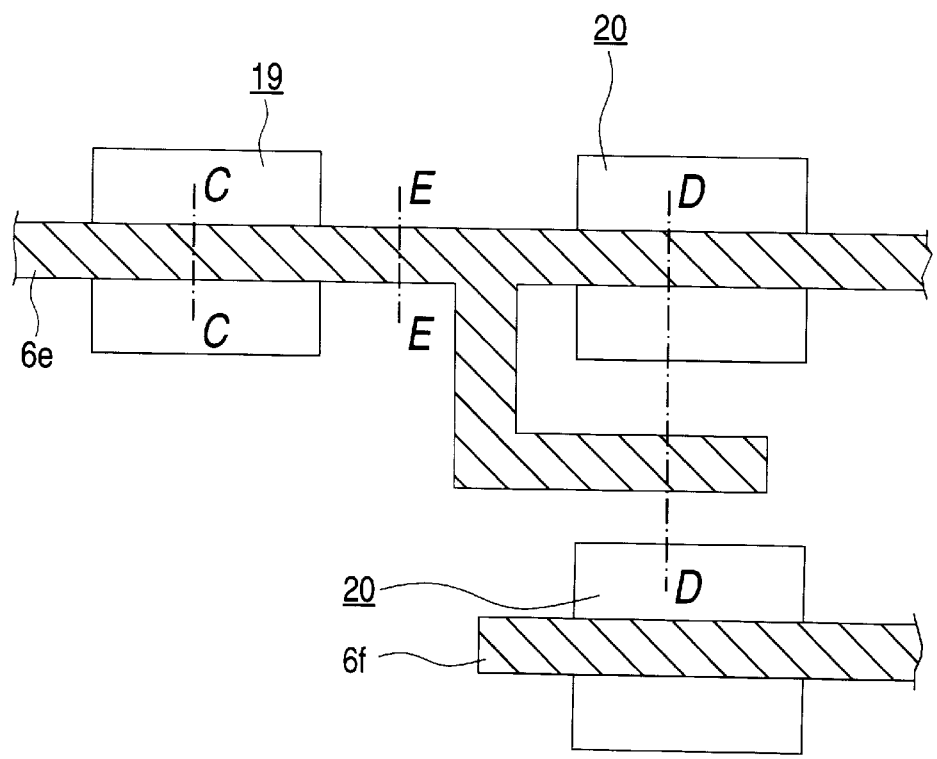
Figure 16A:
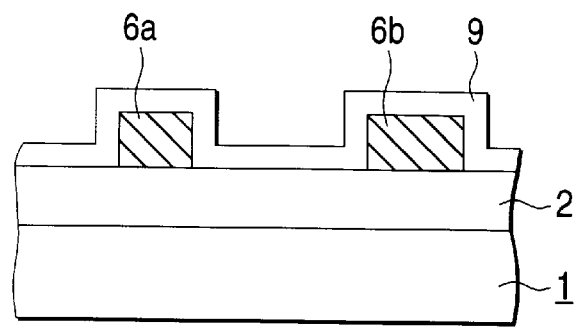
FIGS. 16A to 16D show sectional views, taken along a line B—B, a line C—C, a line D—D, and a line E—E of the CMOS semiconductor device shown in FIGS. 15A and 15B.
Figure 16B:
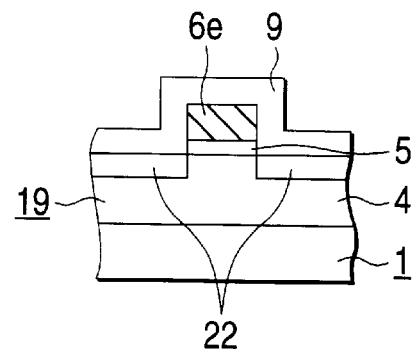
Figure 16C:
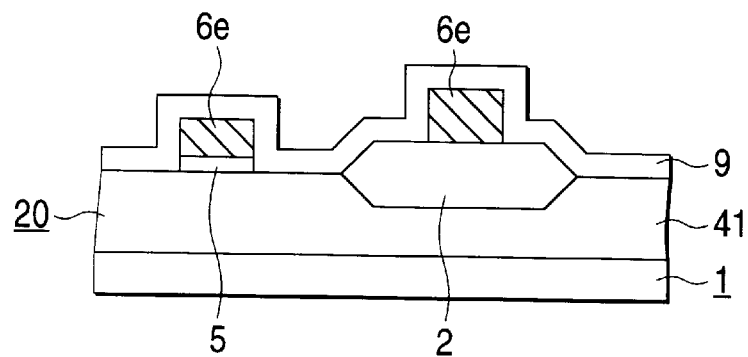
Figure 16D:
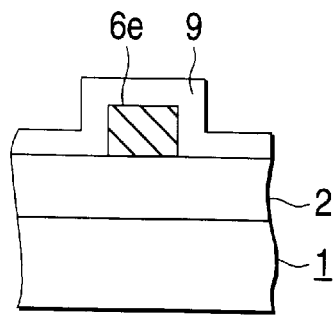

In such a case that the above-explained conventional method is employed, the $SiO_2$ film 9 deposited in the step of the embodiment 1 shown in FIGS. 14A and 14B would be removed in the etching step by way of the RIE method shown in FIGS. 15A and 15B over the region 8a where the fuse 8 is formed on the upper layer of the element isolating film 2. As a consequence, as represented in FIG. 11B, a distance "h2" between the fuse 8 and the semiconductor substrate 1 becomes a close condition. Thus, there are certain possibilities that damages caused by the laser blowing operation are given also to the semiconductor substrate 1.

Accordingly, a description will now be made of an embodiment 3 according to the present invention, which can solve the above-described problem caused in the laser blow step for the fuse formed by employing the conventional method.

Figure 12A:
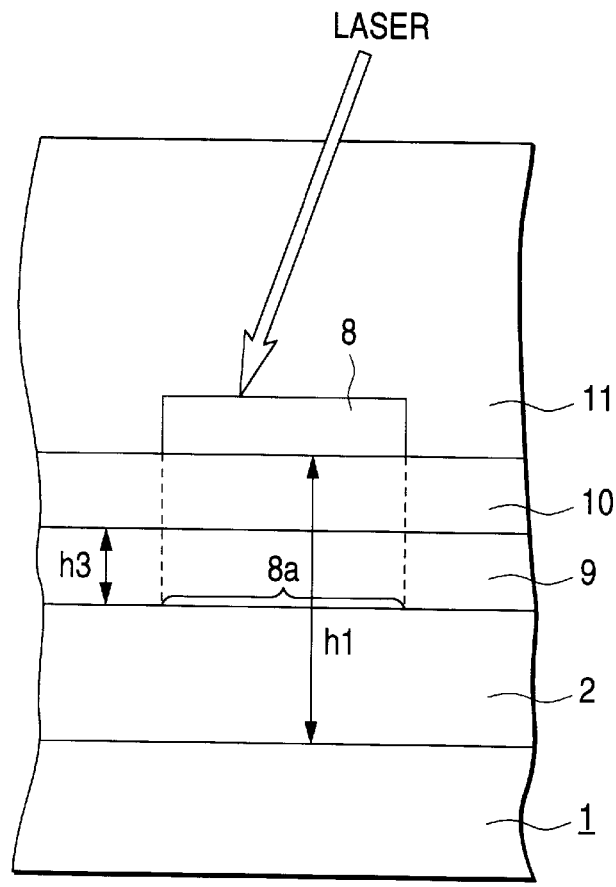
FIGS. 12A and 12B are sectional views for showing a fuse laser blowing step according to an embodiment 3 of the present invention.
Figure 12B:
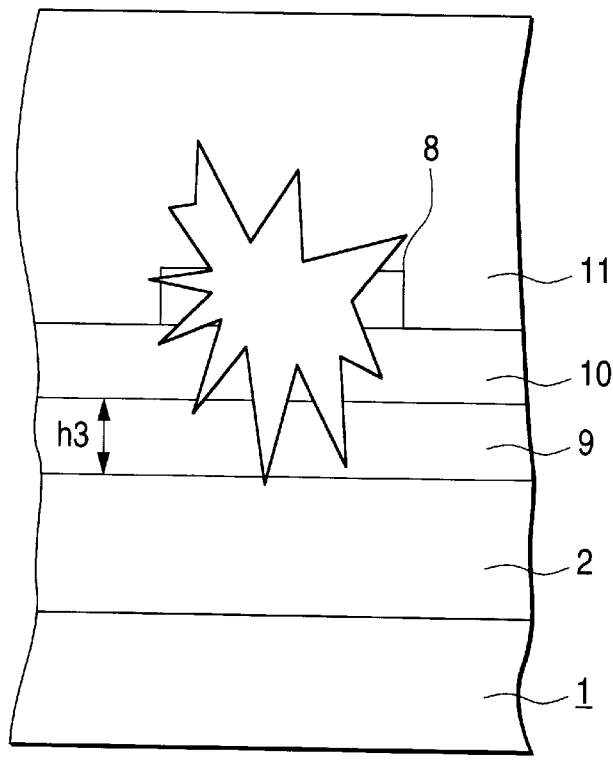

In this case, FIG. 12A is a sectional view for representing a fuse manufactured by the embodiment 3 of the present invention and an adjoining region of this fuse in the laser below step FIG. 12B is a sectional view for showing a step after the above-explained fuse is broken out by the laser blow.

In accordance with the embodiment 3 of the present invention, for instance, in the same manufacturing step as that of the $SiO_2$ film 9 of the embodiment 1 shown in FIGS. 4A and 4B, the above-explained $SiO_2$ film 9 is first formed on the entire surface of the semiconductor substrate 1. Also, in the same manufacturing step as that of the photoresists 81 and 82, a resist mask made of the photoresist is formed on a region 8a where the fuse 8 is formed on the upper layer of the element isolating film 2, and on an adjoining region thereof. Next, in the same manufacturing step as the RIE step of the embodiment 1 shown in FIGS. 5A and 5b, the $SiO_2$ film 9 is left on the region 8a and the adjoining region thereof by way of the above-described resist mask.

Subsequently, in the same manufacturing step as that of the $SiO_2$ film 14 of the embodiment 1 shown in FIGS. 6A and 6B, an $SiO_2$ film 10 similar to the above-explained $SiO_2$ film 14 is formed on this region 8a where the fuse 8 is formed on the upper layer of the element isolating film 2, and is formed on the adjoining region thereof. Next, in the same forming step as that of the ground wiring line 13 indicated in FIGS. 6A and 6B, the fuse 8 is also formed on the region 8a and the adjoining region thereof by continuously depositing a metal silicide film such as a phosphorus doped polycrystal silicon film and a tungsten silicide ($WSi_2$) film, which constitute the ground wiring line 13, and then by etching away the deposited metal silicide film.

Subsequently, in a step shown in FIG. 12A after the fuse 8 has been fabricated, laser is externally irradiated through a protection film 11 such as an $SiO_2$ film (for example, $SiO_2$ films 15, 16, 18 etc.) formed on this fuse 8, so that the fuse 8 is blown out by irradiating the laser.

As a consequence, in this embodiment 3, the $SiO_2$ film 9 deposited in the step of the embodiment 1 shown in FIGS. 4A and 4B is lifted on the region 8a and the adjoining region thereof by way of the resist mask in the etching stage by the RIE method shown in FIGS. 5A and 5B. Therefore, since a distance "h1" between the fuse 8 and the semiconductor substrate 1 becomes far from the distance "h2" in the conventional case only by a thickness "h3" of the $SiO_2$ film 9, as represented in FIG. 12B, there is such a merit that the damages given to this semiconductor substrate 1 can be prevented, as compared with the conventional case shown in FIG. 11B. As a consequence, reliability of this semiconductor device can be increased.

Fourth Embodiment

Referring now to FIG. 13A to FIG. 22D, a description will be made of one concrete example about such a case that the embodiment 1 of the present invention has been applied to a method for manufacturing a CMOS (complementary metal oxide semiconductor) semiconductor device, which is different from an embodiment 4 of the present invention.

In this case, FIGS. 13A and 13B, FIGS. 15A and 15B, FIGS. 17A and 17B, FIGS. 19A and 19B, and FIGS. 21A and 21B are plan views for representing the above-described concrete example in the manufacturing sequence. More specifically, FIG. 13A, FIG. 15A, FIG. 17A, FIG. 19A, and FIG. 21A show an NMOS region of a memory cell in each of the manufacturing steps. Also, FIG. 13B, FIG. 15B, FIG. 17B, FIG. 19B, and FIG. 21B indicate an NMOS region and a PMOS region of a peripheral circuit in each of the manufacturing steps.

FIGS. 14A to 14D, FIGS. 16A to 16D, FIGS. 18A to 18D, FIGS. 20A to 20D, and FIGS. 22A to 22D are sectional views along lines at the respective positions corresponding to those of FIGS. 13A and 13B, FIGS. 15A and 15B, FIGS. 17A and 17B, FIGS. 19A and 19B, and FIGS. 21A and 21B. In particular, FIG. 14A, FIG. 16A, FIG. 18A, FIG. 20A, and FIG. 22A are sectional views, taken along a line B—B of each of FIG. 13A, FIG. 15A, FIG. 17A, FIG. 19A, and FIG. 21A. FIG. 14B, FIG. 16B, FIG. 18B, FIG. 20B, and FIG. 22B are sectional views, taken along a line C—C of each of FIG. 13B, FIG. 15B, FIG. 17B, FIG. 10B, and FIG. 21B. FIG. 14C, FIG. 16C, FIG. 18C, FIG. 20C, and FIG. 22C are sectional views, taken along a line D—D of each of FIG. 13B, FIG. 15B, FIG. 17B, FIG. 10B, and FIG. 21B. Further, FIG. 14D, FIG. 16D, FIG. 18D, FIG. 20D, and FIG. 22D are sectional views, taken along a line E—E of each of FIG. 13B, FIG. 15B, FIG. 17B, FIG. 10B, and FIG. 21B.

First, similar to the manufacturing step shown in FIG. 3A and FIG. 3B of the embodiment 1, as indicated in FIG. 13 and FIG. 14, a field insulating film 2 functioning as an element isolating film made of $SiO_2$ having a thickness of approximately 3000 Å is formed on an N⁻type silicon substrate 1 corresponding to a semiconductor substrate by employing the selective thermal oxidation method (for instance, local oxidation of silicon: LOCOS). In this selective thermal oxidation method, for example, while a silicon oxide ($SiO_2$) film is used as a pad film, a silicon nitride ($Si_3N_4$) film deposited on this pad film is used as an anti-oxidation mask.

Thereafter, both the pad $SiO_2$ film and the $Si_3N_4$ film are removed which are employed during the above-described selective thermal oxidation, so that the PMOS region 20 and the NMOS region 19 of the peripheral circuit, and the NMOS region 3 of the memory cell are exposed from a surface of the semiconductor substrate 1.

Then, while the PMOS region 20 of the peripheral circuit is covered with a resist, a P type impurity such as a boron (B) is implanted into the entire major surface of the N⁻type silicon substrate 1, so that a P⁻type well region 4 is formed in the NMOS region 19 of the peripheral circuit and the NMOS region 3 of the memory cell. Furthermore, while both the NMOS region 19 of this peripheral circuit and the NMOS region 3 of the memory cell are covered with a resist, an N type impurity such as phosphorus (P) is implanted into the entire major surface of the N⁻type silicon substrate 1, so that an N⁻type well region 41 is formed in the PMOS region 20 of the peripheral circuit.

Then, a gate insulating film 5 made of $SiO_2$ having a thickness of, for example, about 70 Å is formed on the entire surface by way of, for example, the thermal oxidation. With employment of the LPCVD (low pressure chemical vapor deposition) method, gas such as phosphine ($PH_3$) is mixed, so that a phosphorus doped polycrystal silicon film having a thickness of approximately 1000 Å is deposited with phosphorus density of approximately 1.0 to $8.0 \times 10^{20}$ $cm^{-3}$.

Then, the photoresist is patterned into a predetermined shape by employing the photolithography, and while using this patterned photoresist as a mask, for instance, the reactive ion etching (RIE) method is applied so as to pattern the above-described phosphorus doped polycrystal silicon film, so that word lines 6a, 6d corresponding to gate electrodes of access transistors T1, T2, gate electrodes 6b, 6c of driver transistors T3, T4, and 6e, 6f functioning as gate electrodes and corresponding to wiring lines formed in the peripheral circuit are formed.

It should be noted that although the gate electrodes 6a to 6f are formed only by the phosphorus doped polycrystal silicon film in this concrete example, these components may be made by employing, for instance, a so-called polysilicide wiring pattern made of a metal silicide such as a tungsten silicide ($WSi_2$) film, and the phosphorus doped polycrystal silicon film.

Next, after the PMOS region 20 of the peripheral circuit is covered by a resist mask made of a photoresist, for example, arsenic (As) is implanted into the NMOS region 19 of the peripheral circuit and the NMOS region 3 of the memory cell through the gate insulating film 5 while rotating a wafer under such a condition that the dosing energy is selected to be approximately 30 to 70 KeV, the implanting angle is 45 degrees, and the dose amount is from approximately 1.0 to $5.0 \times 10^{13}$ $cm^{-2}$, and thus an N⁻type source to drain region 22 is formed in such an NMOS region 19 other than such regions shielded by the gate electrode 6e of the driver transistor. Also, N⁻type source-to-drain regions 71 to 75 are formed in such an NMOS region 3 other than the regions shielded by the gate electrodes 6a to 6d. In this case, the N⁻type source/drain regions 22 and 71 to 75 contain impurity concentration of on the order of $10^{17}$ to $10^{19}$ $cm^{-3}$.

Figure 13A:
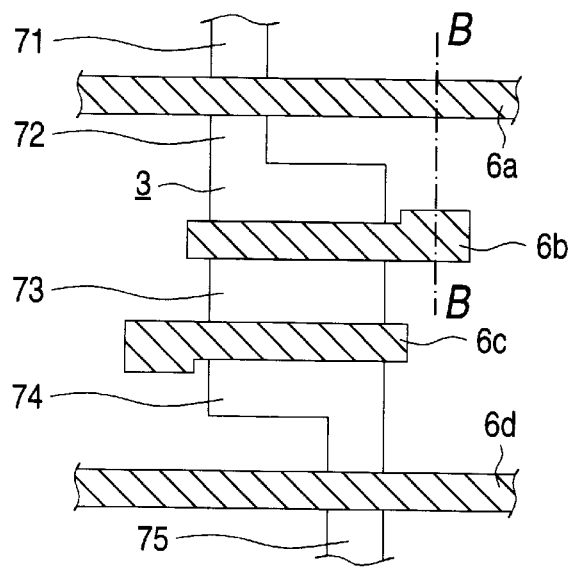
FIGS. 13A and 13B are plan views for representing a concrete example when the embodiment 1 is applied to a method for manufacturing a CMOS semiconductor device in a manufacturing step.
Figure 13B:
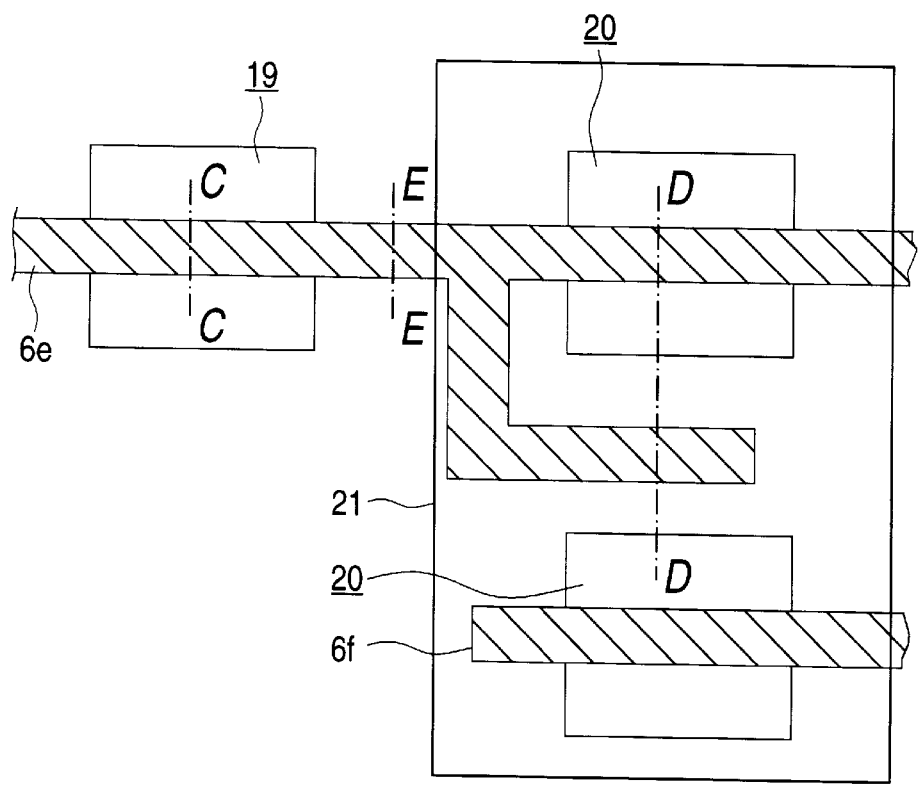

It should be noted that in FIG. 13B, in order to clarify a positional relationship between the resist mask 21 and the PMOS region 20, an under layer of the resist mask 21 is indicated.

Subsequently, as shown in FIGS. 15A and 15B and FIGS. 16A to 16D, the resist mask 21 is removed, and an $SiO_2$ film 9 having a thickness of approximately 500 to 1500 Å is deposited on the entire major surface of the semiconductor substrate 1 by using the LPCVD method. It should also be noted since the $SiO_2$ film 9 is deposited on the entire surface of the semiconductor substrate 1 in FIGS. 15A and 15B, the indication of this $SiO_2$ film 9 is omitted, and an under layer of this film 9 is displayed instead thereof.

Subsequently, as shown in FIGS. 17A and 17B and FIGS. 18A to 18D, resist masks 81, 82, and 27 are formed on the $SiO_2$ film 9 by patterning the photoresist into a predetermined shape. In this case, the resist masks 81 and 82 are formed in such a manner that these resist masks are positioned along the gate electrodes 6a and 6d, and moreover partially cover the gate electrodes 6a and 6d, whereas the resist mask 27 is formed in such a manner that this resist mask 27 covers the entire surface of the PMOS region 20 of the peripheral circuit.

Figure 17A:
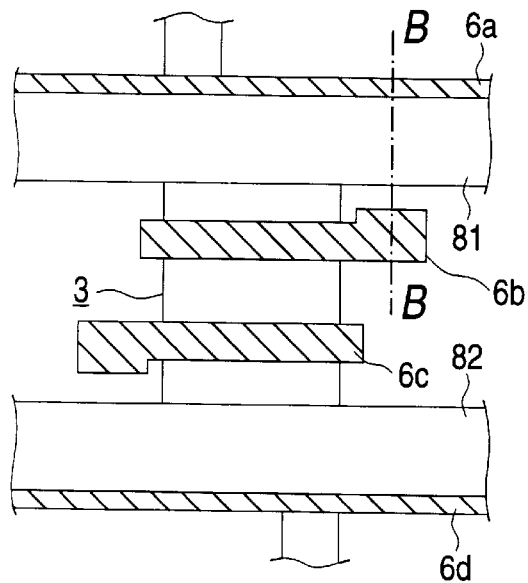
FIGS. 17A and 17B are plan views for representing a concrete example when the embodiment 1 is applied to a method for manufacturing a CMOS semiconductor device in a manufacturing step.
Figure 17B:
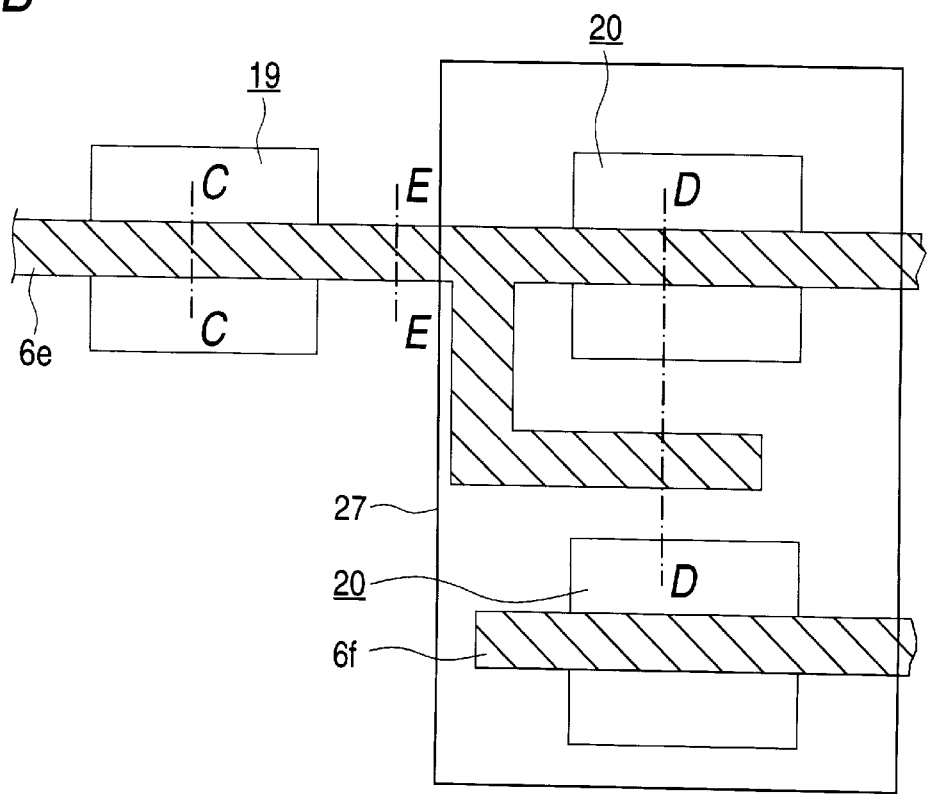
Figure 18A:
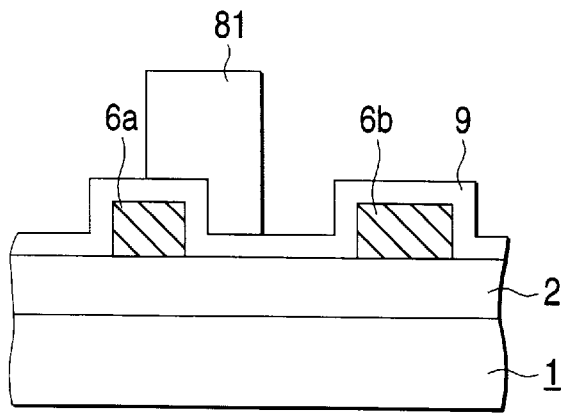
FIGS. 18A to 18D show sectional views, taken along a line B—B, a line C—C, a line D—D, and a line E—E of the CMOS semiconductor device shown in FIGS. 17A and 17B.
Figure 18B:
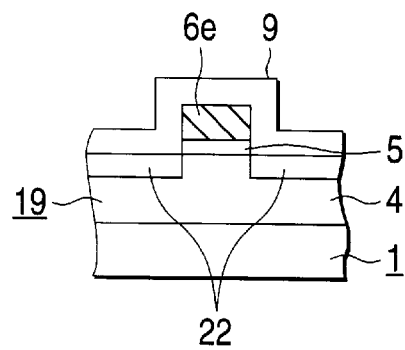
Figure 18C:
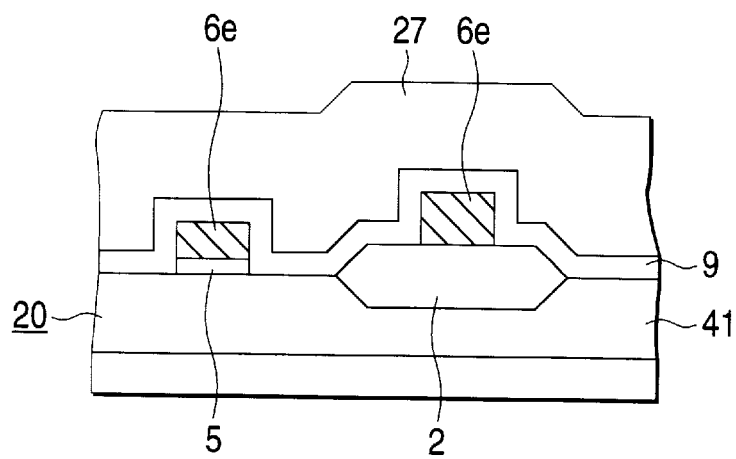
Figure 18D:
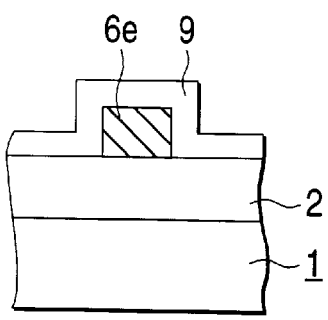

It should also be noted that in FIGS. 17A and 17B, in order to clearly display a positional relationship between the photoresists 81, 82 and the word lines 6a, 6d corresponding to the gate electrodes of the access transistors, and another positional relationship between the PMOS region 20 of the peripheral circuit and the resist mask 27, no indication is made of the $SiO_2$ film 9 and an under layer thereof is indicated. Further, an under layer of the resist mask 27 is displayed.

Next, as illustrated in FIGS. 19A and 19B and FIGS. 20A to 20D, side walls 91 to 94, 97, 98 having widths of on the order of 500 to 1500Å, and the insulating films 9a, 9d which are shield by the resist masks 81 and 82 to be left are formed by employing the RIE method with using the above-described resist masks 81 and 82.

Figure 20A:
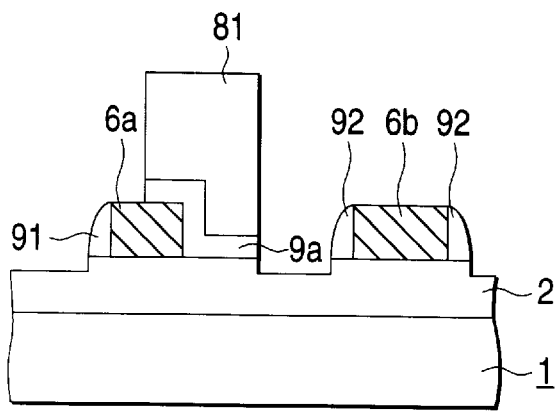
FIGS. 20A to 20D show sectional views, taken along a line B—B, a line C—C, a line D—D, and a line E—E of the CMOS semiconductor device shown in FIGS. 19A and 19B.
Figure 20B:
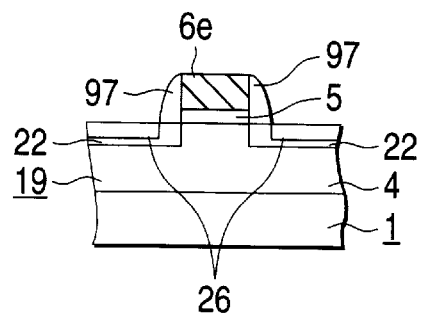
Figure 20C:
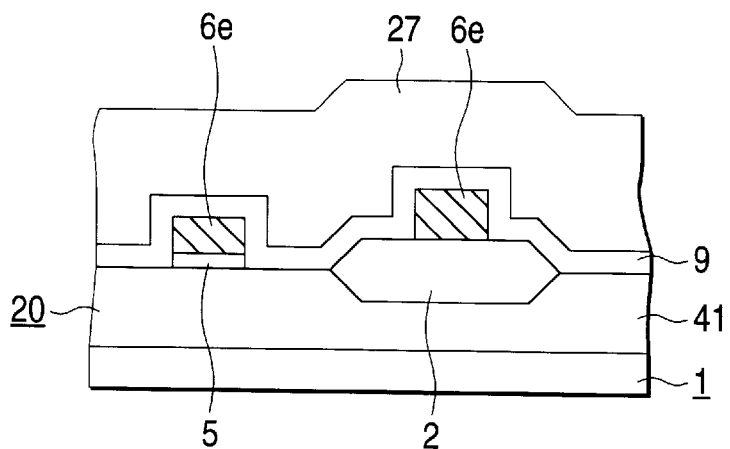
Figure 20D:
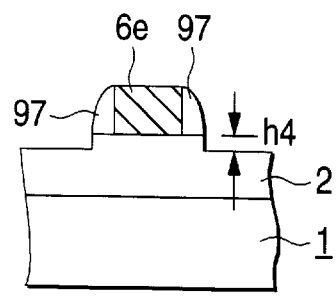
Figure 21A:
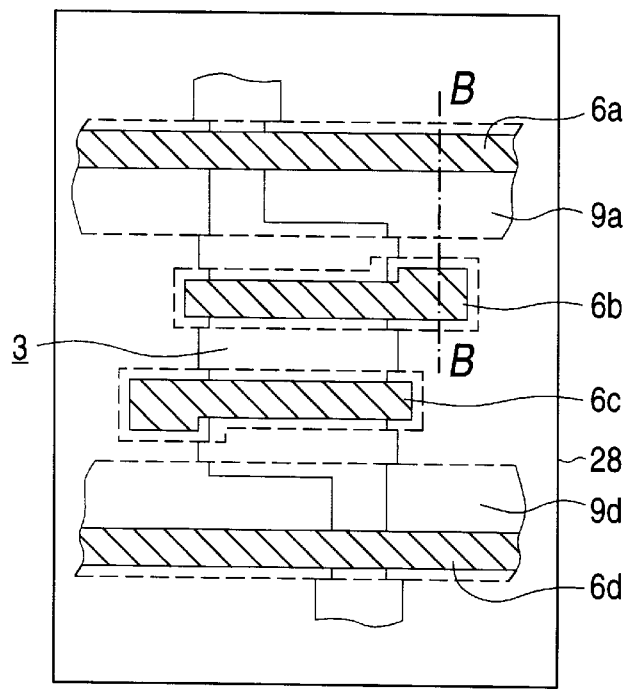
FIGS. 21A and 21B are plan views for representing a concrete example when the embodiment 1 is applied to a method for manufacturing a CMOS semiconductor device in a manufacturing step.
Figure 21B:
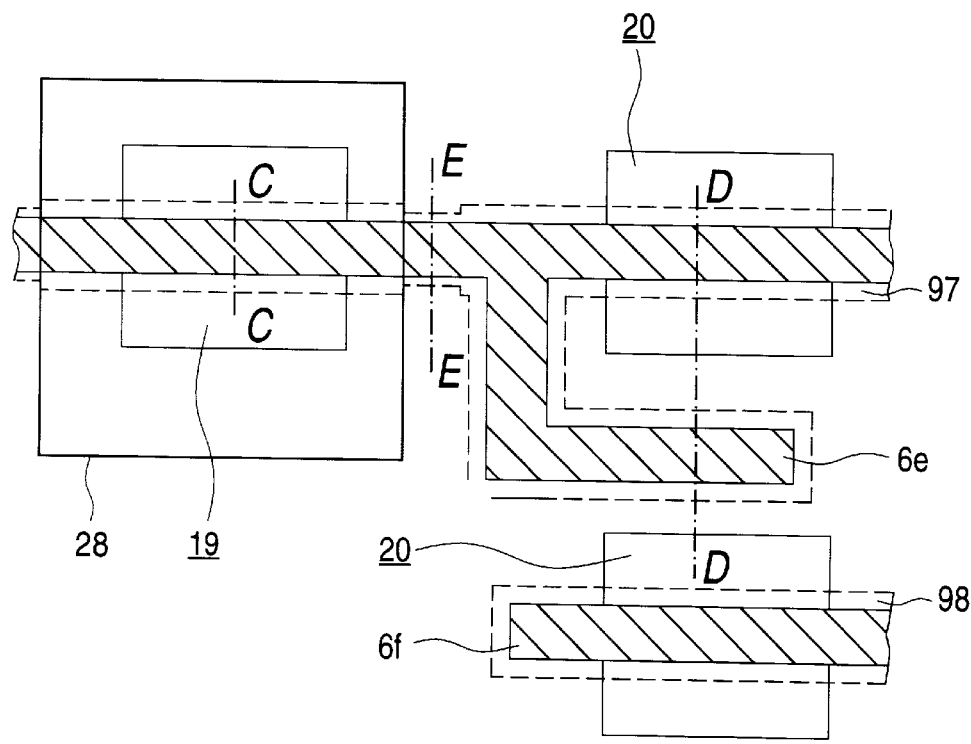

At this time, for instance, as shown in FIG. 20D, the field insulating film 2 is planed by a dimension equal to a thickness of "h4" at the same time by the over-etching process executed during the RIE method.

Next, while using the resist masks 81, 82, 27 and these side wall oxide films 91 to 94, 97 as a mask, for instance, arsenic (As) is implanted at 50 KeV with the dose amount of approximately 1.0 to $5.0 \times 10^{15}$ $cm^{-2}$ to form N⁺type source/drain regions 111 to 115 in the NMOS region 3 of the memory cell, and further to form N⁺type source/drain region 26 in the NMOS region of the peripheral circuit. At this case, for example, either arsenic (As) or phosphorus (P) may be additionally implanted at approximately 30 to 70 KeV at an implanting angle of 45 degrees into the overall surface with the dose amount of approximately 1.0 to $5.0 \times 10^{13}$ $cm^{-2}$, while rotating the wafer.

In this case, the N⁺type source/drain regions 111 to 115 and 26 contain impurity concentration of on the order of $10^{20}$ to $10^{2}$ $cm^{-3}$, and forms a so-called "LDD (lightly doped drain)" structure for relaxing an electric field near the drain by the N⁻type source/drain regions 71 to 75, 22 and the N⁺type source/drain regions 111 to 115, 26.

Figure 19A:
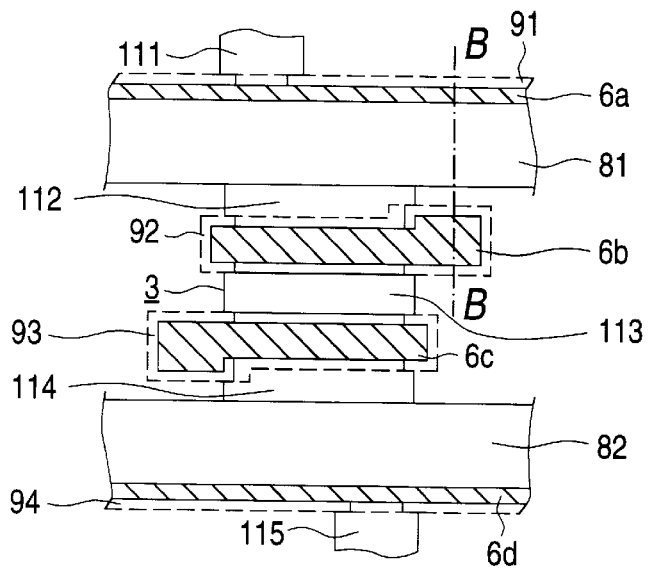
FIGS. 19A and 19B are plan views for representing a concrete example when the embodiment 1 is applied to a method for manufacturing a CMOS semiconductor device in a manufacturing step.
Figure 19B:
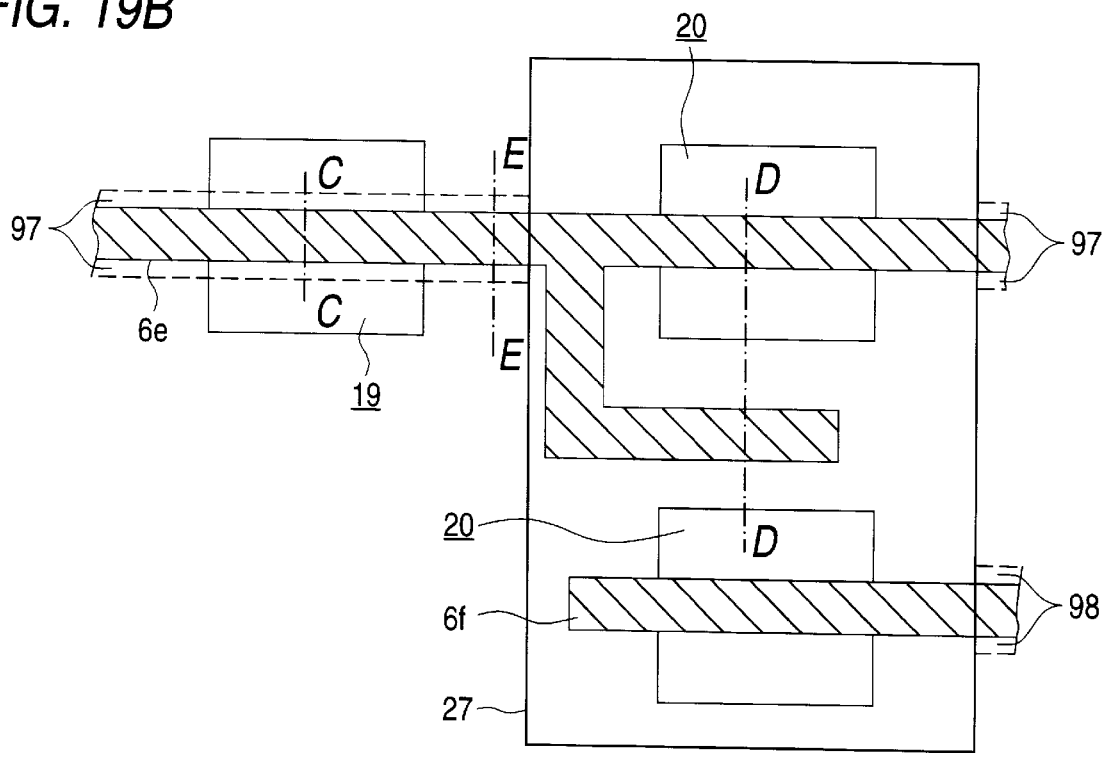

It should be understood that in FIGS. 19A and 19B, in order to clarify a positional relationship between the PMOS region 20 of the peripheral circuit and the resist mask 27, an under layer of the resist mask 27 is indicated.

Subsequently, as shown in FIGS. 21A and 21B and FIGS. 22A to 22D, the above-described resist masks 81, 82, and 27 are removed. The overall surfaces of the NMOS region 3 of the memory cell and of the NMOS region 19 of the peripheral circuit are covered with the resist mask 28 made of the photoresist. Thereafter, the remaining $SiO_2$ film 9 covered with the resist mask 27 is etched away by way of the RIE method with employment of the resist mask 28, so that side wall oxide films 97 and 92 having widths of on the order of 500 to 1500 Å are formed on the side walls of the gate electrodes 6e and 6f of the PMOS region 20 of the peripheral circuit.

Thereafter, for instance, $BF_2$ is implanted into the overall surface of the PMOS region 20 of the peripheral circuit at the implanting energy of approximately 20 to 40 KeV and in a dose amount of approximately 1.0 to $5.0 \times 10^{15}$ cm$^{-2}$, so that a P$^+$type source/drain region 24 is formed. In this case, the P$^+$type source/drain region 24 contains impurity concentration of on the order of $10^{20}$ to $10^{21}$ cm$^{-3}$.

Figure 22A:
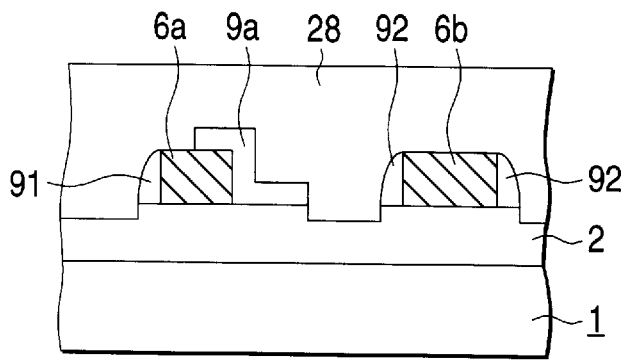
FIGS. 22A to 22D show sectional views, taken along a line B—B, a line C—C, a line D—D, and a line E—E of the CMOS semiconductor device shown in FIGS. 21A and 21B.
Figure 22B:
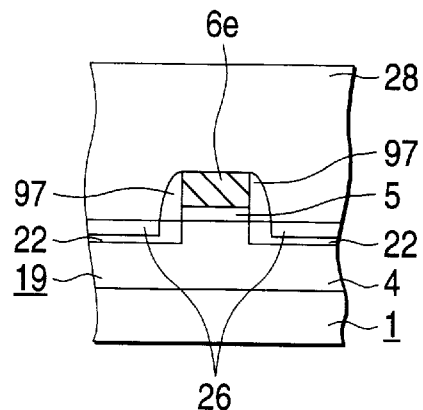
Figure 22C:
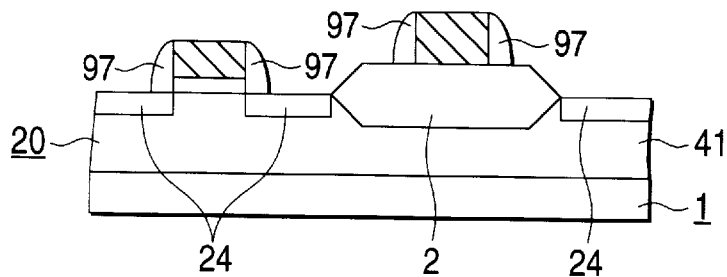
Figure 22D:
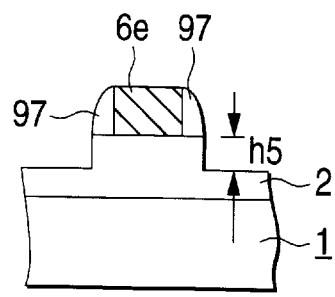

At this time, the field insulating film 2 is also plated by the over-etching process by the RIE method in addition to the etching process by the RIE method as shown in FIGS. 19A and 19B, at the same time. As illustrated in FIG. 22D, for instance, in a sectional view along a line E—E for indicating a boundary region between the NMOS region 19 and the PMOS region 20, this field insulating film 2 is plated up to a thickness of "h5". It should also be noted that in FIG. 21A and 21B, in order to clearly indicate a positional relationship between the NMOS region 19 of the peripheral circuit, the NMOS region 3 of the memory cell, and the resist mask 28, an under layer of the resist mask 28 is indicated.

As previously explained, in accordance with one concrete example, as shown in FIG. 22D, the field insulating film 2 located near the boundary region between the NMOS region 19 and the PMOS region 20 in the peripheral region is again over-etched when the RIE method is executed. As a result, this field insulating film 2 is eventually plated up to the dimension equal to the thickness of "h5". As a consequence, the field insulating film 2 would become very thin, so that for example, boron which is implanted while forming the above-explained P$^+$type source/drain region 24 is mixed into the substrate 1. Thus, the isolation withstanding voltage would be lowered, and the threshold voltage "Vth" of the field transistor would be lowered where the wiring line formed on the upper layer of the field insulating film 2 is used as the stray gate electrode. Accordingly, the isolation capability would be deteriorated. Since the stepped portion formed by the etching process in the field insulating film 2 becomes large, the wiring lines on the upper layer, for example, the bit lines can be hardly patterned.

Therefore, in order to solve the above-described problems of one concrete example, referring now to FIGS. 23A to FIG. 30D, a description will be made of an embodiment 4 accomplished by that the embodiment 1 of the present invention has been applied to a method for manufacturing a CMOS (complementary metal oxide semiconductor) semiconductor device.

In this case, FIGS. 23A and 23B, FIGS. 25A and 25B, FIGS. 27A and 27B, and FIGS. 29A and 29B are plan views for representing the above-described embodiment 4 of the present invention in the manufacturing sequence. More specifically, FIG. 23A, FIG. 25A, FIG. 27A, and FIG. 29A show an NMOS region of a memory cell in each of the manufacturing steps. Also, FIG. 23B, FIG. 25B, FIG. 27B, and FIG. 29B indicate an NMOS region and a PMOS region of a peripheral circuit in each of the manufacturing steps.

FIGS. 24A to 24D, FIGS. 26A to 26D, FIGS. 28A to 28D, and FIGS. 30A to 30D are sectional views along lines at the respective positions corresponding to those of FIGS. 23A and 23B, FIGS. 25A and 25B, FIGS. 27A and 27B, and FIGS. 29A and 29B. In particular, FIG. 24A, FIG. 26A, FIG. 28A, and FIG. 30A are sectional views, taken along a line B—B of each of FIG. 23A, FIG. 25A, FIG. 27A, and FIG. 29A. FIG. 24B, FIG. 26B, FIG. 28B, and FIG. 30B are sectional views, taken along a line C—C of each of FIG. 23B, FIG. 25B, FIG. 27B, and FIG. 29B. FIG. 24C, FIG. 26C, FIG. 28C, and FIG. 30C are sectional views, taken along a line D—D of each of FIG. 23B, FIG. 25B, FIG. 27B, and FIG. 29B. Further, FIG. 24D, FIG. 26D, FIG. 28D, and FIG. 30D are sectional views, taken along a line E—E of each of FIG. 23B, FIG. 25B, FIG. 27B, and FIG. 29B.

First, similar to the manufacturing step shown in FIG. 3A and FIG. 3B of the embodiment 1, as indicated in FIGS. 23A and 23B and FIGS. 24A to 24D, a field insulating film 2 functioning as an element isolating film made of $SiO_2$ having a thickness of approximately 3000 Å is formed on an N$^-$type silicon substrate 1 corresponding to a semiconductor substrate by employing the selective thermal oxidation method (for instance, local oxidation of silicon: LOCOS). In this selective thermal oxidation method, for example, while a silicon oxide ($SiO_2$) film is used as a pad film, a silicon nitride ($Si_3N_4$) film deposited on this pad film is used as an anti-oxidation mask.

Thereafter, both the pad $SiO_2$ film and the $Si_3N_4$ film are removed which are employed during the above-described selective thermal oxidation, so that the PMOS region 20 and the NMOS region 19 of the peripheral circuit, and the NMOS region 3 of the memory cell are exposed from a surface of the semiconductor substrate 1.

Then, while the PMOS region 20 of the peripheral circuit is covered with a resist, a P type impurity such as a boron (B) is implanted into the entire major surface of the N$^-$type silicon substrate 1, so that a P$^-$type well region 4 is formed in the NMOS region 19 of the peripheral circuit and the NMOS region 3 of the memory cell. Furthermore, while both the NMOS region 19 of this peripheral circuit and the NMOS region 3 of the memory cell are covered with a resist, an N type impurity such as phosphorus (P) is implanted into the entire major surface of the N$^-$type silicon substrate 1, so that an N$^-$type well region 41 is formed in the PMOS region 20 of the peripheral circuit.

Then, a gate insulating film 5 made of $SiO_2$ having a thickness of, for example, about 70 Å is formed on the entire surface by way of, for example, the thermal oxidation. With employment of the LPCVD (low pressure chemical vapor deposition) method, gas such as phosphine ($PH_3$) is mixed, so that a phosphorus doped polycrystal silicon film having a thickness of approximately 1000 Å is deposited with phosphorus density of approximately 1.0 to $8.0 \times 10^{20}$ cm$^{-3}$.

Then, the photoresist is patterned into a predetermined shape by employing the photolithography, and while using this patterned photoresist as a mask, for instance, the reactive ion etching (RIE) method is applied so as to pattern the above-described phosphorus doped polycrystal silicon film, so that word lines 6a, 6d corresponding to gate electrodes of access transistors T1, T2, gate electrodes 6b, 6c of driver transistors T3, T4, and 6e, 6f functioning as gate electrodes and corresponding to wiring lines formed in the peripheral circuit are formed.

It should be noted that although the gate electrodes 6a to 6f are formed only by the phosphorus doped polycrystal silicon film in this embodiment, these components may be made by employing, for instance, a so-called polysilicide wiring pattern made of a metal silicide such as a tungsten silicide ($WSi_2$) film, and the phosphorus doped polycrystal silicon film.

Next, after the PMOS region 20 of the peripheral circuit is covered by a resist mask made of a photoresist, for example, arsenic (As) is implanted into the NMOS region 19 of the peripheral circuit and the NMOS region 3 of the memory cell through the gate insulating film 5 while rotating a wafer under such a condition that the dosing energy is selected to be approximately 30 to 70 KeV, the implanting angle is 45 degrees, and the dose amount is from approximately 1.0 to $5.0 \times 10^{13}$ cm$^{-2}$, and thus an N⁻type source to drain region 22 is formed in such an NMOS region 19 other than such regions shielded by the gate electrode 6e of the driver transistor. Also, N⁻type source-to-drain regions 71 to 75 are formed in such an NMOS region 3 other than the regions shielded by the gate electrodes 6a to 6d. In this case, the N⁻type source/drain regions 22 and 71 to 75 contain impurity concentration of on the order of $10^{17}$ to $10^{19}$ cm$^{-3}$.

Figure 23A:
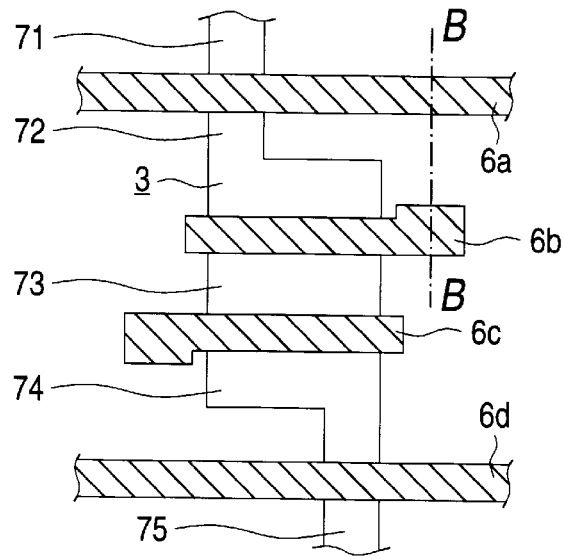
FIGS. 23A and 23B are plan views for indicating an embodiment 4 of the present invention in a manufacturing step.
Figure 23B:
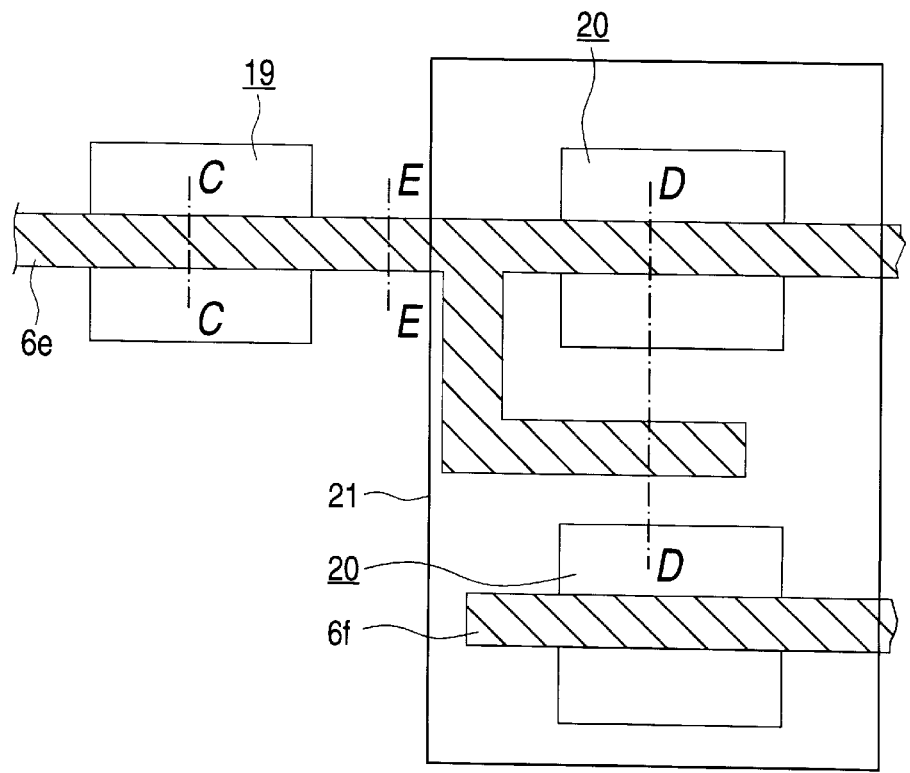
Figure 24A:
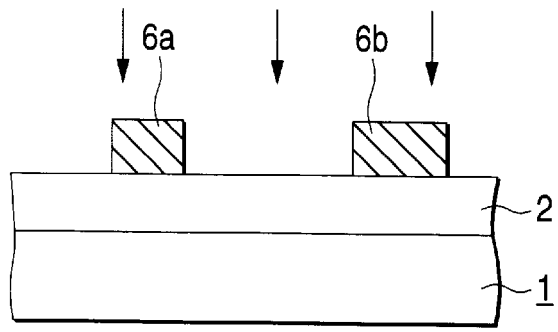
FIGS. 24A to 24D represent sectional views, taken along a line B—B, a line C—C, a line D—D, and a line E—E of FIGS. 23A and 23B.
Figure 24B:
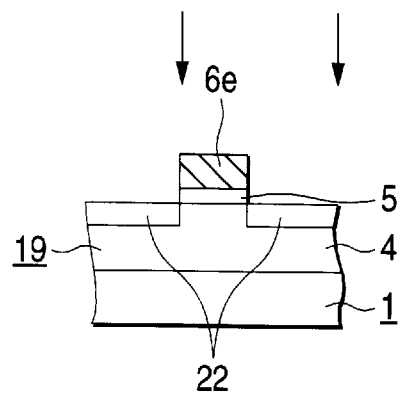
Figure 24C:
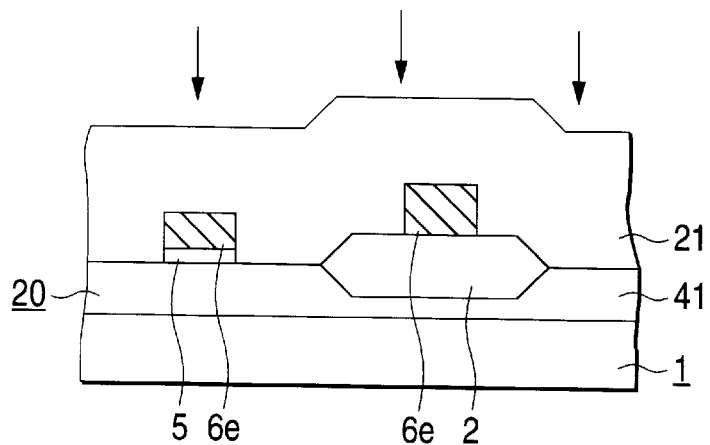
Figure 24D:
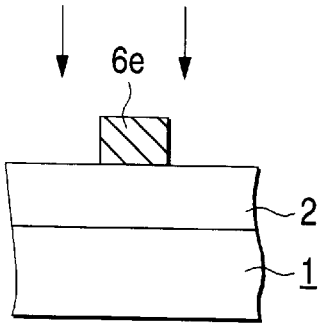

It should be noted that in FIG. 23B, in order to clarify a positional relationship between the resist mask 21 and the PMOS region 20, an under layer of the resist mask 21 is indicated.

Next, as indicated in FIGS. 25A and 25B and FIGS. 26A to 26D, the above-explained resist mask 21 is removed, and the entire surfaces of the NMOS regions 3 and 19 in the memory cell and the peripheral circuit are covered with the resist mask 23. Thereafter, for example, BF$_2$ is implanted into the entire surfaces at implantation energy of approximately 20 to 40 KeV at the dose amount of approximately $1.0 \times 5.0 \times 10^{15}$ cm$^{-2}$, so that a P⁺type source/drain region 24 is formed in the PMOS region 20 of the peripheral circuit. In this case, the P⁺type source/drain region 24 contains impurity concentration of on the order of $10^{20}$ to $10^{21}$ cm$^{-3}$.

Figure 25A:
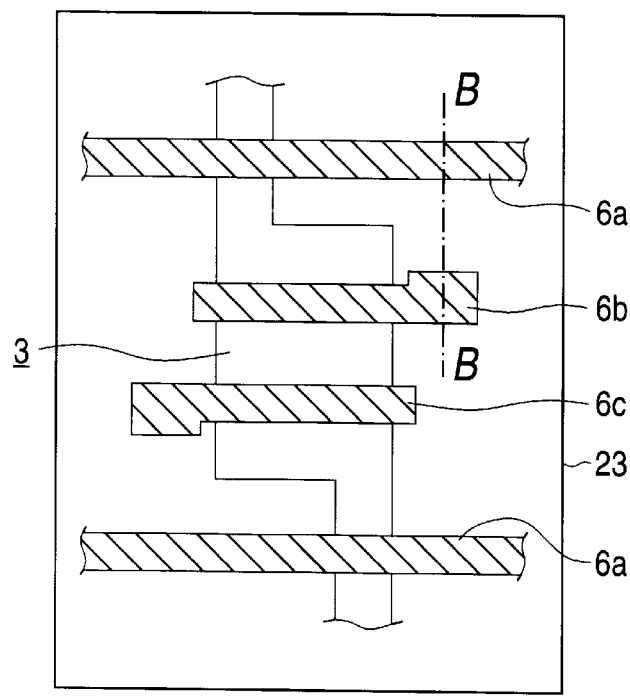
FIGS. 25A and 25B are plan views for indicating an embodiment 4 of the present invention in a manufacturing step.
Figure 25B:
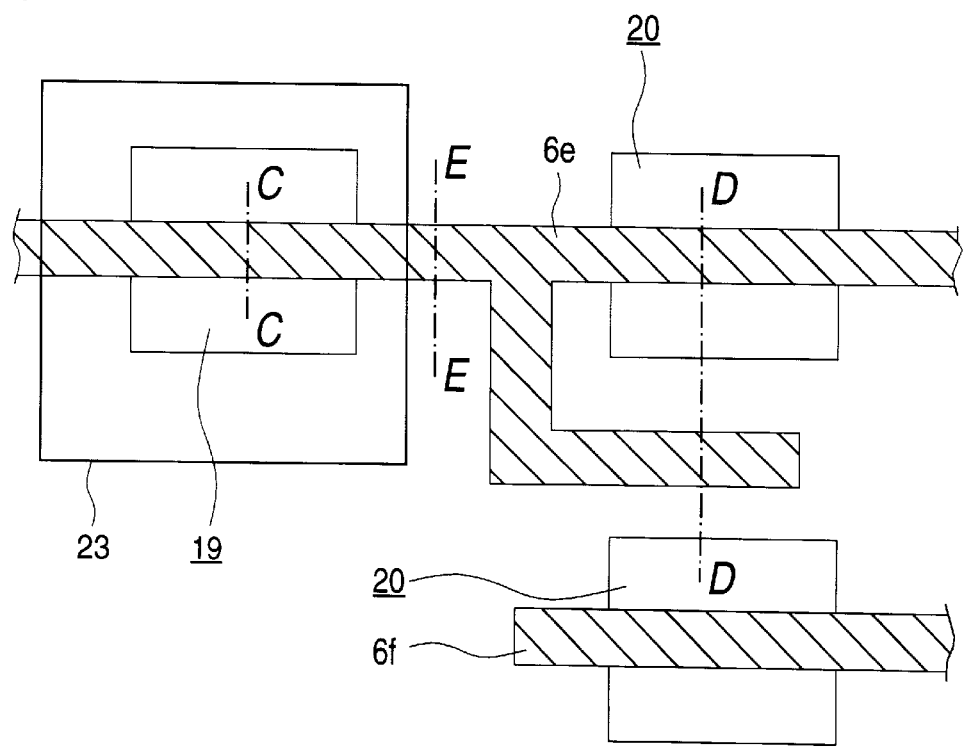
Figure 26A:
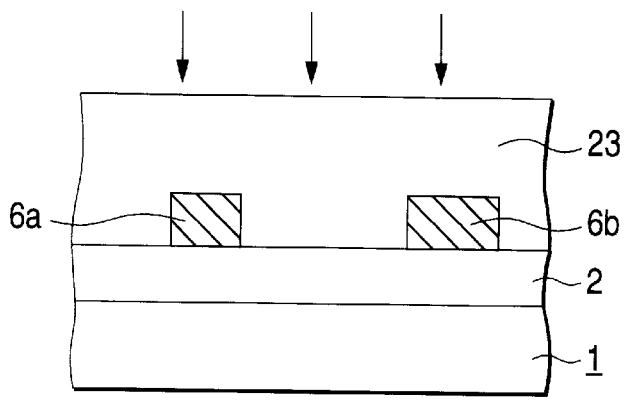
FIGS. 26A to 26D represent sectional views, taken along a line B—B, a line C—C, a line D—D, and a line E—E of FIGS. 25A and 25B.
Figure 26B:
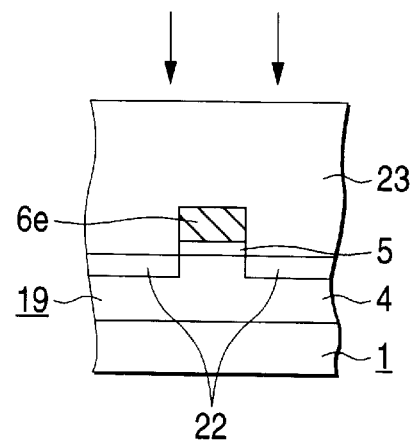
Figure 26C:
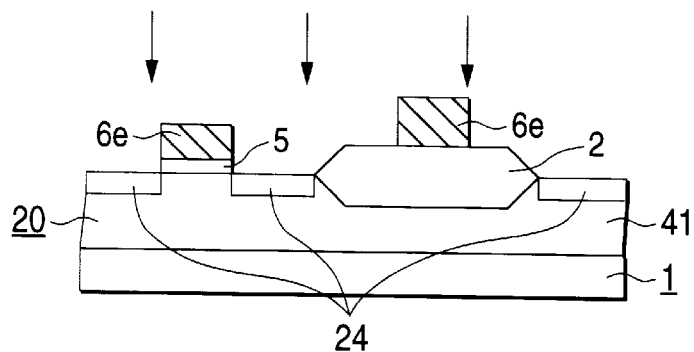
Figure 26D:
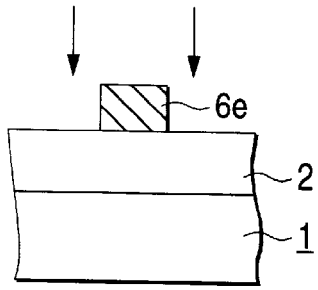

It should be understood that in this embodiment 4, in order to clarify a positional relationship between the NMOS regions 3 and 19 of the memory cell and the peripheral circuit, and the resist mask 23 in FIGS. 25A and 25B, an under layer of the resist mask 23 is indicated.

Subsequently, as shown in FIGS. 27A and 27B and FIGS. 28A to 28D, the resist mask 21 is removed, and an SiO$_2$ film 9 having a thickness of approximately 500 to 1500 Å is deposited on the entire major surface of the semiconductor substrate 1 by using the LPCVD method. Subsequently, resist masks 81, 82, and 25 are formed on the SiO$_2$ film 9 by patterning the photoresist into a predetermined shape. In this case, the resist masks 81 and 82 are formed in such a manner that these resist masks are positioned along the gate electrodes 6a and 6d, and moreover partially cover the gate electrodes 6a and 6d, whereas the resist mask 25 is formed in such a manner that this resist mask 25 covers the entire surface of the PMOS region 20 of the peripheral circuit.

Figure 27A:
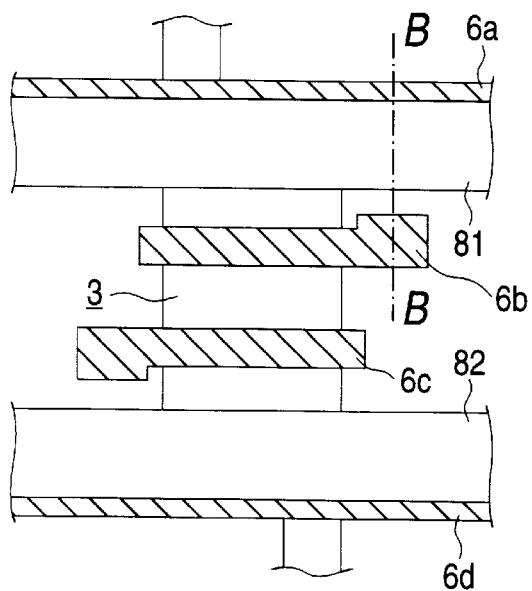
FIGS. 27A and 27B are plan views for indicating an embodiment 4 of the present invention in a manufacturing step.
Figure 27B:
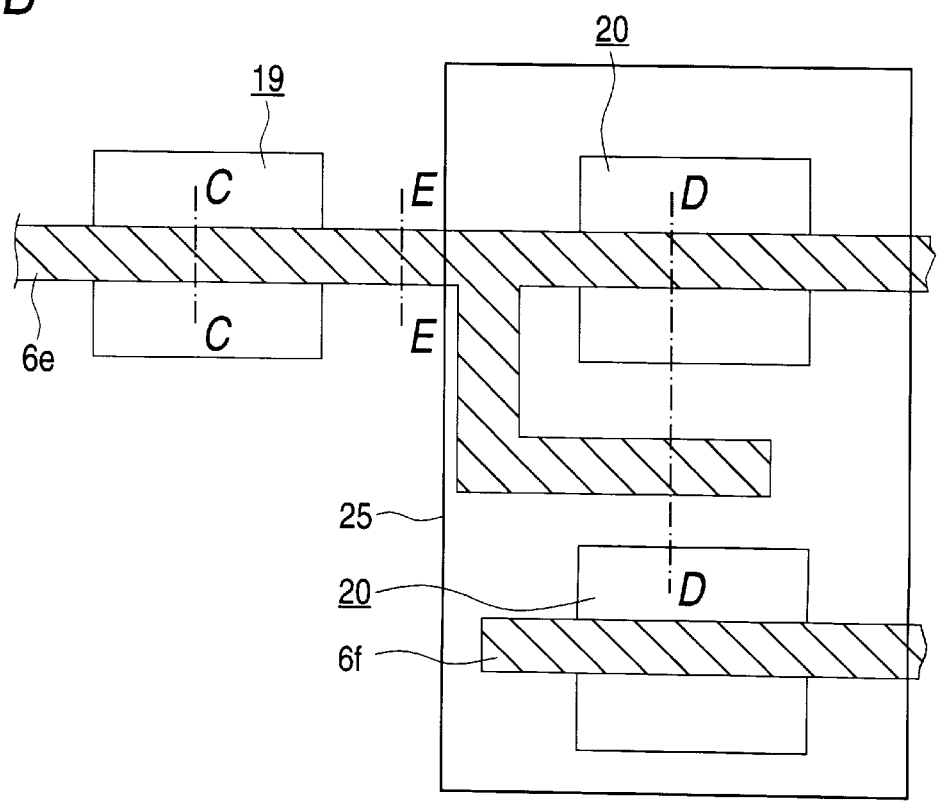
Figure 28A:
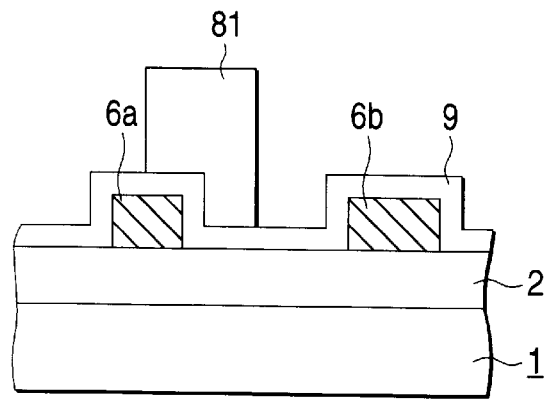
FIGS. 28A to 28D represent sectional views, taken along a line B—B, a line C—C, a line D—D, and a line E—E of FIGS. 27A and 27B.
Figure 28B:
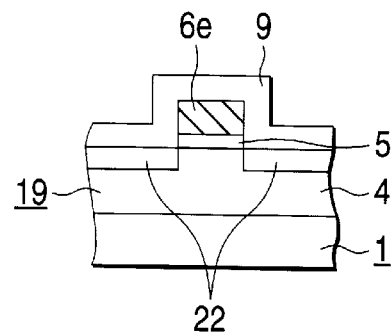
Figure 28C:
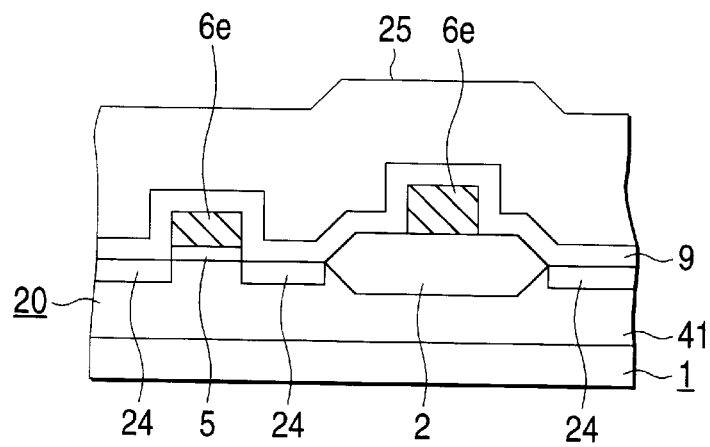
Figure 28D:
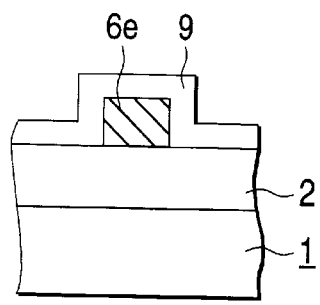

It should also be noted that in FIG. 27A and 27B, in order to clearly display a positional relationship between the photoresists 81, 82 and the word lines 6a, 6d corresponding to the gate electrodes of the access transistors, and another positional relationship between the PMOS region 20 of the peripheral circuit and the resist mask 25, no indication is made of the SiO$_2$ film 9 and an under layer thereof is indicated. Further, an under layer of the resist mask 25 is displayed.

Next, as illustrated in FIGS. 29A and 29B and FIGS. 30A to 30D, side walls 91 to 94, 97, 98 having widths of on the order of 500 to 1500 Å, and the insulating films 9a, 9d which are shield by the resist masks 81 and 82 to be left are formed by employing the RIE method with using the above described resist masks 81 and 82.

Figure 30A:
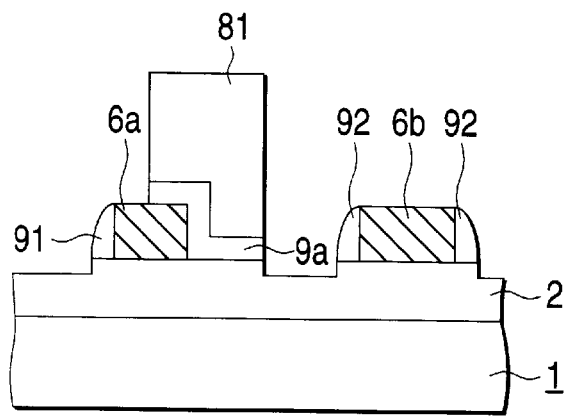
FIGS. 30A to 30D represent sectional views, taken along a line B—B, a line C—C, a line D—D, and a line E—E of FIGS. 29A and 29B.
Figure 30B:
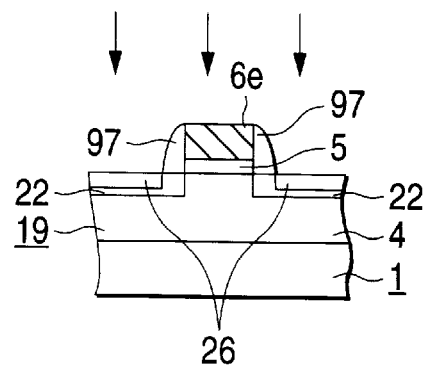
Figure 30C:
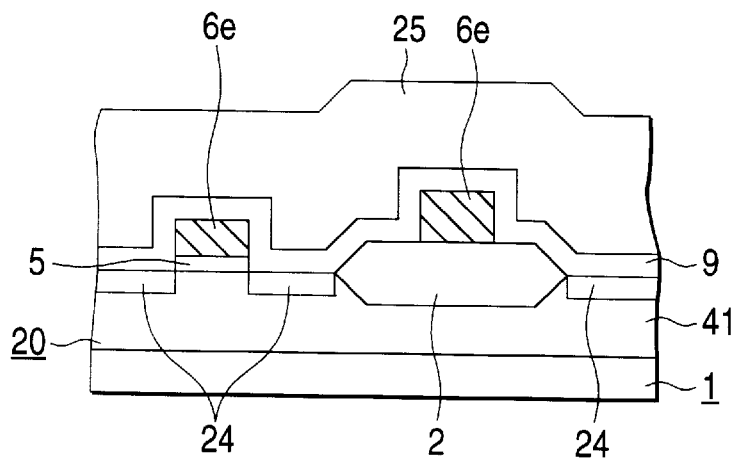
Figure 30D:
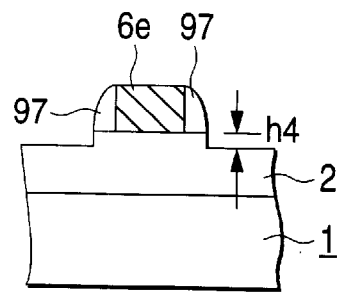
Figure 31:
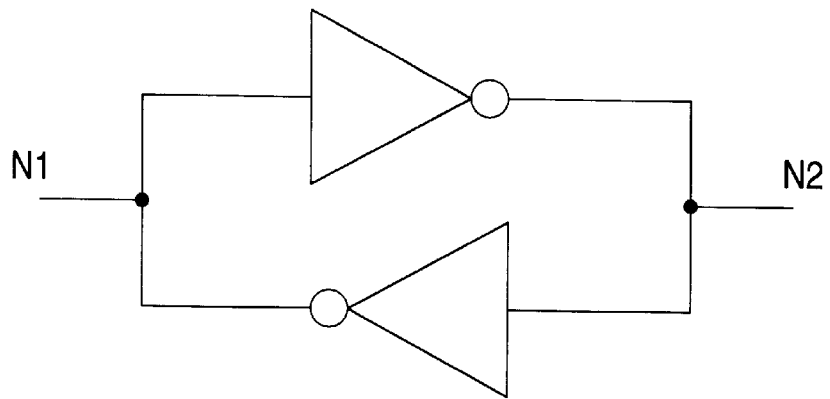
FIG. 31 is an equivalent circuit diagram for indicating a pair of cross-coupled inverters.
Figure 32:
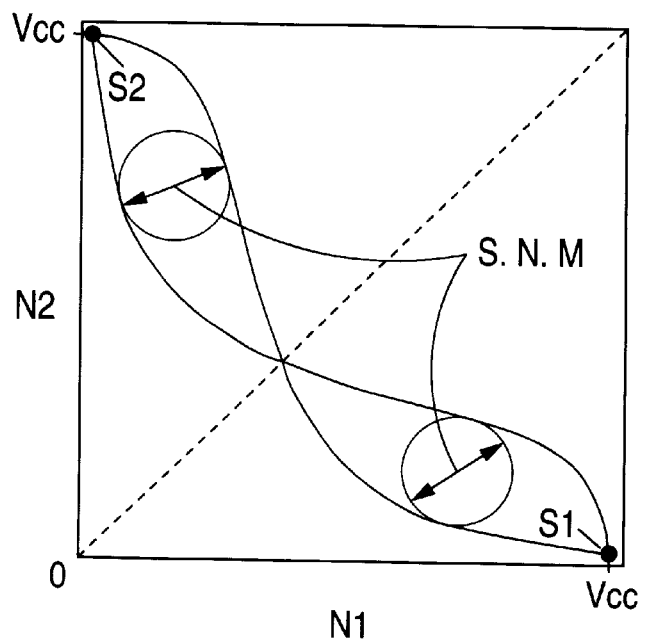
FIG. 32 is an input/output characteristic diagram for showing the pair of cross-coupled inverters.
Figure 33:
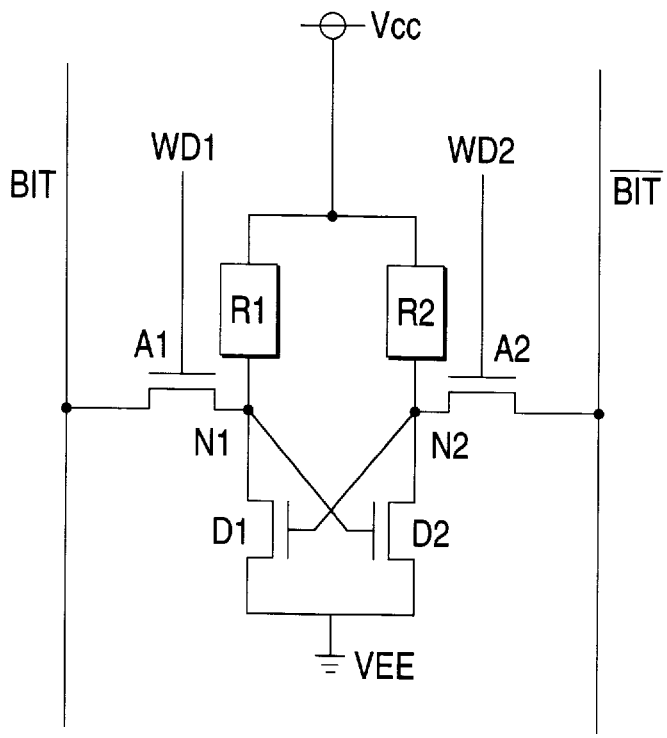
FIG. 33 is an equivalent circuit diagram for showing a memory cell of an SRAM.
Figure 34:
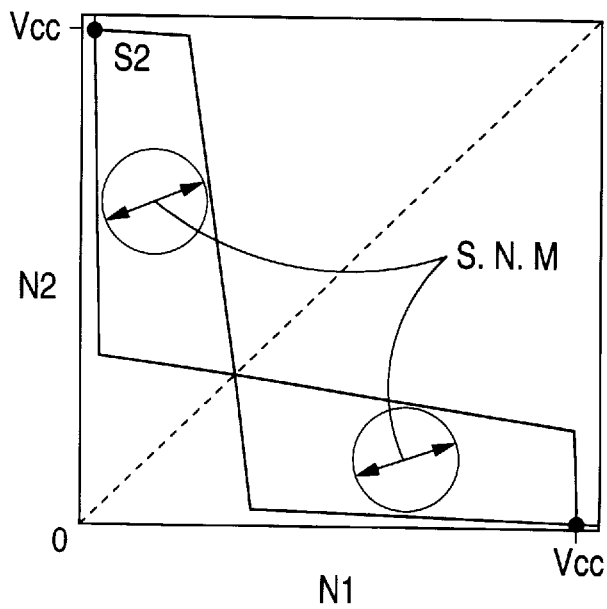
FIG. 34 is a transfer characteristic diagram of the memory cell during standby state of the SRAM.
Figure 35:
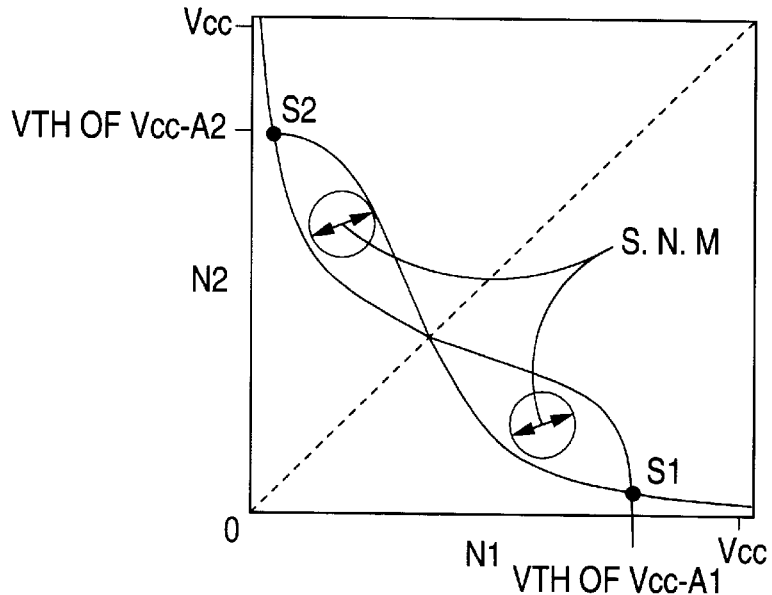
FIG. 35 represents a memory cell transfer characteristic diagram during data reading operation of the SRAM when a cell ratio is small.
Figure 36:
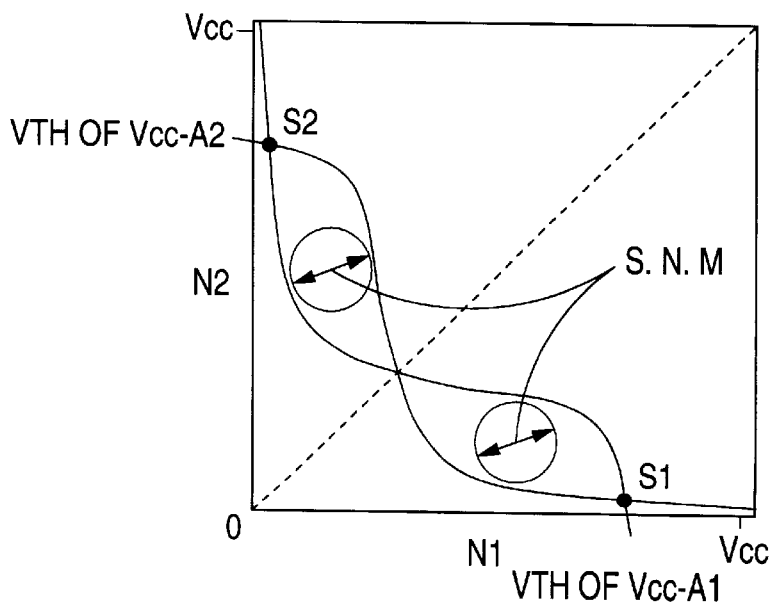
FIG. 36 represents a memory cell transfer characteristic diagram during data reading operation of the SRAM when a cell ratio is large.
Figure 37A:
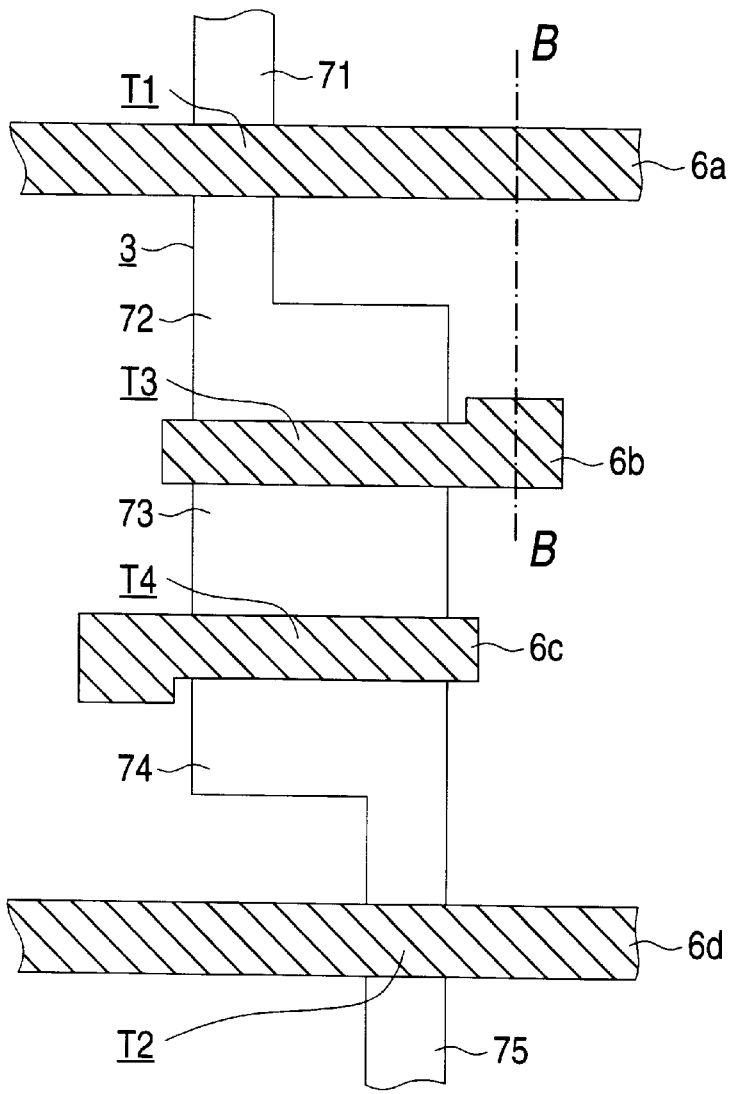
FIGS. 37A and 37B are a plan view and a sectional view for showing a major portion of this SRAM cell taken along a line B—B, for indicating the conventional semiconductor device manufacturing method in the manufacturing sequence as to a single SRAM cell.
Figure 37B:
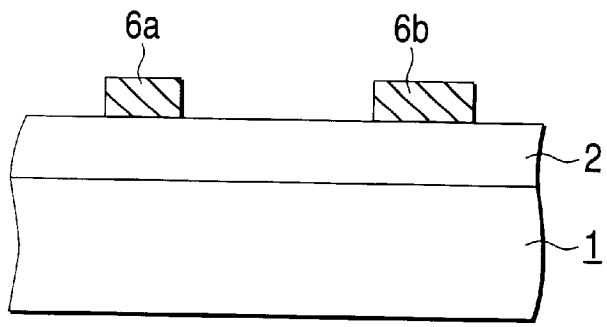
Figure 38A:
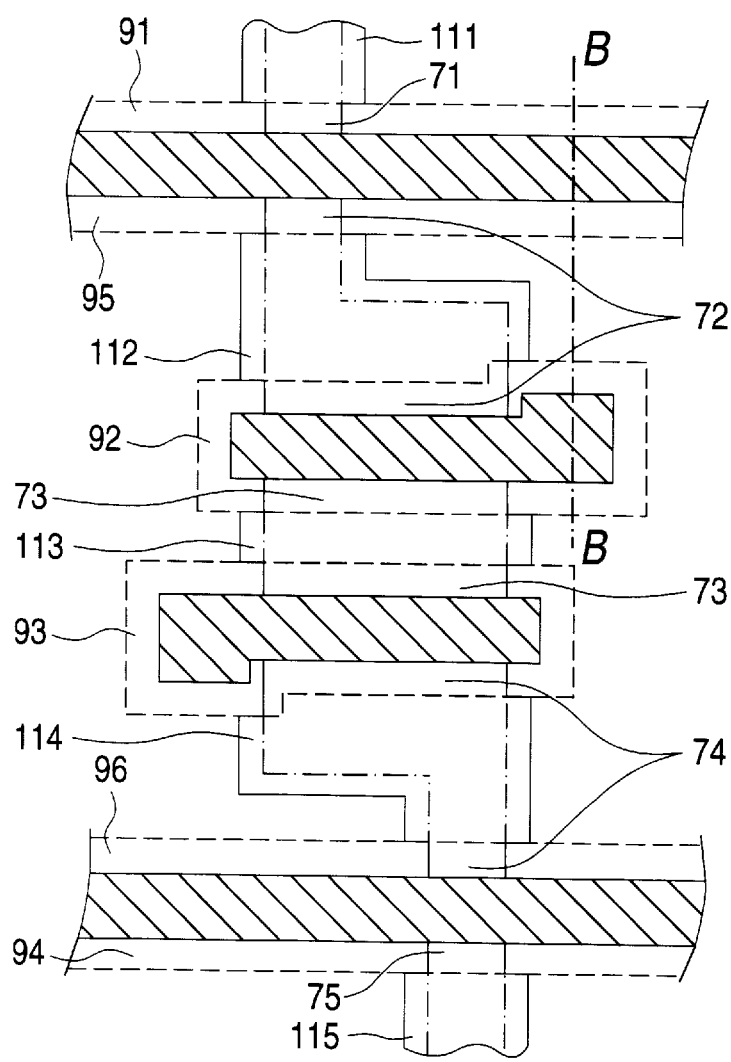
FIGS. 38A and 38B are a plan view and a sectional view for showing a major portion of this SRAM cell taken along a line B—B.
Figure 38B:
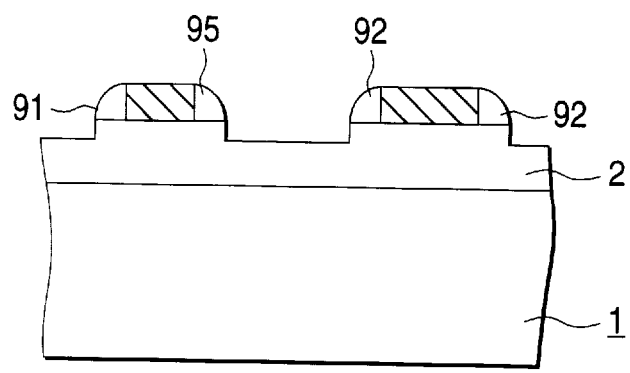
Figure 39A:
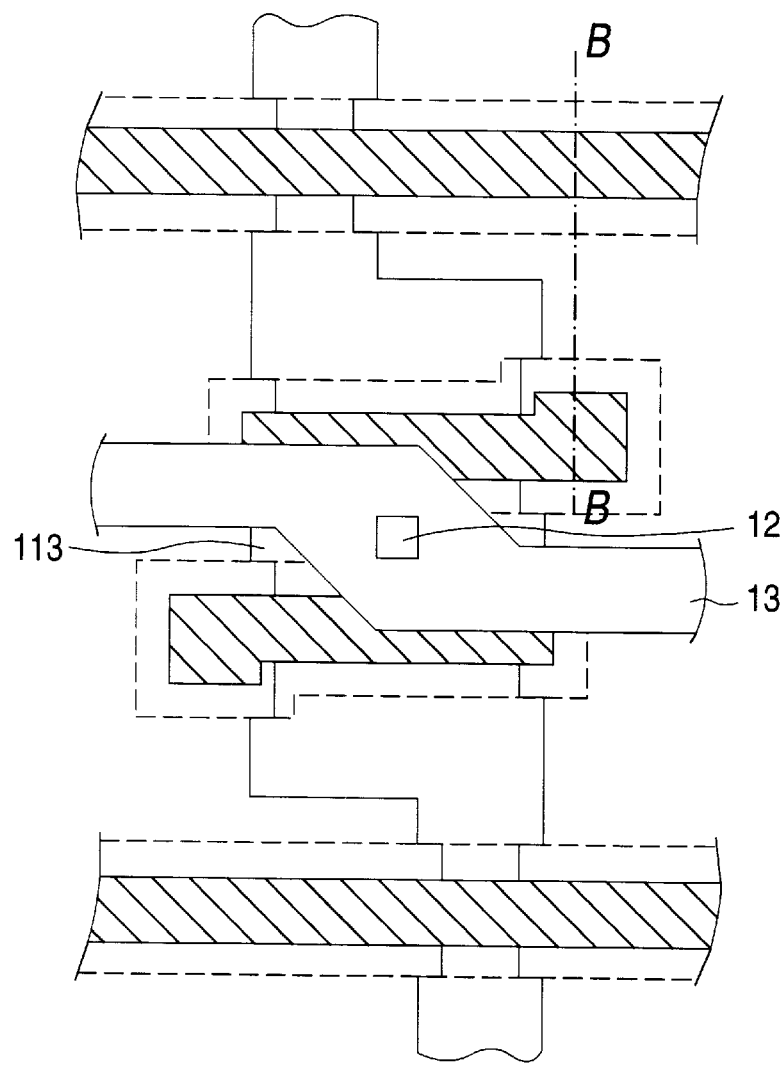
FIGS. 39A and 39B are a plan view a sectional view for showing a major portion of this SRAM cell taken along a line B—B.
Figure 39B:
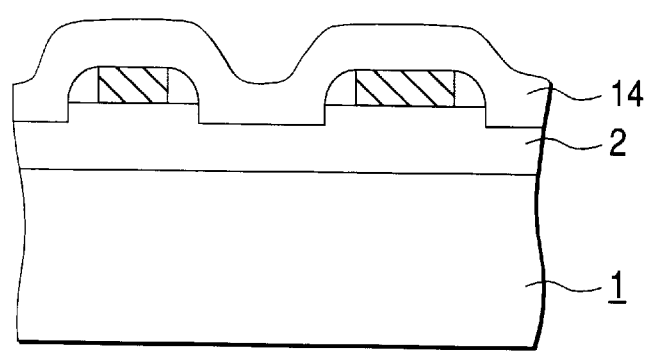
Figure 40A:
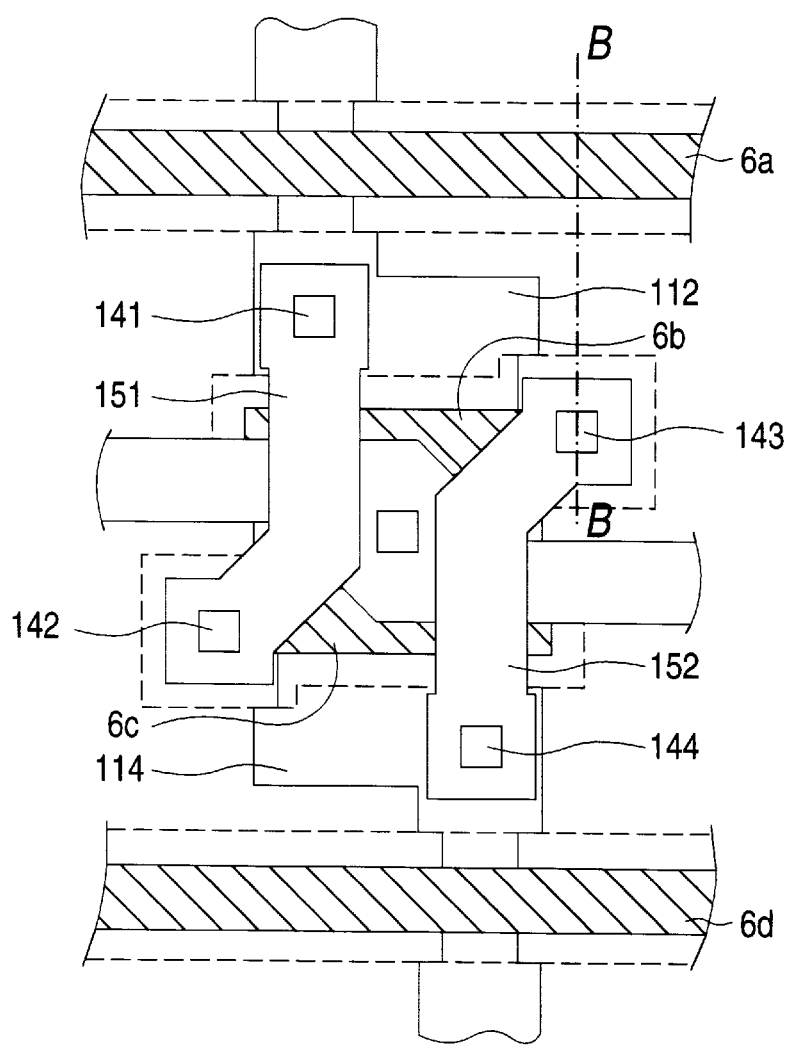
FIGS. 40A and 40B are a plan view a sectional view for showing a major portion of this SRAM cell taken along a line B—B.
Figure 40B:
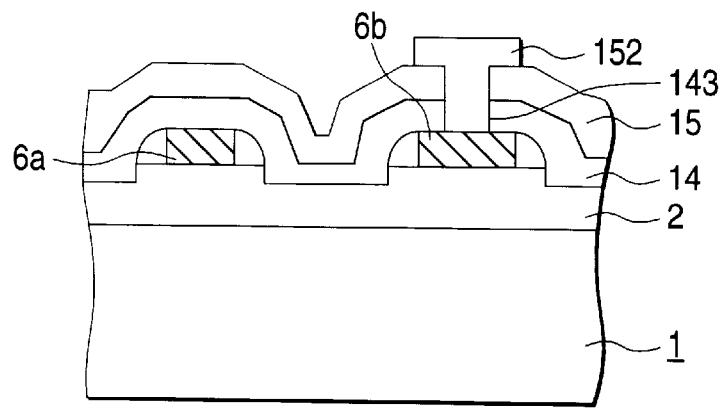
Figure 41A:
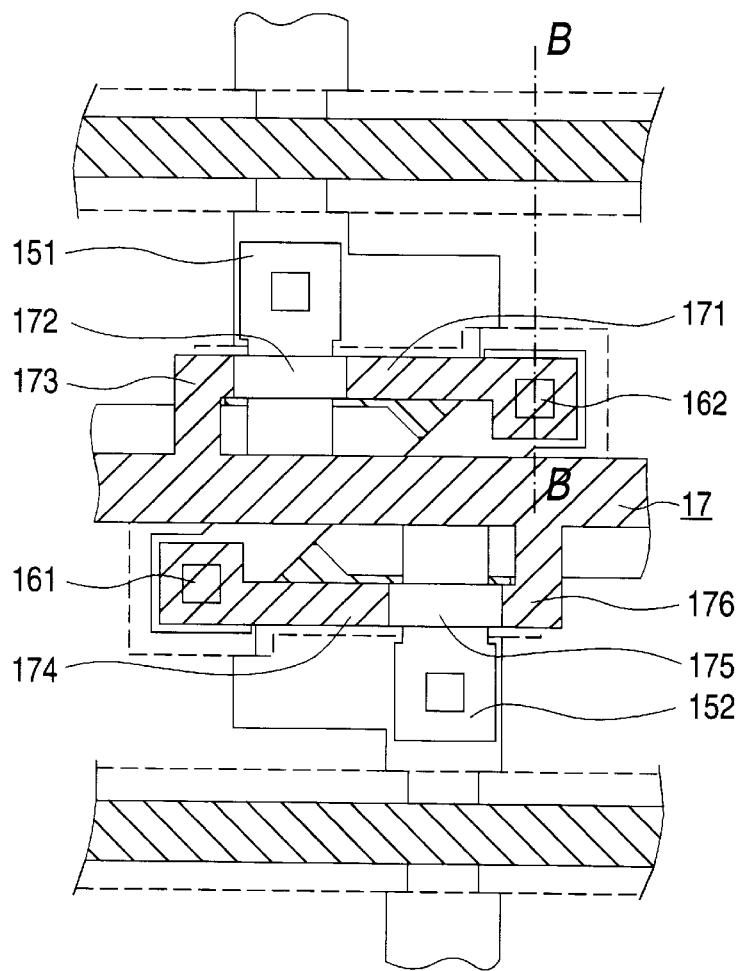
FIGS. 41A and 41B are a plan view a sectional view for showing a major portion of this SRAM cell taken along a line B—B.
Figure 41B:
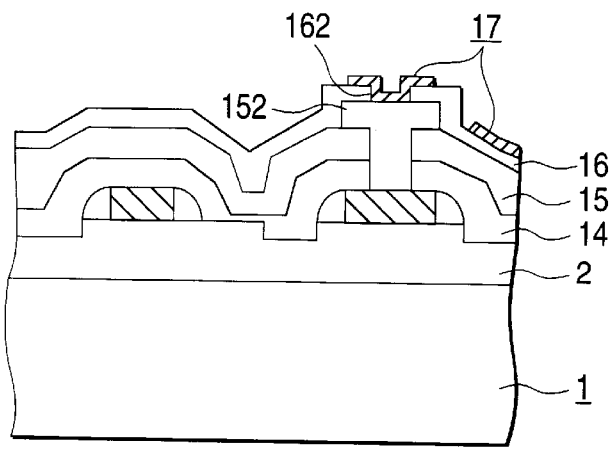
Figure 42A:
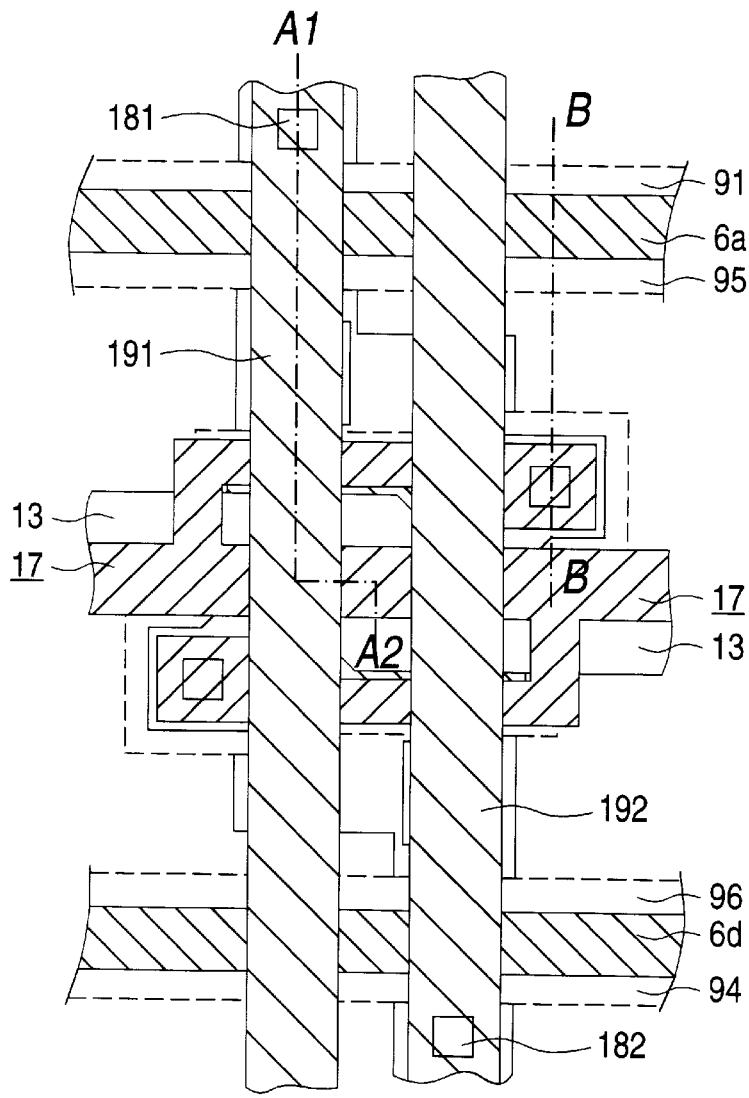
FIGS. 42A and 42B are a plan view a sectional view for showing a major portion of this SRAM cell taken along a line B—B.
Figure 42B:
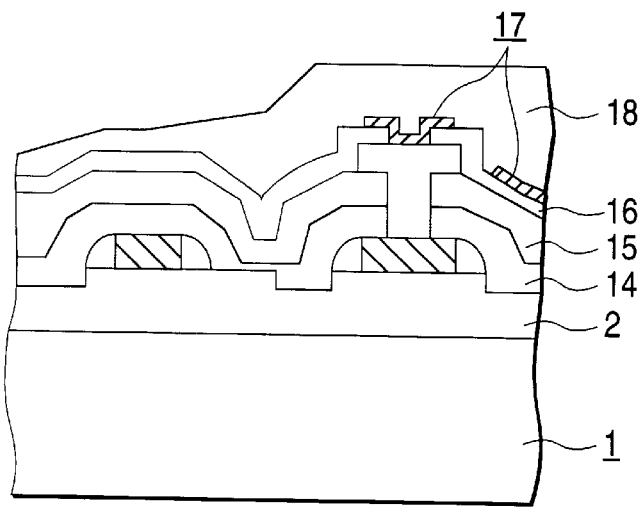
Figure 43:
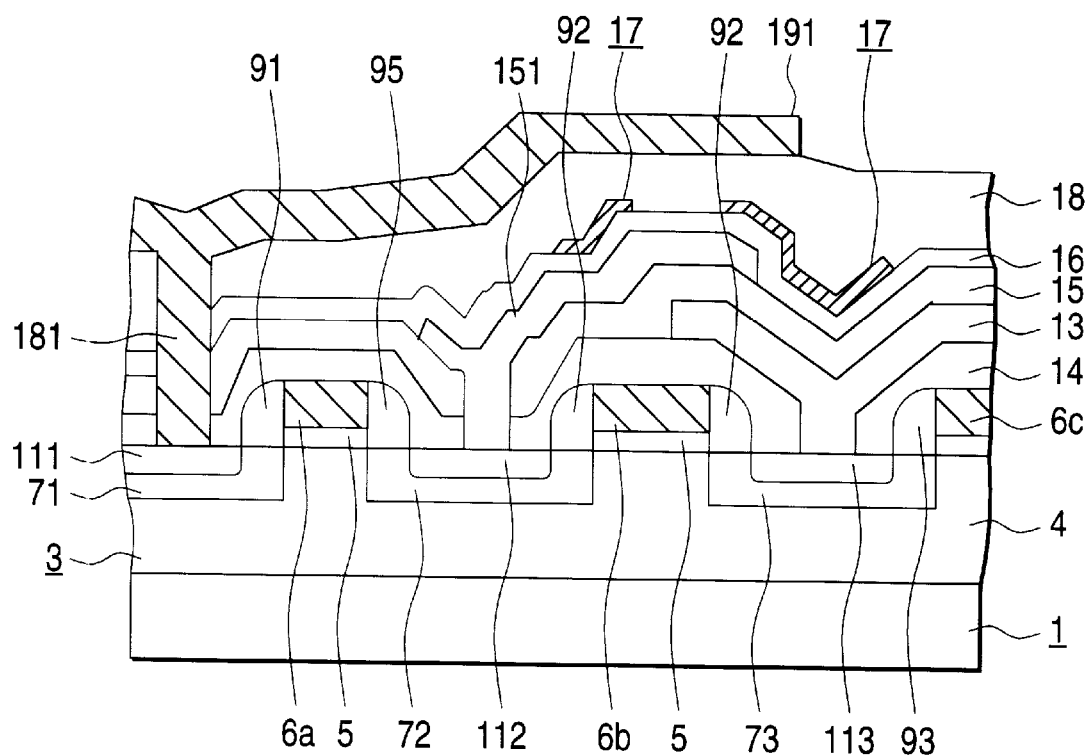
FIG. 43 is a sectional view for indicating the major portion of the single SRAM cell of the semiconductor device manufactured by the conventional method shown in FIG. 42A.

At this time, for instance, as shown in FIG. 30D, the field insulating film 2 is planed by a dimension equal to a thickness of "h4" at the same time by the over-etching process executed during the RIE method.

Next, while using the resist masks 81, 82, 25 and these side wall oxide films 91 to 94, 97 as a mask, for instance, arsenic (As) is implanted at 50 KeV with the dose amount of approximately 1.0 to $5.0 \times 10^{15}$ cm$^{-2}$ to form N⁺type source/drain regions 111 to 115 in the NMOS region 3 of the memory cell, and further to form N⁺type source/drain region 26 in the NMOS region of the peripheral circuit. At this case, for example, either arsenic (As) or phosphorus (P) may be additionally implanted at approximately 30 to 70 KeV at an implanting angle of 45 degrees into the overall surface with the dose amount of approximately 1.0 to $5.0 \times 10^{13}$ cm$^{-2}$, while rotating the wafer.

In this case, the N⁺type source/drain regions 111 to 115 and 26 contain impurity concentration of on the order of $10^{20}$ to $10^{21}$ cm$^{-3}$, and forms a so-called "LDD (lightly doped drain)" structure for relaxing an electric field near the drain by the N⁻type source/drain regions 71 to 75, 22 and the N⁺type source/drain regions 111 to 115, 26.

Figure 29A:
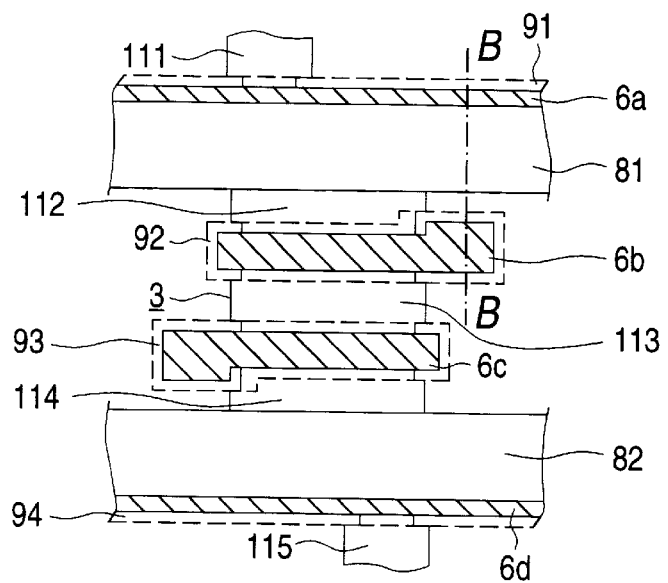
FIGS. 29A and 29B are plan views for indicating an embodiment 4 of the present invention in a manufacturing step.
Figure 29B:
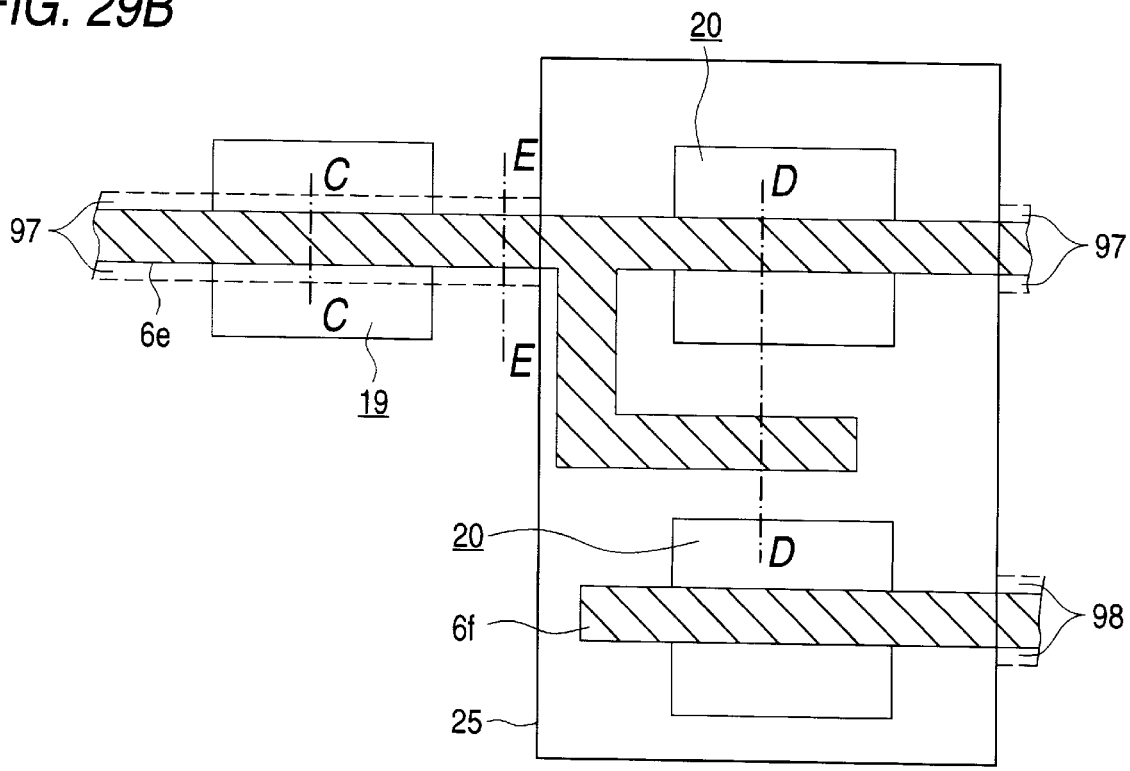

It should be understood that in FIGS. 29A and 29B, in order to clarify a positional relationship between the PMOS region 20 of the peripheral circuit and the resist mask 25, an under layer of the resist mask 25 is indicated.

Comparing with the above-described one concrete example, in the embodiment 4 of the present invention, it can be avoided that the element isolating film 2 located near the boundary region between the NMOS region 19 and the PMOS region 20 is unnecessarily planed by the over-etching process. As a consequence, lowering of the isolation withstanding voltage can be prevented which is caused by implanting boron into the semiconductor substrate 1 when the P⁺type source/drain region 24 is formed. This problem occurs in the above-described one concrete example when the thickness of the element isolating film 2 becomes thin, because the etching process is twice carried out.

Furthermore, lowering of the isolating capability owned by the element isolating film 2 can be prevented which is caused when the threshold voltage of the stray transistor is lowered, while using the upper layer wiring line formed on the element isolating film 2 as the stray gate electrode. Accordingly, the stable operation performance of the semiconductor device can be improved.

Also, in comparison with the above-mentioned one concrete example, since the plating number of the element isolating film 2 by the RIE process is reduced, the planed thickness can be suppressed to be thinner (concretely speaking, plated thickness can be suppressed to be "h4", as shown in FIG. 30D). Therefore, the wiring lines formed on the upper layer can be easily patterned. Furthermore, a total etching step can be reduced, so that the semiconductor device can be readily manufactured in low cost.

A semiconductor device, according to an aspect of the present invention, is featured by comprising: an element isolating film formed on one major surface of a semiconductor substrate; an element forming region formed on the major surface and surrounded by the element isolating film; a gate electrode formed via a gate insulating film on the element forming region and extended over the element isolating film; first and second impurity regions formed in the element forming region, whose portions exposed from a surface of the semiconductor substrate are made in contact with the element isolating film and are located opposite to each other under the gate electrode; a first insulating film formed near the gate electrode on the first impurity region, and extended over the gate electrode and near an extended portion of the gate electrode within the element isolating film; and a second insulating film formed near the gate electrode on the second impurity region; wherein: a distance defined from an outer edge of the gate electrode on the side of the first impurity region to another outer edge of the first insulating film on the side apart from the gate electrode is longer than a distance defined from an outer edge of the gate electrode on the side of the second impurity region to another outer edge of the second insulating film on the side apart from said gate electrode. In this semiconductor device the first insulating film can prevent the element isolating film for surrounding the first impurity region from being unnecessarily etched away. Also, the following problems can be solved by this semiconductor device. That is, this element isolating film is unnecessarily removed by the etching process. The fail operation of the semiconductor device occurs, because the portion of the first impurity region exposed from the surface of the semiconductor substrate is increased. As a consequence, even when the integration degree of this semiconductor device is increased, it is possible to avoid that the stray resistance in the transistor made of the gate electrode and the first and second impurity regions is reduced, and the current flowing through this stray resistance is increased. There is an advantage that the stable operation performance of this semiconductor device can be improved.

In addition, since the first insulating film is intentionally left on the gate electrode and the first impurity region, even when the wiring line is formed on the upper layer, flatness under this wiring line can be improved.

Also, since the first and second insulating films are formed from the element forming region and the first insulating film formed on the gate electrode, it is possible to easily manufacture the semiconductor device with a small number of manufacturing steps.

Also, the semiconductor device is featured by further comprising: an alignment mark, or an overlapping checking mark formed on a desired region of the element isolating film; and an insulating film for covering one of the alignment mark and the overlapping checking mark; wherein: both the first insulating film, and the insulating film for covering one of the alignment mark and the overlapping checking mark are formed from a single insulating film formed on one of the alignment mark and the overlapping checking mark, the element forming region, and the gate electrode. Accordingly, it is possible to avoid the pattern roughs of the surface of either the alignment mark, or the overlapping checking mark formed in the same manufacturing step as that of the gate electrode. Moreover, since it is avoidable that the side wall is formed on the side wall of this mark, there is another merit that the alignment precision, or the overlapping checking precision can be improved.

Also, the semiconductor device is featured by further comprising: a fuse formed on the element isolating film; and an insulating film formed under the fuse; wherein: both the first insulating film and the insulating film formed under the fuse are formed from a single insulating film formed on the element forming region, the gate electrode, the element isolating film. Therefore, an interval between the fuse and the semiconductor substrate can be made wide. Thus, there is another merit that damages given to the semiconductor substrate can be mitigated during the laser blowing process.

Also, a semiconductor device, according to another aspect of the present invention, is featured by comprising: first and second element forming regions formed on one major surface of a semiconductor substrate; an element isolating film formed on the major surface, for electrically isolating the first element forming region from the second element forming region; a first gate electrode formed via a gate insulating film on the first element forming region; a side wall formed on side surfaces of the first gate electrode and the gate insulating film; two sets of first conductivity type of impurity regions having low concentration, formed in the first element forming region and located opposite to each other under the first gate electrode; two sets of first conductivity type impurity regions having high concentration, formed in the first element forming region, whose portions exposed from a surface of the semiconductor substrate are formed outside the two sets of first conductivity type impurity regions having the low-concentration with respect to the gate electrode; a second gate electrode formed via agate insulating film on the second element forming region; two sets of second conductivity type impurity regions formed in the second element forming region and located opposite to each other under the second gate electrode; and an insulating film formed on the second element forming region and the second gate electrode, and extended over the element isolating film. When this semiconductor device is manufactured, the unnecessary planing of the element isolating film can be reduced. Therefore, it is possible to prevent the impurity from being conducted into the semiconductor substrate in the forming step of the impurity region having the high concentration. Moreover, it is possible to avoid deterioration in the isolation performance of this element isolating film, which is caused when the threshold voltage of the stray transistor is lowered. This stray transistor uses the wiring line formed on the element isolating film as the stray gate electrode. Thus, it is possible to improve the stable operation performance of the semiconductor device.

A semiconductor device manufacturing method, according to another aspect of the present invention, is featured by comprising the steps of: forming a gate electrode on a plurality of element forming regions formed on one major surface of a semiconductor substrate; forming a first resist mask opened in a desirable element forming region among the plurality of element forming regions; forming a first conductivity type impurity region having low concentration in the desirable element forming region by way of an ion implantation with employment of the gate electrode and the first resist mask; removing the first resist mask to thereby form a second resist mask opened in another desirable element forming region among the plurality of element forming regions; forming a second conductivity type impurity region having high concentration in the another element forming region by way of an ion implantation with employment of the gate electrode and the second resist mask; removing the resist mask to thereby form an insulating film on a plurality of formed element forming regions of the impurity regions; forming a third resist mask opened in the insulating film on the element forming region into which the first conductivity type impurity region having the low concentration is formed; forming a side wall in a side surface of the gate electrode by way of an anisotropic etching process with employment of the third resist mask; and forming a first conductivity type impurity region having high concentration in the element forming region where the first conductivity type impurity region having the low concentration is formed by way of an ion implantation with using the gate electrode, the side wall, and the resist mask. As a result, it is possible to prevent the impurity from being conducted into the semiconductor substrate in the step for forming the second conductivity type impurity region having the high concentration. Moreover, it is possible to avoid deterioration in the isolation performance of this element isolating film, which is caused when the threshold voltage of the stray transistor is lowered. This stray transistor uses the wiring line formed on the element isolating film as the stray gate electrode. Thus, it is possible to improve the stable operation performance of the semiconductor device.

Further, a semiconductor device manufacturing method, according to another aspect of the present invention, is featured by comprising the steps of: forming gate electrodes on an element forming region formed in one major surface of a semiconductor substrate in such a manner that the gate electrodes are extended over an element isolating film for surrounding the element forming region; forming a pair of impurity regions in the element forming region by way of an ion implantation by using the gate electrodes as a mask; forming an insulating film on the element forming region; forming a resist pattern on the insulating film in such a manner that the resist pattern covers a portion near one of the gate electrodes within the paired impurity regions, the gate electrodes, and a portion near an extended portion of the gate electrode within the element isolating film; and using the resist pattern as a mask to execute an anisotropic etching process of the insulating film. As a consequence, the unnecessary etching of the element isolating film can be avoided by such an insulating film which is escaped from the anisotropic etching by the resist pattern, so that the failure operation of the semiconductor device can be prevented, which is caused by unnecessarily removing the element isolating film, and also by increasing the area of the portion of the impurity region. This impurity portion is exposed from the surface of the semiconductor substrate. Therefore, even when the integration degree of this semiconductor device is increased, it is possible to avoid that the stray resistance in the transistor made of the gate electrode and the paired impurity regions is reduced, and the current flowing through this stray resistance is increased. There is an advantage that the stable operation performance of this semiconductor device can be improved.

In addition, since the insulating film is intentionally left on the gate electrode and one impurity region covered by the resist pattern in the paired impurity regions by way of the insulating film which is escaped from the anisotropic etching by the resist pattern, even when the wiring line is formed on the upper layer, it is possible to obtain such a semiconductor device having the better flatness characteristic under this wiring line.

Also, the semiconductor device manufacturing method, according to another aspect of the present invention, is featured in that: in the step for forming the gate electrodes, an alignment mark, or an overlapping checking mark is formed on a desirable region of the element isolating film; in the step for forming the insulating film, an insulating film is formed on one of the alignment mark and the overlapping checking mark; and in the step for forming the resist pattern, another resist pattern is formed which covers one of the alignment mark and the overlapping checking mark. Accordingly, it is possible to avoid the pattern roughs of the surface of either the alignment mark, or the overlapping checking mark formed in the same manufacturing step as that of the gate electrode. Moreover, since it is avoidable that the side wall is formed on the side wall of this mark, there is another merit that the semiconductor device having the alignment precision, or the overlapping checking precision can be manufactured.

Further, the semiconductor device manufacturing method, according to another aspect of the present invention, is featured by further comprising the step of: forming a fuse on an element isolating film; wherein: in the step for forming the insulating film, another insulating film is formed on such a region where the fuse is formed on an upper layer; and in the step for forming the resist pattern, another resist pattern is formed which covers such a region where the fuse is formed on an upper layer. Therefore, an interval between the fuse and the semiconductor substrate can be made wide. Thus, there is another merit that damages given to the semiconductor substrate can be mitigated during the laser blowing process. As a consequence, it is possible to obtain the semiconductor device having the better stable operation characteristic.

What is claimed is:

1. A semiconductor device comprising:
   an element isolating film formed on a major surface of a semiconductor substrate;
   an element forming region formed on said major surface and surrounded by said element isolating film;
   a gate insulating film formed on said element forming region;
   a gate electrode formed on said gate insulating film within said gate insulating film, said gate electrode having a portion extending over said element isolating film;
   a first impurity region formed in said element forming region adjacent to a first side of said gate electrode and gate insulating film;
   a second impurity region formed in said element forming region adjacent to a second side of said gate electrode and gate insulating film;
   a first insulating film formed on a first side surface of said gate electrode and on said first impurity region and extending over said element isolating film, the first insulating film having a first distance from one end adjoining said first side surface of said gate electrode to another end; and
   a second insulating film formed on a second side surface of said gate electrode and on said second impurity region, the second insulating film having a second distance from one end adjoining said second side surface of said gate electrode to another end;
   wherein said first distance of said first insulating film is greater than said second distance of said second insulating film.

2. A semiconductor device as claimed in claim 1, wherein said first and second insulating films are formed from a single insulating film formed on said element forming region and said gate electrode.

3. A semiconductor device as claimed in claim 1, further comprising:
   an alignment mark or an overlapping checking mark formed on a desired region of said element isolating film; and
   an insulating film for covering one of said alignment mark and said overlapping checking mark;
   wherein both said first insulating film, and said insulating film for covering one of said alignment mark and said overlapping checking mark are formed from a single insulating film formed on one of said alignment mark and said overlapping checking mark, said element forming region, and said gate electrode.

4. A semiconductor device as claimed in claim 1 wherein further comprising:
   a fuse formed on said element isolating film; and
   an insulating film formed between said fuse and said element isolating film;

wherein both said first insulating film and said insulating film formed under said fuse are formed from a single insulating film formed on said element forming region, said gate electrode, and said element isolating film.

5. A semiconductor device comprising:

a semiconductor substrate having a major surface;

an element isolating film formed on said major surface;

first and second element forming regions formed on said major surface, each of said first and second element forming regions electrically isolated by said element isolating film, said first element forming region comprising:
- a first gate insulating film formed on said major surface;
- a first gate electrode formed on said first gate insulating film;
- side wall spacers formed on side surfaces of said first gate electrode and said first gate insulating film;
- a first low impurity region of a first conductive type formed in said major surface and having a portion exposed from said major surface adjacent to a first side of said first gate electrode;
- a second low impurity region of said first conductive type formed in said major surface and having a portion exposed from said major surface adjacent to a second side of said first gate electrode;
- a first high impurity region of said first conductive type formed in said major surface on said first side of said first gate electrode and having a portion exposed from said major surface adjacent to the exposed portion of said first low impurity region; and
- a second high impurity region of said second conductive type formed in said major surface on said second side of said first gate electrode and having a portion exposed from said major surface in said first element forming region adjacent to the exposed portion of said second low impurity region, and said second element forming region comprising:
- a second gate insulating film formed on said major surface;
- a second gate electrode formed on said second gate insulating film;
- a first impurity region of a second conductive type formed on said major surface adjacent to a first side of said second gate electrode; and
- a second impurity region of said second conductive type formed on said major surface adjacent to a second side of said second gate electrode; and
- an insulating film formed on said second element forming region and said second gate electrode, and extending over said element isolation film.

* * * * *